United States Patent
Unrath et al.

(10) Patent No.: US 8,847,113 B2
(45) Date of Patent: Sep. 30, 2014

(54) LASER PROCESSING SYSTEMS AND METHODS FOR BEAM DITHERING AND SKIVING

(75) Inventors: Mark A. Unrath, Portland, OR (US); Andrew Berwick, Portland, OR (US); Alexander A. Myachin, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 13/279,993

(22) Filed: Oct. 24, 2011

(65) Prior Publication Data

US 2012/0273472 A1 Nov. 1, 2012

Related U.S. Application Data

(60) Provisional application No. 61/406,038, filed on Oct. 22, 2010.

(51) Int. Cl.

| | |
|---|---|
| *B23K 26/06* | (2014.01) |
| *B23K 26/00* | (2014.01) |
| *B23K 26/02* | (2014.01) |
| *G06F 19/00* | (2011.01) |
| *G02B 26/12* | (2006.01) |
| *G02F 1/03* | (2006.01) |
| *B23K 26/08* | (2014.01) |
| *B23K 26/36* | (2014.01) |
| *B23K 26/073* | (2006.01) |
| *H01L 21/48* | (2006.01) |

(52) U.S. Cl.
CPC ........... *B23K 26/367* (2013.01); *H01L 21/4853* (2013.01); *B23K 26/0807* (2013.01); *B23K 26/0639* (2013.01); *B23K 2201/40* (2013.01); *B23K 26/063* (2013.01); *B23K 26/0732* (2013.01)
USPC ............ 219/121.73; 219/121.68; 219/121.69; 219/121.79; 219/121.81; 219/121.83; 700/166; 359/199.4; 359/245

(58) Field of Classification Search
USPC ............ 219/121.68, 121.69, 121.73, 121.79, 219/121.8, 121.81, 121.83; 700/166; 359/199.4, 245
See application file for complete search history.

(56) References Cited

U.S. PATENT DOCUMENTS

| | | | | |
|---|---|---|---|---|
| 4,105,953 | A | * | 8/1978 | Jernigan .......................... 372/13 |
| 4,456,811 | A | * | 6/1984 | Hella et al. ............... 219/121.85 |

(Continued)

FOREIGN PATENT DOCUMENTS

| | | |
|---|---|---|
| EP | 1721695 A1 | 11/2006 |
| JP | 2008238229 A | 10/2008 |

(Continued)

OTHER PUBLICATIONS

Notice of Allowance and Fee(s) Due for U.S. Appl. No. 12/790,093, filed May 28, 2010.

(Continued)

*Primary Examiner* — Dana Ross
*Assistant Examiner* — Gyounghyun Bae
(74) *Attorney, Agent, or Firm* — Stoel Rives LLP

(57) ABSTRACT

A laser processing system includes a first positioning system for imparting first relative movement of a beam path along a beam trajectory with respect to a workpiece, a processor for determining a second relative movement of the beam path along a plurality of dither rows, a second positioning system for imparting the second relative movement, and a laser source for emitting laser beam pulses. The system may compensate for changes in processing velocity to maintain dither rows at a predetermined angle. For example, the dither rows may remain perpendicular to the beam trajectory regardless of processing velocity. The processing velocity may be adjusted to process for an integral number of dither rows to complete a trench. A number of dither points in each row may be selected based on a width of the trench. Fluence may be normalized by adjusting for changes to processing velocity and trench width.

13 Claims, 41 Drawing Sheets

(56) References Cited

U.S. PATENT DOCUMENTS

| | | | |
|---|---|---|---|
| 4,532,402 A * | 7/1985 | Overbeck | 219/121.78 |
| 5,084,883 A | 1/1992 | Khalid et al. | |
| 5,101,091 A * | 3/1992 | Grub et al. | 219/121.74 |
| 5,558,788 A * | 9/1996 | Mashburn | 219/121.68 |
| 5,751,585 A | 5/1998 | Cutler et al. | |
| 5,798,927 A | 8/1998 | Cutler et al. | |
| 5,837,962 A | 11/1998 | Overbeck | |
| 5,847,960 A | 12/1998 | Cutler et al. | |
| 6,341,029 B1 * | 1/2002 | Fillion et al. | 359/204.1 |
| 6,407,363 B2 * | 6/2002 | Dunsky et al. | 219/121.71 |
| 6,430,465 B2 * | 8/2002 | Cutler | 700/193 |
| 6,496,292 B2 | 12/2002 | Fillion et al. | |
| 6,639,177 B2 * | 10/2003 | Ehrmann et al. | 219/121.68 |
| 6,706,998 B2 | 3/2004 | Cutler | |
| 6,706,999 B1 | 3/2004 | Barrett et al. | |
| 6,713,718 B1 | 3/2004 | Lu | |
| 6,849,824 B2 | 2/2005 | Arai et al. | |
| 6,985,261 B2 * | 1/2006 | Klein et al. | 358/3.26 |
| 7,019,891 B2 | 3/2006 | Johnson | |
| 7,133,182 B2 | 11/2006 | Johnson et al. | |
| 7,133,186 B2 | 11/2006 | Johnson | |
| 7,133,187 B2 * | 11/2006 | Johnson | 359/311 |
| 7,133,188 B2 | 11/2006 | Johnson | |
| 7,245,412 B2 * | 7/2007 | Bruland et al. | 359/225.1 |
| 7,297,972 B2 | 11/2007 | Bruland | |
| 7,315,038 B2 | 1/2008 | Bruland | |
| 7,425,471 B2 * | 9/2008 | Bruland et al. | 438/130 |
| 7,469,831 B2 * | 12/2008 | Gu et al. | 235/454 |
| 7,508,850 B2 * | 3/2009 | Newman et al. | 372/25 |
| 7,675,673 B2 * | 3/2010 | Mueller | 359/309 |
| 7,724,785 B2 * | 5/2010 | Spinelli et al. | 372/10 |
| 2005/0157762 A1 * | 7/2005 | DeMaria et al. | 372/9 |
| 2005/0171630 A1 * | 8/2005 | Dinauer et al. | 700/166 |
| 2005/0254109 A1 * | 11/2005 | Bruland et al. | 359/202 |
| 2005/0270629 A1 | 12/2005 | Johnson | |
| 2005/0279736 A1 * | 12/2005 | Bruland et al. | 219/121.8 |
| 2006/0039419 A1 | 2/2006 | Deshi | |
| 2006/0071143 A1 | 4/2006 | Saggau et al. | |
| 2006/0192969 A1 * | 8/2006 | Marks et al. | 356/451 |
| 2006/0237546 A1 * | 10/2006 | Lapstun et al. | 235/494 |
| 2006/0276778 A1 * | 12/2006 | Sink | 606/9 |
| 2008/0017618 A1 | 1/2008 | Bruland et al. | |
| 2008/0093349 A1 | 4/2008 | Bruland et al. | |
| 2008/0179302 A1 | 7/2008 | Morikazu | |
| 2008/0219304 A1 * | 9/2008 | Kupershmidt et al. | 372/29.02 |
| 2008/0296272 A1 * | 12/2008 | Lei et al. | 219/121.69 |
| 2009/0059976 A1 | 3/2009 | Shibatani | |
| 2009/0125242 A1 | 5/2009 | Choi et al. | |
| 2009/0321396 A1 | 12/2009 | Gu et al. | |
| 2010/0140237 A1 | 6/2010 | Unrath | |
| 2010/0264123 A1 * | 10/2010 | Jennings et al. | 219/121.76 |
| 2010/0301023 A1 | 12/2010 | Unrath et al. | |
| 2010/0301024 A1 | 12/2010 | Unrath | |

FOREIGN PATENT DOCUMENTS

| | | |
|---|---|---|
| JP | 2009056474 A | 3/2009 |
| WO | 0047361 A1 | 8/2000 |
| WO | 2005121889 A2 | 12/2005 |
| WO | 2009145978 A1 | 12/2009 |

OTHER PUBLICATIONS

International Search Report and Written Opinion mailed May 14, 2012, for PCT/US2011/057526, filed Oct. 24, 2011.

Notice of Allowance and Fee(s) Due dated Dec. 14, 2012; for U.S. Appl. No. 12/790,082, filed May 28, 2010.

* cited by examiner

LASER PROCESSING SYSTEMS AND METHODS FOR BEAM DITHERING AND SKIVING

RELATED APPLICATION

This application claims the benefit under 35 U.S.C. §119 (e) of U.S. Provisional Application No. 61/406,038, filed Oct. 22, 2010, which is hereby incorporated by reference herein in its entirety.

TECHNICAL FIELD

This disclosure is related to laser processing of dielectric or other materials.

BACKGROUND INFORMATION

Laser processing of dielectric and conductive materials is commonly used to ablate fine features in electronic components. For example, chip packaging substrates may be laser processed in order to route signals from the semiconductor die to a ball-grid array or similar package. Laser processed features may include signal traces, ground traces, and microvias (to connect signal traces between package layers).

Laser direct ablation (LDA) incorporates signal and ground traces on a single layer to tightly control signal impedance while reducing the number of layers in a chip package. Such an approach may require small feature dimensions and spacing (e.g., about 10 microns ($\mu$m) to about 25 $\mu$m), and long trace lengths per package (e.g., about 5 meters (m) to about 10 m). In order to construct chip packages economically, the speed at which such features are ablated may be quite high (e.g., from about 1 meter/second (m/s) to about 10 m/s). Certain packages may be processed, for example, in about 0.5 second (s) to about 5 s to meet customer throughput goals.

Another useful characteristic of chip packaging may be to provide intersecting traces with controlled depth variation. For example, ground traces may branch at several points throughout the pattern. At each branching intersection, the traces may be ablated with a desired depth variation of less than about +/−10%. Normally, if two trenches were to be ablated at one point, the double exposure of the ablating beam would create a depth variation of about 100%.

Another useful characteristic of chip packaging may be to provide variable trace widths at different parts of the package to control impedance or provide pads for inter-layer connection vias. Trace width control should be provided with reduced or minimal disruption to the high-velocity processing of the main trace.

It may also be useful to process features of arbitrary size and shape, at high speed, with reduced or minimal time used to change the feature's characteristics. For example, features may include microvias with a variety of diameters and/or sidewall taper, square or rectangular pads, alignment fiducials, and/or alphanumeric notation. Traditionally, for processing features such as microvias, optical systems have been designed to provide shaped intensity profiles (e.g., flat-top beams) of variable diameter, or purely Gaussian beams. These optical systems may have significant time delays (e.g., about 10 milliseconds (ms) to about 10 s) when changing laser processing spot characteristics.

Other problems are associated with building a machine to meet the processing parameters noted above. For example, traces may change direction throughout the package due to routing requirements. When processing traces at high velocity, the variation in trajectory angle may require high beam position acceleration at very short time scales. Laser processing can easily exceed the dynamic limits of the beam positioner, for example, when running at the high velocities (e.g., about 1 m/s to about 10 m/s) used for high throughput.

Such accelerations and/or velocities may be difficult to achieve in traditional laser processing machines, which have relied on beam positioning technologies such as linear stages in combination with mirror galvanometer beam deflectors (referred to herein as "galvos" or "galvo mirrors"), along with static (or slowly varying) beam conditioning optics that cannot respond in the time scales used for this type of processing (e.g., on the order of about 1 microsecond ($\mu$sec) to about 100 $\mu$sec).

The actual ablation process may also be a factor to consider. Laser pulses with high peak power may be used to ablate the dielectric material while minimizing thermal side effects such as melting, cracking, and substrate damage. For example, ultrafast lasers with pulse widths in a range between about 20 picoseconds (ps) and about 50 ps at repetition rates of about 5 megaHertz (MHz) to about 100 MHz can process materials with high peak power while providing significant pulse overlap to avoid pulse spacing effects. Fiber lasers now commonly provide pulse widths in the nanosecond region at repetition rates of greater than about 500 kiloHertz (kHz). Normally, for a given process condition (ablation depth and width), the "dosage" (power/velocity) applied to the processed material should be constant. However, at low velocities, the applied power may become so low that the peak pulse power may be insufficient to ablate the material without inducing thermal effects (e.g., melting and charring).

Beam positioner designs may deflect the process beam using galvos. The intensity profile of the process beam at a workpiece may be Gaussian (for simple focusing of a Gaussian beam), or a shaped intensity profile (e.g., flat-top profile) for beams conditioned by a fixed optic beam shaper.

SUMMARY OF THE DISCLOSURE

In one embodiment, a method for dithering a laser beam forms a trench having one or more desired trench widths in a workpiece independent of a varying processing velocity along a beam trajectory. The method includes imparting first relative movement of a laser beam path along the beam trajectory with respect to a surface of the workpiece, and determining a second relative movement of the laser beam path along a plurality of dither rows. The second relative movement is superimposed on the first relative movement at a predetermined angle with respect to the beam trajectory. The determination of the second relative movement includes compensation for changes in the processing velocity to maintain the predetermined angle for each of the plurality of dither rows. The method further includes imparting the second relative movement of the laser beam path, and emitting a plurality of laser beam pulses to the workpiece at a plurality of spot locations along the plurality of dither rows to widen a trench in a direction defined by the predetermined angle. In certain embodiments, the predetermined angle is perpendicular to the beam trajectory. In addition, or in other embodiments, emitting the plurality of laser beam pulses includes emitting at a constant rate, and the method further includes selectively adjusting the processing velocity so as to process an integral number of dither rows to complete the trench.

In another embodiment, a laser processing system includes a first positioning system for imparting first relative movement of a laser beam path along a beam trajectory with respect to a surface of the workpiece, and one or more processors for determining a second relative movement of the laser beam path along a plurality of dither rows. The second relative movement is superimposed on the first relative movement at a predetermined angle with respect to the beam trajectory. The determination of the second relative movement includes compensation for changes in a processing velocity along the beam trajectory so as to maintain the predetermined angle for each of the plurality of dither rows. The system also includes a second positioning system for imparting the second relative movement of the laser beam path, and a laser source for emitting a plurality of laser beam pulses to the workpiece at a plurality of spot locations along the plurality of dither rows to widen a trench in a direction defined by the predetermined angle.

In another embodiment, a method for dithering a laser beam creates a trench in a workpiece. The method includes imparting first relative movement of a laser beam path along a beam trajectory defining a length of the trench with respect to a surface of the workpiece, and imparting a second relative movement of the laser beam path along a plurality of dither rows. The second relative movement is superimposed on the first relative movement to widen the trench. A width of the trench is variable. The method further includes selecting a number of dither points to include in each of the plurality of dither rows. The selection reduces an amount of time used to process each dither row, and the number of dither points in each dither row is based on the width of the trench corresponding to the respective dither row. The method further includes emitting a plurality of laser beam pulses to the workpiece at a plurality of spot locations corresponding to the dither points in each of the plurality of dither rows.

In another embodiment, a method for laser processing a two-dimensional skive area on a workpiece uses a laser direct ablation system. The method includes generating a grid of laser spot locations within the skive area. The spacing between the laser spot locations within the grid is based at least in part on a laser spot size and a desired overlap of adjacent laser spots. The method further includes dividing the grid into a plurality of strips corresponding to respective passes of a laser beam path along a beam trajectory. Each strip includes a plurality of dither rows along a dither direction with respect to the beam trajectory. The method also includes imparting first relative movement of the laser beam path successively through the plurality of strips along the beam trajectory, imparting second relative movement of the laser beam path along the dither direction for each dither row, and emitting a plurality of laser beam pulses to the workpiece along the laser beam path to the laser spot locations within the skive area. In certain embodiments, the method further includes filtering data for each of the dither rows to slope laser spot intensity profiles along the sides of adjacent strips of the grid to shape overlap between the passes of the laser beam such that depth variation is controlled within the skive area. The laser spot intensity for each of the plurality of laser beam pulses is selected based on the filtered data. In addition, or in another embodiment, the method includes reversing the dither direction as the laser beam path moves from a first strip of the grid to a second strip of the grid. The dither direction may be based on the direction of the beam trajectory.

Additional aspects and advantages will be apparent from the following detailed description of preferred embodiments, which proceeds with reference to the accompanying drawings.

BRIEF DESCRIPTION OF THE DRAWINGS

FIG. 8 illustrates an example process calibration test matrix according to one embodiment.

FIG. 9 illustrates an example Material Table according to one embodiment.

FIG. 17 illustrates a table of example beam positions and process parameters of the example dither operation shown in FIGS. 15 and 16.

DETAILED DESCRIPTION OF PREFERRED EMBODIMENTS

Figure 1:
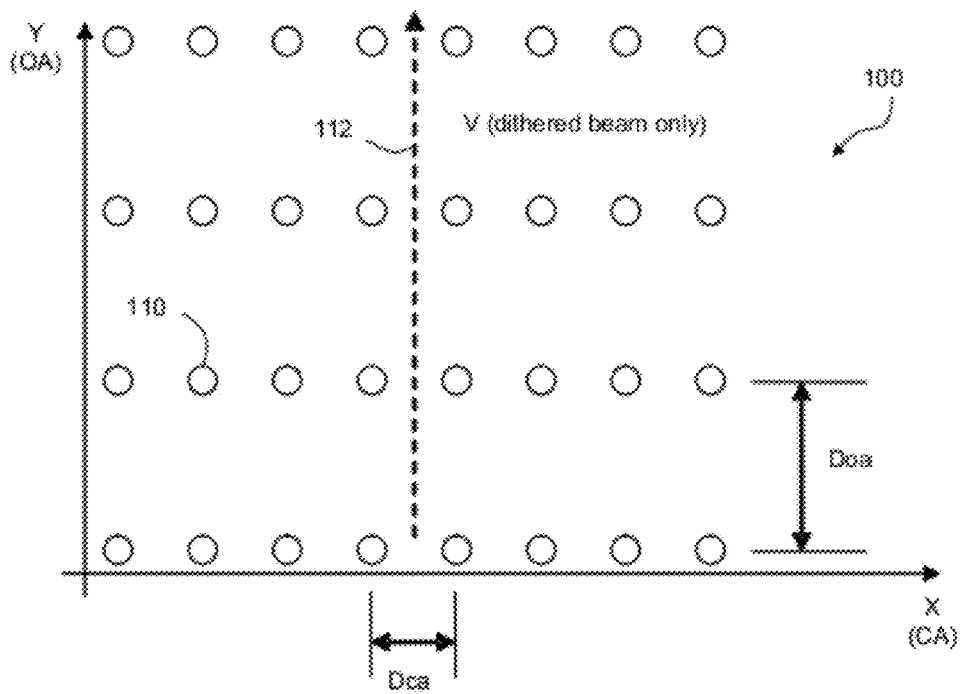
FIG. 1 is a schematic diagram illustrating a grid of processing spots, which may be generated by dithering a moving beam or a stationary raster pattern.

The disclosure contained herein describes implementation details for an LDA system using acousto-optic deflectors (AODs) as a beam positioning device. While the example embodiments disclosed herein are directed to AODs, electro-optic deflectors (EODs) may also be used. In certain embodiments, for example, EODs are suitable replacements for some or all AOD pointing (deflection) functions.

In certain embodiments, the geometry of processed features (e.g., width and depth) may be specified at a high level by the user, and then translated into process commands by machine control software. Laser power and details of the dithering operation are automated in certain embodiments to prevent a burdensome, error-prone manual machine setup process. For example, a user may be provided a simple process to create geometric features with nominal dimensions. The features may include trenches with a target width and depth, or pads with a target diameter and depth. The user may directly enter these geometrical parameters, and the system responds by generating the proper process parameters (e.g., beam velocity, dither width, laser power) required to generate the features. Because certain LDA machines can operate at arbitrary beam velocities (in order to maximize throughput given beam positioner and laser power constraints), the process parameters may be automatically adjusted for velocity. This automation avoids forcing the user to specify low-level details (e.g., laser power, dither width, dither points, velocity), with the attendent risk of operator error, while allowing the system to automatically maximize throughput.

Certain embodiments provide optimized dither point selection. This embodiment maximizes throughput by sizing a dither table to cover the desired dither range with a minimum number of dither points. One reason for minimizing the number of dither points is because each dither point uses a certain update time Tdither (e.g., an update rate of about 1 μs according to example embodiments discussed below). Where Npts is the number of dither points per row, Tdither*Npts=the amount of time used per row. Thus, minimizing the number of dither points allows the system to process features at the highest possible velocity while maintaining sufficient overlap between dither rows, which is useful for creating an even fluence distribution, and thus even ablation of the feature. For example, when forming a feature with AOD dithering, the dithered spots maintain a minimum overlap to minimize fluence variation. The number of dither points used to widen a trench can affect this overlap. The selection of dither points is optimized in certain embodiments to provide both high process speed and adequate spot overlap.

Certain embodiments provide fluence normalization for wide arc processing. Such embodiments maintain the quality (e.g., even trench depth) of ablated arc features in cases where the ratio of width to arc radius is relatively large. This provides more freedom to circuit layout designers to route arcs in a tighter area than may otherwise be feasible. For example, when dithering to process wide trenches that form a circular arc section, the applied fluence across the wide trench varies as a function of the radius from the arc center. This fluence is normalized in certain embodiments to process the arc with a constant depth.

Certain embodiments provide coordinated calibration of AOD and galvo positioning systems. Other positioning systems may also be used, such as a system that uses a fast steering mirror (FSM) Coordinating calibration of different positioning systems maintains accuracy in the dithering operation over the entire scan field. The AOD beam positioning subsystem may suffer from scan field distortion due to the implementation of the scan lens, galvo mirrors, and AOD subsystem. For example, scan lenses generally have local geometric distortion that varies with scan field position. By applying a local correction as a function of scan field position, the accuracy of dithering is maintained at a level useful to provide acceptable depth variation at intersections. In addition, or in other embodiments, the calibration of the AOD beam positioning subsystem is coordinated with the calibration of the galvo subsystem for proper implementation of tertiary beam positioning. As discussed below, such calibration is used during dithering, rastering, and skiving modes. This may be done in cooperation with the tertiary beam positioning, which commands the AOD subsystem to maintain the trajectory centerline (during dithering in vector or skive mode) or raster center point (during raster mode).

Certain embodiments provide overlapped raster patterns. Throughput may be optimized by rastering features whenever possible, since the AOD rastering operation occurs at a much higher speed than is possible with stage or galvo beam positioning. However, the constrained field size of the AOD field limits the features size that can be AOD-rastered in one step. By overlapping raster patterns, while maintaining proper depth control at the intersection of the overlapped regions, a quality raster pattern may be generated for patterns exceeding the AOD field size, thus maximizing throughput. In certain embodiments, the AOD subsystem is used to raster two-dimensional features within the AOD range, without any motion from the galvo subsystem. Patterns larger than an AOD field may also be rastered by overlapping a plurality of separate raster patterns at separate (and stationary) galvo coordinates. This approach may be a more efficient (and thus more desirable) processing method than general two-dimensional skiving using a moving galvo trajectory. As used herein, two-dimensional (2D) refers to processing a 2D area (e.g., in X and Y directions), but also includes laser processing with depth control in a third dimension (3D). Depth control includes, for example, an amount of material removed in a Z direction or shaping the processed feature.

Certain embodiments provide optimized AOD efficiency versus range. The throughput realized when processing features in an LDA system is proportional to the available laser power given the required process parameters. Optimizing this laser power thus optimizes throughput. By optimizing AOD efficiency as a function of required AOD operating range (while maintaining accurate AOD power linearization over the operating AOD field), such power optimization is achieved. Throughput is maximized when processing features requiring a relatively small AOD field, while still providing the ability to maximize the AOD range when needed for larger features. For example, when dithering or forming two-dimensional raster patterns with AODs, the optical efficiency decreases with increased deflection range. Thus, it may be desirable to linearize the optical output power from the AOD over the operational range to make AOD operation predictable and consistent. In certain embodiments, linearized power control is provided, with higher optical efficiency for reduced AOD deflection range used in certain operations, while allowing a larger range (with reduced optical efficiency) available for other operations.

Certain embodiments provide velocity optimization with tertiary filtering. The tertiary filtering approach, combined with a limited AOD beam displacement range, places limits on the maximum beam velocity allowed for a given feature width. By calculating this limit (given dither width and AOD power limitations as a function of AOD operating range) the optimum velocity can be determined under the given constraints, thus optimizing throughput. An alternative of setting a conservative velocity limit, which would work under all conditions, may unacceptably reduce throughput. Tertiary filtering with AOD beam control allows reduced the bandwidth requirements for the galvo beam positioner. The dynamics of the tertiary filter, and the variation of AOD optical efficiency as a function of deflection range, may combine to set a limit on the allowable process velocity when processing a trench. In certain embodiments, an automated system and process of determining this optimum velocity is used to maximize processing speed. Certain embodiments maintain dithering perpendicular to trajectory. Such embodiments may guarantee that the desired line width is automatically maintained, independent of process velocity. This results in predictable and repeatable process quality, while allowing velocity to vary arbitrarily as required to optimize throughput within the beam positioner and power constraints. When dithering a beam to form a variable-width trench in a workpiece material, for example, the dithered beam remains perpendicular to the tangent of the trench regardless of the processing velocity. Certain embodiments use integral dither rows. Such embodiments provide predictable processing results, independent of the number of dither points used to widen a linear process feature, and regardless of the selected process velocity. The predictable process result is useful, for example, when creating intersections between features. By completing an integral number of dither rows, the end of a linear process feature is well defined, allowing depth variation to be well controlled in an intersection with other features such as other trenches or pads.

Certain embodiments improve the efficiency of processing large two-dimensional areas on the workpiece. This may be approached by skiving the area, using dithering to widen the process spot. This approach provides good resolution of the skived area perimeter, and provides adequate control of the depth variation resulting from the overlap of adjacent skiving passes. Certain such embodiments provide efficient skiving with controlled overlap and high resolution edges. Large skived areas are common in applications processed by an LDA machine. To maximize throughput, it is useful to optimize the processing of these skived features, while maintaining sufficient resolution of the definition of the edge of the skived area. These embodiments enable the use of a wider dithered beam to process the skive area, while simultaneously keeping high quality edge definition and shaping the overlap between skive passes such that depth variation is well controlled within the skive area.

Reference is now made to the figures in which like reference numerals refer to like elements. For clarity, the first digit of a reference numeral indicates the figure number in which the corresponding element is first used. In the following description, numerous specific details are provided for a thorough understanding of the embodiments disclosed herein. However, those skilled in the art will recognize that the embodiments can be practiced without one or more of the specific details, or with other methods, components, or materials. Further, in some cases, well-known structures, materials, or operations are not shown or described in detail in order to avoid obscuring aspects of the invention. Furthermore, the described features, structures, or characteristics may be combined in any suitable manner in one or more embodiments.

Embodiments may include various steps, which may be embodied in machine-executable instructions to be executed by a general-purpose or special-purpose computer (or other electronic device). Alternatively, the steps may be performed by hardware components that include specific logic for performing the steps or by a combination of hardware, software, and/or firmware.

Embodiments may also be provided as a computer program product including a non-transitory, machine-readable medium having stored thereon instructions that may be used to program a computer (or other electronic device) to perform the processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/computer-readable medium suitable for storing electronic instructions.

I. Introduction

This disclosure describes AOD control methods used in an LDA system. This control extends the capability of the LDA architecture to improve throughput for large skived areas, and to support high-speed operation for trench processing.

A capability of the LDA system is to use acousto-optic deflectors (AODs) to deflect the process beam at very high speeds (>1 MHz) to provide laser processing capabilities. Typically, the AODs can deflect the beam over a range of 5-20 spot diameters. The LDA system may operate, for example, in vector, raster, vector, and skive modes.

In vector mode, the system processes trenches as "lines" in the workpiece. The AOD beam dithers along a one-dimensional (1D) line, in an axis orthogonal to the beam trajectory, to artificially widen the ablated trench.

In raster mode, the AODs deflect the process beam to process a two-dimensional (2D) area within their processing field. The spatial and intensity patterns of these raster areas are generally arbitrary. This capability may be used, for example, to create intersections between trenches, or to create features such as via pads.

In skive mode, a large area (beyond the AOD field size) may be processed. This may be performed with a dither-widened line. However, special processing is used to avoid excessive pixelation of contoured edges, and to provide sloped fluence profiles for good overlap and intersection quality.

The following sections describe these modes and outline implementation details for various embodiments of the LDA system.

II. AOD Processing Theory

In one embodiment, the LDA system manipulates the process beam with an AOD subsystem to create features of various dimensions. This section describes the theory behind this processing, which leads to a system architecture.

A. Center Fluence Normalization for Depth Control.

Material removal volume is nominally proportional to fluence (for a given laser power level), and thus fluence may be controlled to control feature depth. In addition, the interaction between feature dimension and fluence can be eliminated by specifying fluence instead of dosage. When dosage is specified, the resulting fluence in a dithered or rastered area depends on the number of dither points and the feature dimension relative to the process spot size, which is a result of the Gaussian spot energy distribution falling outside of the dithered grid area. This effect can be calculated and compensated to eliminate this interaction. The system automatically adjusts laser power dynamically to maintain the specified fluence in the center of the trench or raster area, independent of velocity or dither (or raster) grid dimensions. As a result, the system's basic beam delivery setup (e.g., spot size, minimum dither (or raster) spot overlap) may be changed without affecting process calibration results.

1. Theoretical Fluence

FIG. 1 is a schematic diagram illustrating a grid 100 of processing spots 110, which may be generated by dithering a moving beam (e.g., in vector mode) or a stationary raster pattern (e.g., in raster mode). The processing spots 110 each have an XY spot separation in the on-axis (OA) and cross-axis (CA) of Doa and Dca, respectively. For a dithered beam according to this example, assume the dither pattern is repeated (e.g., essentially forever) as the beam moves (as indicated by arrow 112) in the Y axis. A calculation area is covered by Noa and Nca points in the OA and CA axes, respectively. In other words, Nca is the number of points in the cross-axis direction.

i. Raster Fluence

Assuming a laser power P, and an AOD dwell time per point of Taod, the average fluence (energy E per unit area A) is given by $$\text{Fluence} = E/A = P*Taod/(Dca*Doa).$$

This expression is useful in raster processing, which is well described by predictable grid spacing. In this case, a "Fluence Scale" can be defined to convert fluence to power:

$$\text{FluenceScale} = (Dca*Doa)/Taod,$$

and then the raster power (in watts) for the specified fluence can be calculated by $$\text{Power} = \text{FluenceScale} * \text{Fluence}.$$

ii. Vector Fluence

In the case of a dithered beam, the grid spacing is not constant due to variable velocity and changing dither widths. In this case, the fluence calculation can be described in terms of dosage. Given $$Doa = V*Nca*Taod \text{ and}$$

$$\text{Width} = Dca*(Nca-1),$$

then $$\text{Fluence} = P*Taod/(Dca*V*Nca*Taod)$$
$$= (P/V)/(\text{Width}*Nca/(Nca-1))$$
$$= \text{Dosage}/\text{EffectiveWidth},$$

where
Beam velocity (e.g., along the Y axis shown in FIG. 1)=V,
Dosage=P/V, and
EffectiveWidth=Width*Nca/(Nca−1)=Dca*Nca.

This is a useful result, since it means (for the ideal case) that the fluence in a given area can be normalized using well-known process parameters of Dosage and Width (for a dithered line) or spacing and dwell time (for a rastered area). Dithered features with time-varying spot distributions, and rastered features of arbitrary spot distributions, can be combined to create an intersection after normalizing their respective fluence levels.

Note that as long as Dosage is controlled, the details of dithering (number of dither points Nd, dither spacing, velocity) during vector processing are not required. This is useful, since the beam control architecture of the LDA system relies on being able to vary dither spacing and velocity arbitrarily.

iii. Edge Effects

The fluence model described above deviates from theory when the dimensions of the dithered pattern are small relative to the spot size. At such small dimensions, the power in each spot "leaks out" of the grid 100 and reduces the fluence at the center of the grid area. This effect is a function of both grid dimension and the number of points within the grid. For example, FIG. 2 graphically represents the variation in EffectiveWidth (Weff) as a function of relative grid width (normalized by spot diameter Dspot) and the number of dither points across the grid width according to one embodiment. This deviation in EffectiveWidth can be predicted and compensated.

Figure 2:
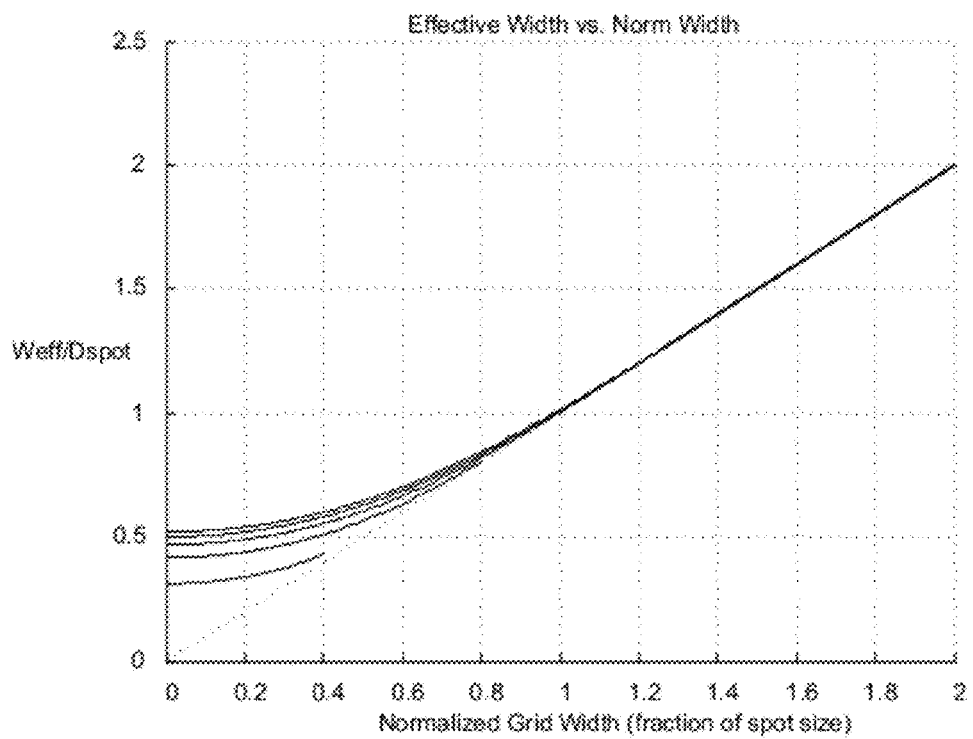
FIG. 2 graphically represents the variation in Effective-Width as a function of relative grid width (normalized by spot diameter) and the number of dither points across the grid width according to one embodiment.

In FIG. 2, for normalized grid widths between 0 and approximately 1, the top curve corresponds to 6 spots, the next highest curve corresponds to 5 spots, the next highest curve corresponds to 4 spots, the next highest curve corresponds to 3 spots, and the lowest curve corresponds to 2 spots.

2. Fluence Normalization

The equations developed above calculate the fluence of an arbitrary grid of laser spots such that separately processed regions can be combined with predictable results. This "fluence normalization" is useful for forming trenches of varying width, and feature intersections. Two examples illustrate this.

Figure 3:
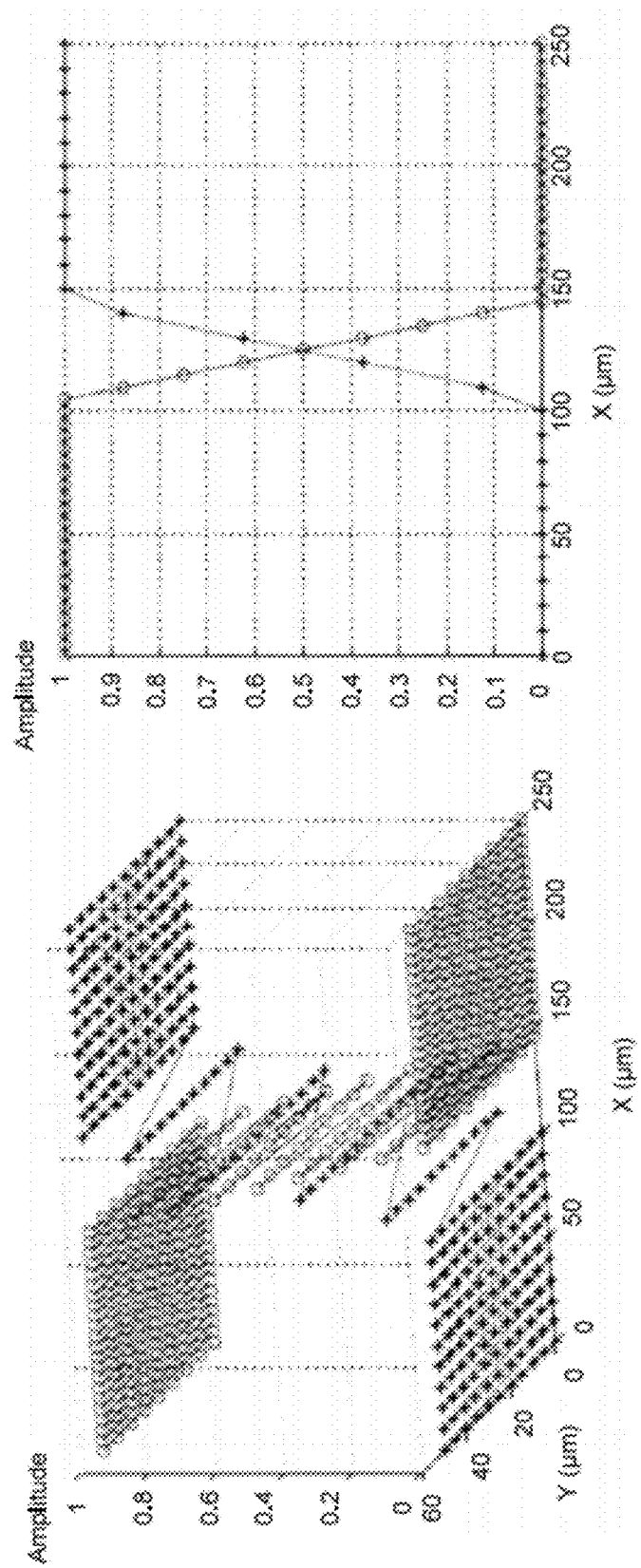
FIG. 3 graphically illustrates grid patterns of two intersecting features with different grid densities according to one embodiment.
Figure 4:
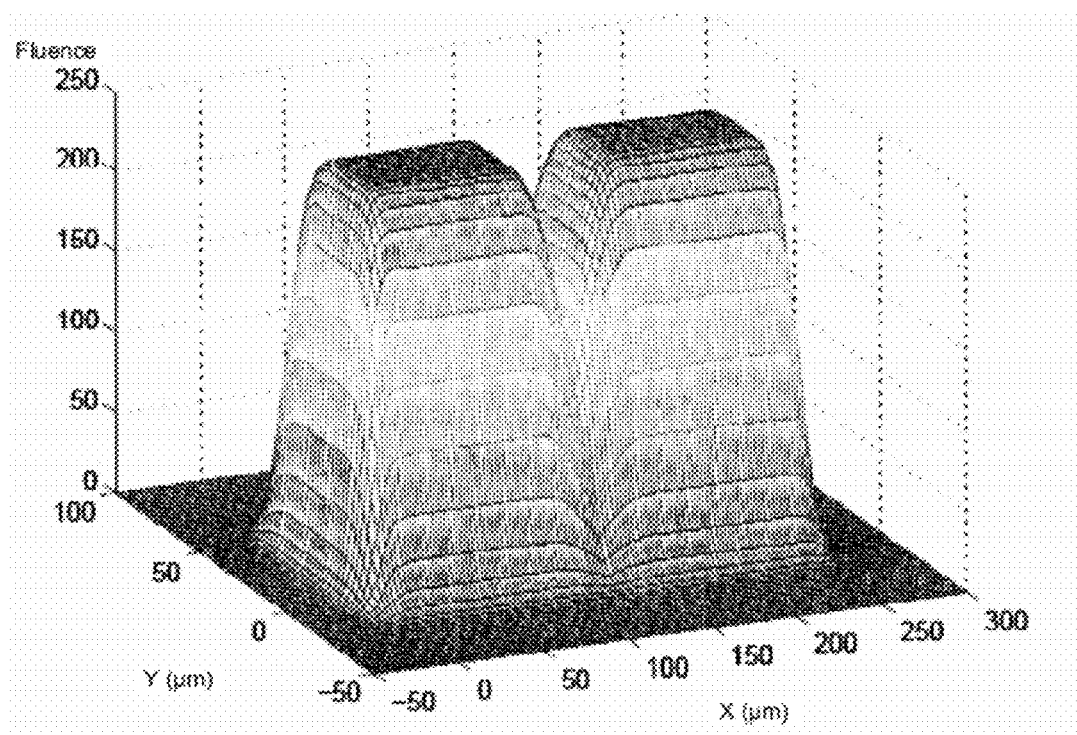
FIG. 4 graphically illustrates a modeled fluence of intersecting features after amplitude normalization (uncombined) according to one embodiment.
Figure 5:
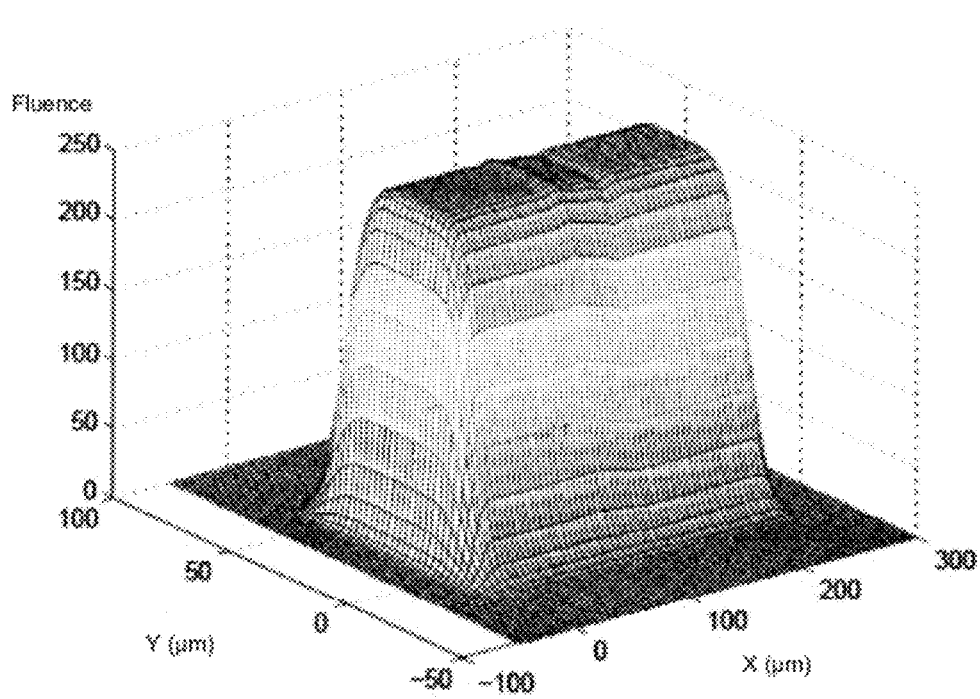
FIG. 5 graphically illustrates a combined fluence of intersecting features according to one embodiment.

The first example of fluence normalization is illustrated in FIGS. 3, 4, 5, and 6. FIG. 3 graphically illustrates grid patterns of two intersecting features with different grid densities according to one embodiment. In FIG. 3, two features intersect, each with different dither grid spacing. Processing spots for one of the features are represented by circles and processing spots for the other feature are represented by plus signs (+). For an intersection, one of these patterns may be, for example, a trench and the other a section of an intersection raster pattern. Note that the spot amplitudes are ramped down to create the intersection slope to provide tolerance to positioning error. FIG. 4 graphically illustrates a modeled fluence of intersecting features after amplitude normalization (uncombined) according to one embodiment. In FIG. 4, the fluence over each pattern is simulated, after scaling spot energy for each grid according to its spot density. FIG. 5 graphically illustrates a combined fluence of intersecting features according to one embodiment. In FIG. 5, the fluence of the two patterns is combined for a relatively smooth intersection.

Figure 6:
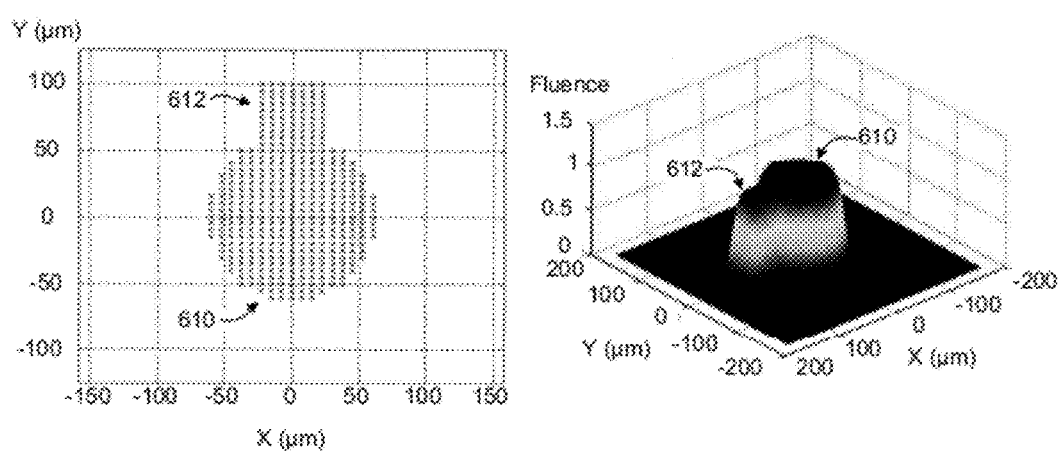
FIG. 6 graphically illustrates a raster grid (right) and a fluence profile (left) for a circular pad having a tab according to one embodiment.

This approach works well for such regular, rectangular patterns. In the case of more complex intersections, such as a trench and a circular pad (a common LDA intersection), the pad pattern may include "tabs" that extend the pad grid out to a rectangular section, which can then be processed as described above. For example, FIG. 6 graphically illustrates a raster grid (right) and a fluence profile (left) for a circular pad 610 having a tab 612 according to one embodiment. In the example of FIG. 6, the tab 612 has a length of about 50 μm, which can be used for an intersection transition.

Figure 7:
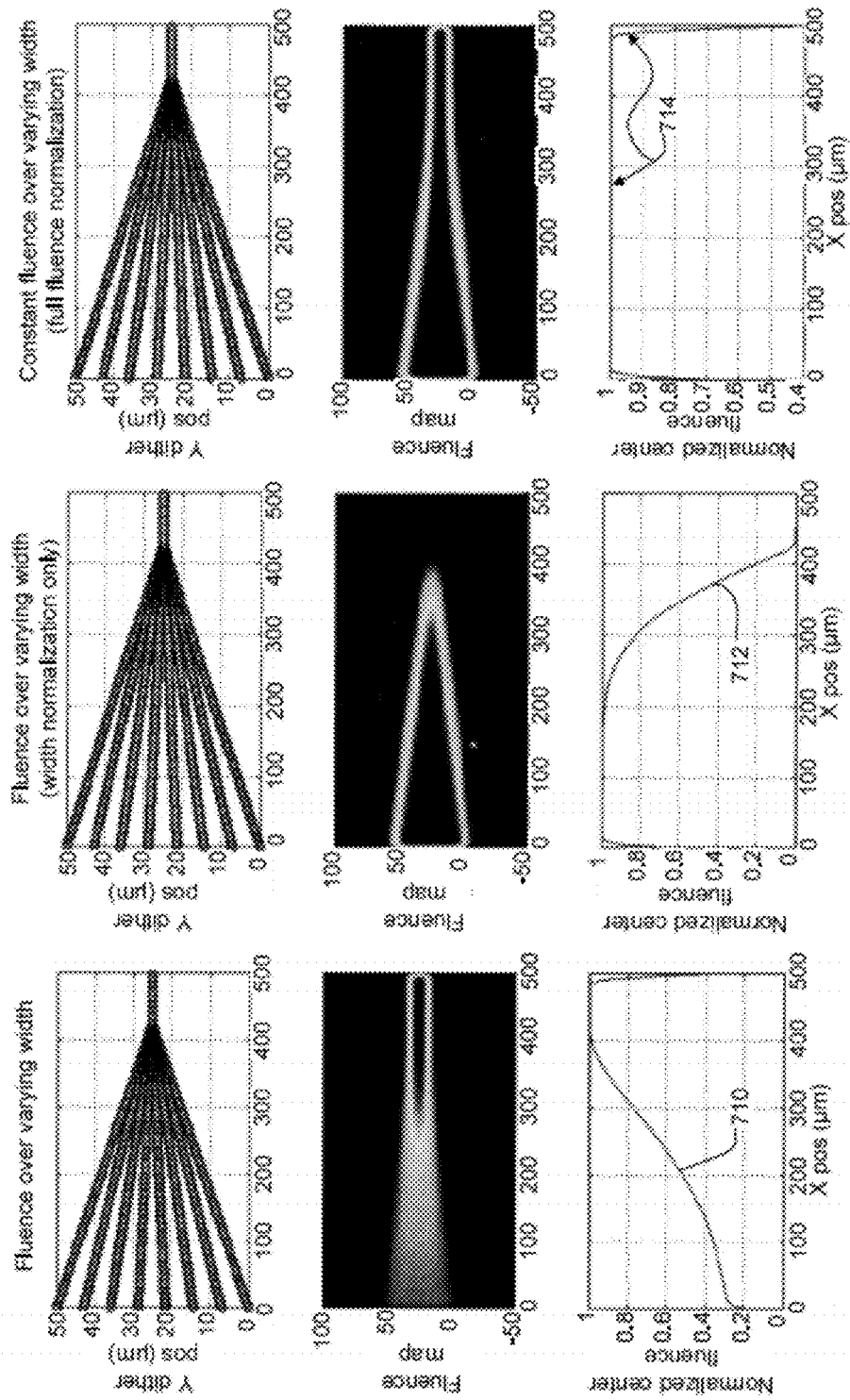
FIG. 7 graphically illustrates the impact of fluence normalization on a trench of varying width according to one embodiment.

A second example is shown in FIG. 7, which graphically illustrates the impact of fluence normalization on a trench of varying width according to one embodiment. In FIG. 7, graphs are organized in three columns with top graphs illustrating dither patterns, middle graphs illustrating corresponding fluence distributions, and bottom graphs illustrating corresponding center fluences 710, 712, 714 (i.e., the fluence at the center of the respective trenches as the widths of the trenches change). The left column illustrates no compensation, the middle column illustrates width compensation, and the right column illustrates nonlinear compensation. In this example, when the dosage is simply scaled by the dither grid width, the nonlinearity in effective width shown if FIG. 2 still produces fluence variation as the dither width narrows. In contrast, FIG. 7 shows that applying the nonlinear fluence correction achieves a constant fluence as width changes. As shown in FIG. 7, both the center fluence 710 with no compensation and the center fluence 712 with linear compensation based on width vary as the trench widths change. However, when using the nonlinear fluence correction discussed above (e.g., based on Dosage and Width parameters where Fluence=$P*Taod/(Dca*V*Nca*Taod)$), the center fluence 714 remains constant (i.e., the curve 714 remains at the normalized value of "1").

After the fluence linearity correction is applied as a function of dither (or raster) grid width, a constant dosage (power/velocity) can then be applied to maintain this fluence independent of velocity. Thus a vector-processed trench can be varied in width and in velocity while keeping center fluence constant.

Fluence linearity compensation may be extended to two dimensions for rastered areas (e.g., for pads or other large features). However, this effect may be negligible for pad diameters that are greater than about 1.5*spot diameter. Since pads will typically meet this diameter criterion, in certain embodiments, they may not require fluence compensation.

3. Caveats to Fluence Modeling

The above analysis is idealized. Several caveats should be mentioned that may affect the performance of the system in creating intersections with controlled depth variation.

The material will have a processing threshold, so fluence does not necessarily combine linearly to predict the amount of ablated material. This implies that constant-dosage processing may not yield consistent results, since process threshold effects will reduce as power increases with velocity at constant dosage.

Spot distortion (including effects from AOD deflection, especially at high deflection rates) will distort the fluence field.

Fluence nonlinearity on trench ends may not be addressed. Typically, trenches end at an intersection with another trench (a stub on a pad, or a leg on a rastered intersection). As long as both intersecting trenches have the same ramp in fluence across the intersection area, end effects will nominally cancel.

B. Dither Abstraction

Based on this result, the process of dithering and rastering may be abstracted to encapsulate the low-level details of dithering (e.g., the number of dither points and their scaling). This allows the system architecture or components to be easily modified (e.g., new AOD designs, different optical layouts) without affecting the way a user (or programmer) specifies dither and raster processing. Software architecture, machine calibration, and application setup is simplified.

In the formation of intersections, care should be taken to avoid fluence (and thus depth) variation at the intersection point. In an example embodiment, each intersection is customized based on the surrounding trench dimensions, with a custom raster pattern (precalculated offline, e.g., using Matlab or other tools) created for each type of intersection. This process may be streamlined for a production machine.

For the LDA system, both objectives may be met by considering dithered and rastered objects as consisting of a grid of dithered spots, described by a spot density and dimensional bounds. By doing this, the fluence within the dithered or rastered area on the workpiece may be calculated, and intersection raster patterns may be generated based on such calculated fluencies.

1. Dither Map

Since the details of dither geometry are not required for intersection definition, the specification of dither during vector processing can be abstracted to spot grid width and dosage. Spot placement, both on-axis (along the velocity vector) and cross-axis, do not need explicit definition. Rather, a Dither Map translates the grid width to low-level dither parameters; e.g., the number of dither points Nd and the dither width scaling factor Kw. Note that the concept of "shape" (Ks) is being ignored for now.

The Process Calibration procedure described herein views the dither operation through the interface of grid width and fluence. The details of Nd and Kw, according to certain embodiments, are encapsulated in the Dither Map to avoid complexity in the Process Calibration step. Note that the Dither Map can change if spot size or AOD range is changed. In certain embodiments, the same Dither Map is used for Process Calibration and during run-time processing to ensure consistent, calibrated process results.

The AOD dither table that supports this processing is preset during system calibration. The Dither Map encapsulates the interface to dither parameters with users such as Process Calibration, Process Map, and Sequencer. The Dither Map sets up dither tables using the following steps:

First, determine the AOD deflection scale factor during system calibration.

Second, set the effective spot diameter Deff in the system calibration data, based on minimum trench dimension for a 1:1 depth/width aspect ratio. This setting is simply a guideline for setting up the AOD table (to set the pitch to a conservative maximum value) and for fluence linearization. The value of Deff may need to be accurate to within ~10-20% in certain embodiments. A lower value of Deff may be used to ensure overlap, but it will increase the number of dither points and may reduce maximum velocity.

Third, initialize 32 sequential dither tables (e.g., within a field-programmable gate array (FPGA), as discussed below). Each of the dither tables includes 1 to 32 points, each with a pitch of 0.35*Deff. The dither tables may cover a dither range up to 10*Deff. This provides a 10% tolerance in the definition of Deff while ensuring that overlapping pulses create an even fluence distribution.

C. Process Calibration and Mapping

Given the paradigm of fluence control, the process setup procedure may be modified in the LDA system. In an example embodiment of the LDA system, the process parameters include low-level dither parameters (Kw, Ks) and dosage (power/velocity)—nominally in units of Joules per meter (J/m) (although the actual dosage units may be arbitrary). The LDA system simplifies the user interface for processing setup, with consistent, calibrated units and isolation from low-level implementation details.

Material processing in the LDA system may be defined by two parameters: fluence ($J/cm^2$) and dither or raster grid dimension (width for vector and skive processing, XY raster dimension for rastering).

1. Process Calibration

Fluence normalization applies to the central area of a dither (or raster) feature. The fluence at the edges of the feature is not as easily normalized, since it results from the tails of the Gaussian spots. As a result, trench width varies as a nonlinear function of dither grid width, and is still calibrated in certain embodiments. This is a function of the Process Calibration feature. The same procedure is used to calibrate feature depth vs. fluence for a given material.

Figures 8, 9:
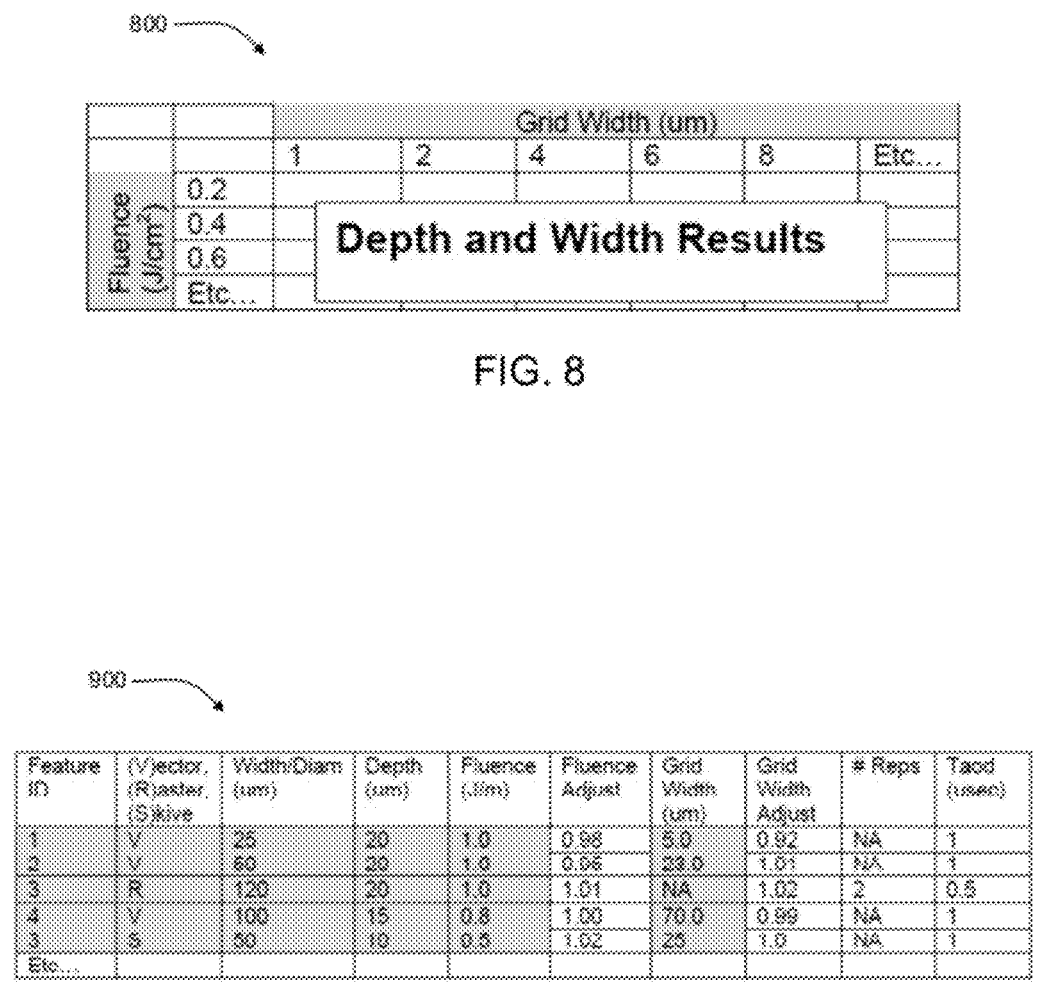

FIG. 8 illustrates an example process calibration test matrix 800 according to one embodiment. The calibration test matrix 800 specifies a range of fluence levels and dither grid widths. A set of features (one for each entry in the parameter matrix) is automatically processed on the machine, and measured on an external metrology tool. The feature width and depth results are imported to the process calibration software, which then builds a "Process Table" database that is used to automatically select the process parameters (fluence and grid width) used to process features of any dimension.

2. Process Map and Material Table

For vector processing, trench dimensions (width and depth) determine the dither grid width and fluence, through the Process Map that populates the Material Table for the application. The Process Map performs this mapping based on data supplied from the Process Calibration table. FIG. 9 illustrates an example Material Table 900 according to one embodiment. Note that the entries in grey in the Material Table 900 are entered by the Process Map and are not modified by the user. Fine adjustments to process parameters are available to run process tests or fine-tune the process.

When the application is loaded, the Material Table 900 is populated with the dimensions of all vector and skive features (trench widths and depths) and raster features (pad diameters and depths) contained in the application.

The user may enter fine-tuning adjustments in the Material Table 900 if desired. This may be discouraged for production processing in certain embodiments, but may be useful for process testing and fine-tuning. If no Process Calibration table is available, the Material Table 900 entries can be manually entered.

A function of the Process Map is to interpolate the required Material Table 900 entries based on the relatively sparse information collected during Process Calibration.

III. System Architecture

The following sections describe certain embodiments of system architecture and components that implement AOD operation.

A. Data Flow and Processing

Figure 10:
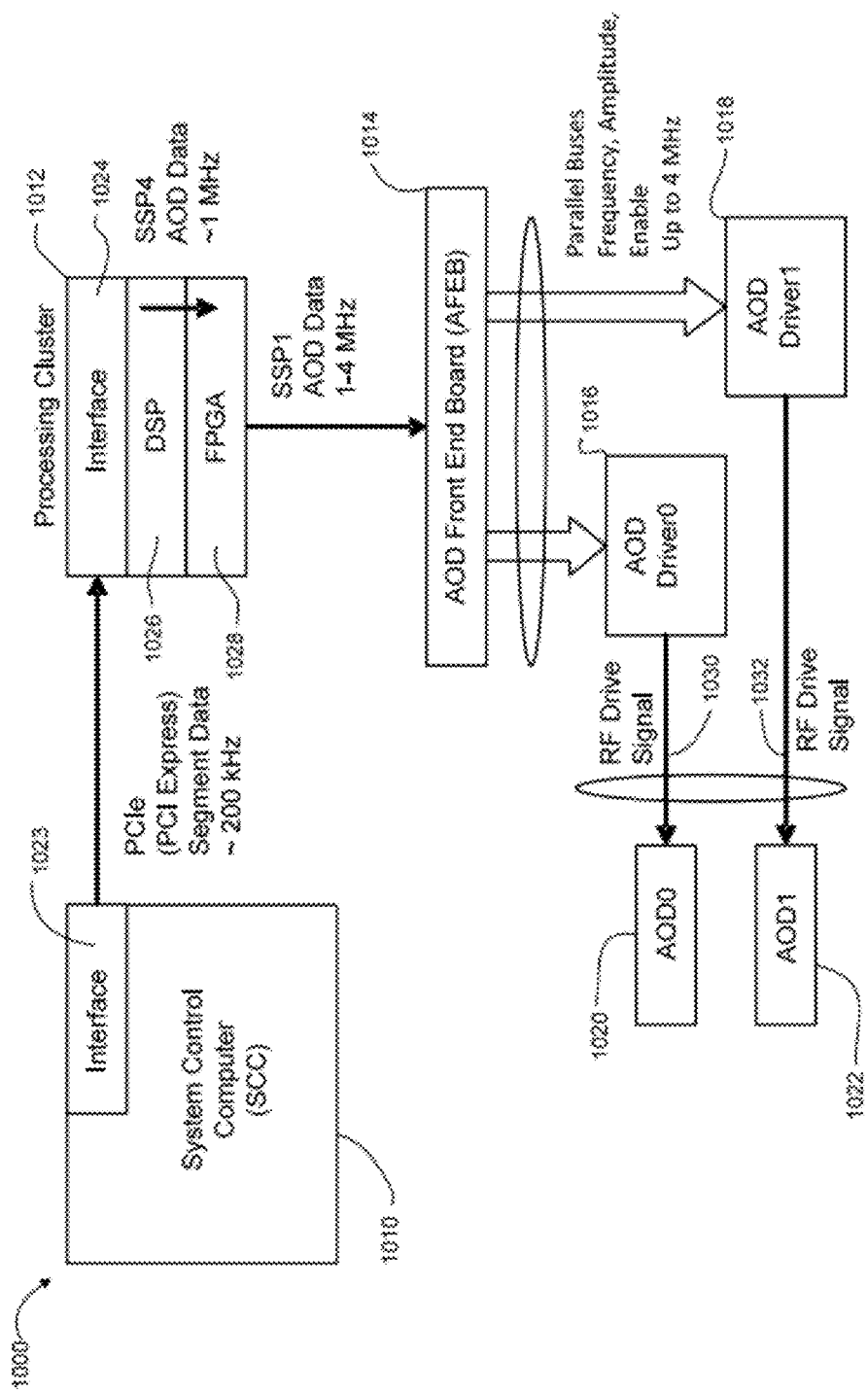
FIG. 10 is a block diagram illustrating a simplified processing and data flow architecture for commanding the AODs according to one embodiment.

FIG. 10 is a block diagram illustrating a simplified processing and data flow architecture for commanding the AODs (also referred to herein as the "AOD processing architecture" 1000) according to one embodiment. The AOD processing architecture 1000 includes a system control computer (SCC) 1010, a processing cluster 1012, an AOD front end board (AFEB) 1014, AOD drivers 1016, 1018, and AODs 1020, 1022. As discussed in detail below, the SCC 1010 preprocesses a laser processing application to construct individual process segments and associated process parameters. The SCC 1010 sends the segment data through an interface 1023 (e.g., at a 200 kHz data rate) to an interface 1024 of the processing cluster 1012. The processing cluster 1012 includes a digital signal processor (DSP) 1026 and a field-programmable gate array (FPGA) 1028. Artisans will understand from the disclosure herein that other types of processing logic (e.g., in addition to or rather than the DSP 1026 and/or FPGA 1028) may also be used.

The DSP 1026 calculates detailed beam trajectories and dither parameters (e.g., at a 1 MHz data rate). This data is then transmitted to the FPGA 1028. As discussed in detail below, the FPGA 1028 calculates high-speed AOD commands (e.g., up to a 4 MHz data rate), which are transmitted to the AFEB 1014 through an SSP1 serial link. The AFEB 1014 converts the AOD commands to parallel data words that are sent to the AOD drivers 1016, 1018. The AOD drivers 1016, 1018 then generate radio frequency (RF) drive signals that operate the AODs 1020, 1022 to control the optical beam deflection (through RF signal frequency) and amplitude (through RF signal amplitude) through the AOD cells. Example operation of the AODs 1020, 1022 and other optical elements are discussed below with respect to FIGS. 10A, 10B, and 10C.

Figure 10A:
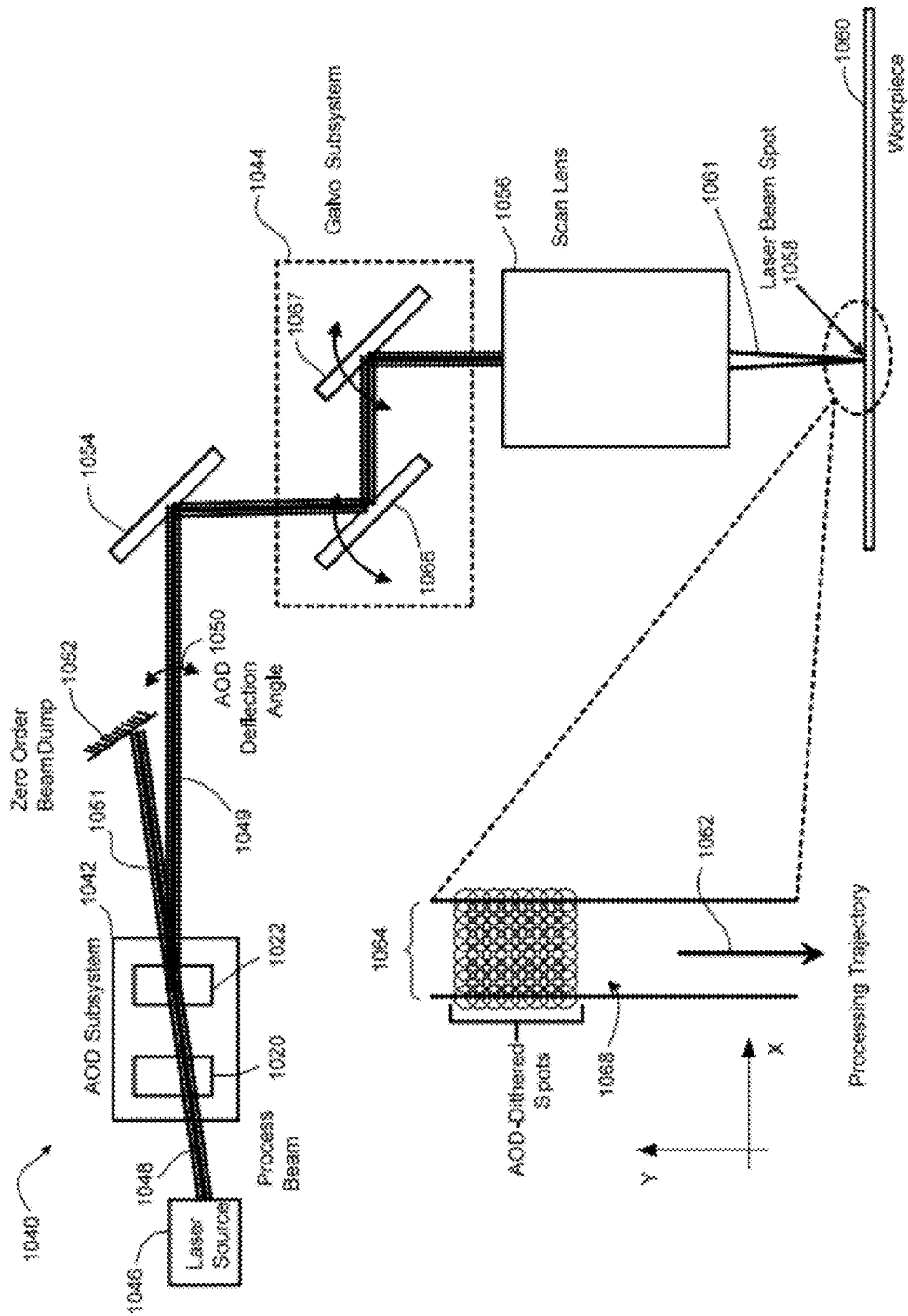
FIG. 10A is a block diagram of a system including an AOD subsystem and galvo subsystem for dithering a laser beam according to one embodiment.

FIG. 10A is a block diagram of a system 1040 including an AOD subsystem 1042 and galvo subsystem 1044 for dithering a laser beam according to one embodiment. An artisan will recognize from the disclosure herein that other types of positioning subsystems may be used. For example, a positioning subsystem may use an FSM. The system 1040 includes a laser source 1046 for providing a process beam 1048 to the AOD subsystem 1042. In one embodiment, the laser source 1046 includes a pulsed laser source such that the process beam 1048 comprises a series of laser pulses. In another embodiment, the laser source 1046 includes continuous wave (CW) laser source such that the process beam 1048 comprises a CW laser beam. In certain such embodiments, the AOD subsystem 1042 generates laser pulses from the CW laser beam by deflecting the process beam 1048 at discrete ("pulse") intervals.

As discussed above, the AOD subsystem 1042 deflects a first order beam 1049 of the process beam 1048 at an AOD deflection angle 1050 and a zero order beam 1051 of the process beam 1048 to a beam dump 1052. The system 1040 may further include a fixed mirror 1054 to deflect the first order beam 1049 to the galvo subsystem 1044, and a scan lens 1056 to focus a laser beam spot 1058 on or within a workpiece 1060. The output of the scan lens 1056 may be referred to herein as a focused laser beam 1061.

In one embodiment, the AOD subsystem 1042 may include a single AOD used to provide deflection back and forth in a first direction (e.g., a dither direction) while the galvo subsystem 1044 provides deflection in a second direction along a processing trajectory 1062. In the embodiment shown in FIG. 10A, each row (shown along the X axis) of AOD-dithered spots is perpendicular to the processing trajectory 1062. For increased speed and versatility, however, the AOD subsystem 1042 in the embodiment illustrated in FIG. 10A provides 2-D deflection along an X-axis and a Y-axis with respect to a surface of the workpiece 1060. In this example, the Y-axis may be referred to as being parallel to the processing trajectory 1062 and the X-axis may be referred to as being perpendicular to the processing trajectory 1062. Thus, the X-axis may be referred to as the dithering direction. The processing trajectory 1062 may correspond to a direction, for example, that the system 1040 scribes or cuts a trench 1064 (e.g., under control of the galvo subsystem 1044) into a surface of the workpiece 1060.

To provide the illustrated 2-D deflection, the AOD subsystem 1042 includes a first AOD 1020 to deflect the first order beam 1049 in a first direction and a second AOD 1022 to deflect the first order beam 1049 in a second direction, as the galvo subsystem 1044 moves the beam axis along a processing trajectory 1062. In other words, the movement of beam spot positions provided by the AOD subsystem 1042 is superimposed on the movement of the beam spot positions provided by the galvo subsystem 1044. As shown in FIG. 10A, the galvo subsystem 1044 may also include a first galvo mirror 1066 and a second galvo mirror 1067 to deflect the first order beam 1049 in both the X-axis and Y-axis directions with respect to the surface of the workpiece 1060.

The orientation of the AOD deflections may not align to the deflection axes of the galvo subsystem 1044. In general, a coordinate transformation may be applied to the AOD deflection commands to align the resulting AOD deflections to a desired coordinate frame. This coordinate transformation may also be a function of velocity, rotating the AOD deflection coordinate frame in order to keep the AOD beam deflection perpendicular to the processing trajectory defined by the galvo subsystem 1044.

With the AOD subsystem 1042 included in the system 1040, several operational modes are enabled. In one embodiment, an operational mode includes an ability to dither the process beam 1048 to effectively widen the laser beam spot 1058 at the workpiece 1060. In other words, dithering the process beam 1048 includes spatially locating a series of focused laser beam spots 1068 to create geometric features having dimensions greater than those of an individual laser beam spot 1058 focused by the scan lens 1056. For illustrative purposes, FIG. 10A shows the dithered laser beam spots 1068 as viewed from above the surface of the workpiece 1060 as the trench 1064 is processed in the direction of the processing trajectory 1062. Thus, for example, the series of dithered laser beam spots 1068 at a given repetition rate has the effect of a series of larger diameter laser beam spots successively applied in the direction of the processing trajectory 1062 at a lower pulse repetition rate.

In certain embodiments, the AODs 1020, 1022 can update their respective acoustic fields (filling the optical aperture with a new acoustic waveform) on the order of about 0.1 µs to about 10 µs. Assuming an example update rate of about 1 µs, the process beam's position can be rapidly updated such that several of the dithered laser beam spots 1068 overlap during processing. The dithered laser beam spots 1068 may overlap in the dimension (e.g., along the X-axis or dither direction) perpendicular to the processing trajectory 1062 to widen the feature (e.g., the trench 1064) being processed. As shown in FIG. 10A, the dithered laser beam spots 1068 may also overlap in the direction of the processing trajectory 1062. To keep the dithered beam oriented normal to the processing trajectory 1062, according to certain embodiments, a dither axis may be constantly adjusted as the angle of the processing trajectory 1062 changes. In addition, the dither axis may be adjusted to compensate for the angle imparted on the line of dither points as a function of the process trajectory velocity.

In addition to dithering the beam position with respect to the surface of the workpiece 1060, or in other embodiments, the AOD subsystem 1042 may be used to vary the intensity profile in the dither axis. The manipulation of the intensity profile of the process beam 1048 along the dither axis enables shaping of the cross-section of the processed trench 1064. For example, the trench 1064 may be processed with rectangular, U, or V shaped cross sections. Shaping features such as sidewall slope may be useful in situations such as intersection formation. The shaping resolution may be based on the fundamental spot size, and the shaped intensity profile may be a convolution of the dither pattern (location and intensity) and the spot intensity profile (e.g., Gaussian or another profile shape). A feature may be shaped, for example, by overlapping pulses at certain locations (e.g., two or more pulses may be applied at the same location) along the dither axis to remove selected amounts of target material, and/or by modulating the power amplitudes of laser pulses as a function of deflection position along the dither axis.

In addition to the shaping of the feature along the dither axis, or in other embodiments, the AOD subsystem 1042 may be used to control the power as a function of the position along the processing trajectory 1062 to allow similar shaping of the "endpoint" of a processed linear feature. Controlling the power as a function of the position along the processing trajectory 1062 may also be useful in applications such as intersection formation. The use of the AOD subsystem 1042 enables power modulation to occur at very high speeds (e.g., on the order of microseconds) such that fine control of intensity profiles (e.g., with feature dimensions in a range between about 5 µm and about 50 µm) may be possible at high processing velocities (e.g., in a range between about 1 m/s and about 5 m/s).

Figure 10B:
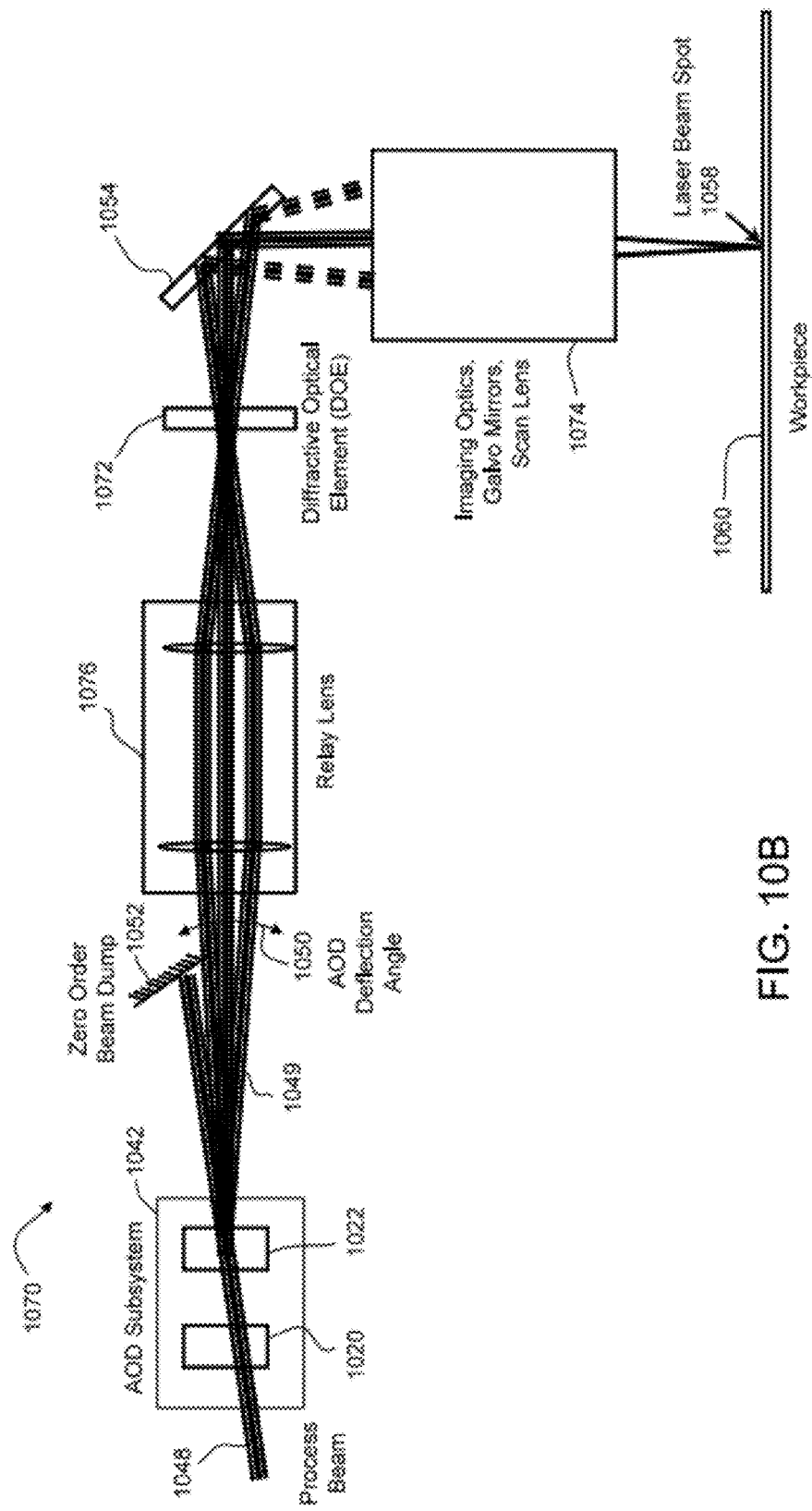
FIG. 10B is a block diagram of a system for beam shaping according to one embodiment.

In addition to deflection of Gaussian beams, certain embodiments may also deflect beams shaped by traditional beam shaping technologies including, for example, diffractive optical elements (DOEs). For example, FIG. 10B is a block diagram of a system 1070 for beam shaping according to one embodiment. The system 1070 includes the AOD subsystem 1042 (with the first AOD 1020 and the second AOD 1022), the zero order beam dump 1052, and mirror 1054 shown in FIG. 10A. The system 1070 further includes a diffractive optical element (DOE) 1072 for beam shaping and optical elements 1074 (e.g., imaging optics, galvo mirrors, and scan lens). For illustrative purposes, the first order beam 1049 in FIG. 10B is shown over a range of AOD deflection angles 1050. In embodiment illustrated in FIG. 10B, the first order beam 1049 deflected by the AOD subsystem 1042 is relayed to the DOE 1072 through a relay lens 1076 (imaging the beam's pivot point on the DOE 1072) to keep the first order beam 1049 centered on the DOE's aperture regardless of the AOD deflection angle 1050 imparted by the AOD subsystem 1042. The DOE 1072 may then shape the beam intensity by imparting additional wavefront phase distortion (as is typical for such beam shaping DOEs). This approach may be beneficial in situations where larger, shaped beams may be deflected and abutted to form a more uniform dithered fluence profile with, for example, square intensity profiles. This approach may also be beneficial in situations where a small number of laser pulses is adequate to form a desired feature (for example, a microvia drilled in a dielectric material). In this case, a rastered application of Gaussian pulses may be less efficient relative to applying a shaped intensity profile, yet high-speed AOD deflection may be desirable for high-speed control of the shaped intensity process spot position.

In other embodiments, a similar relay lens configuration may be used to tailor the deflection of the AOD-deflected beam at the scan lens. This may be desirable for at least two reasons. First, it may be desirable to relay the pivot point of the beam to the galvo scan mirrors (eliminating beam lateral deflection) to (a) keep the beam centered in the clear aperture of the galvo mirrors and scan lens to avoid beam clipping, and (b) avoid displacing the beam from the center of the scan lens entrance pupil, since such displacement may produce a sloped beam at the worksurface. Second, it may be desirable to impart a lateral beam deflection at the scan lens in order to intentionally produce a beam slope at the work surface. A sloped beam may be advantageous in certain Gaussian laser drilling applications to create a steeper sidewall in processed features (for example, microvia drilling).

Figure 10C:
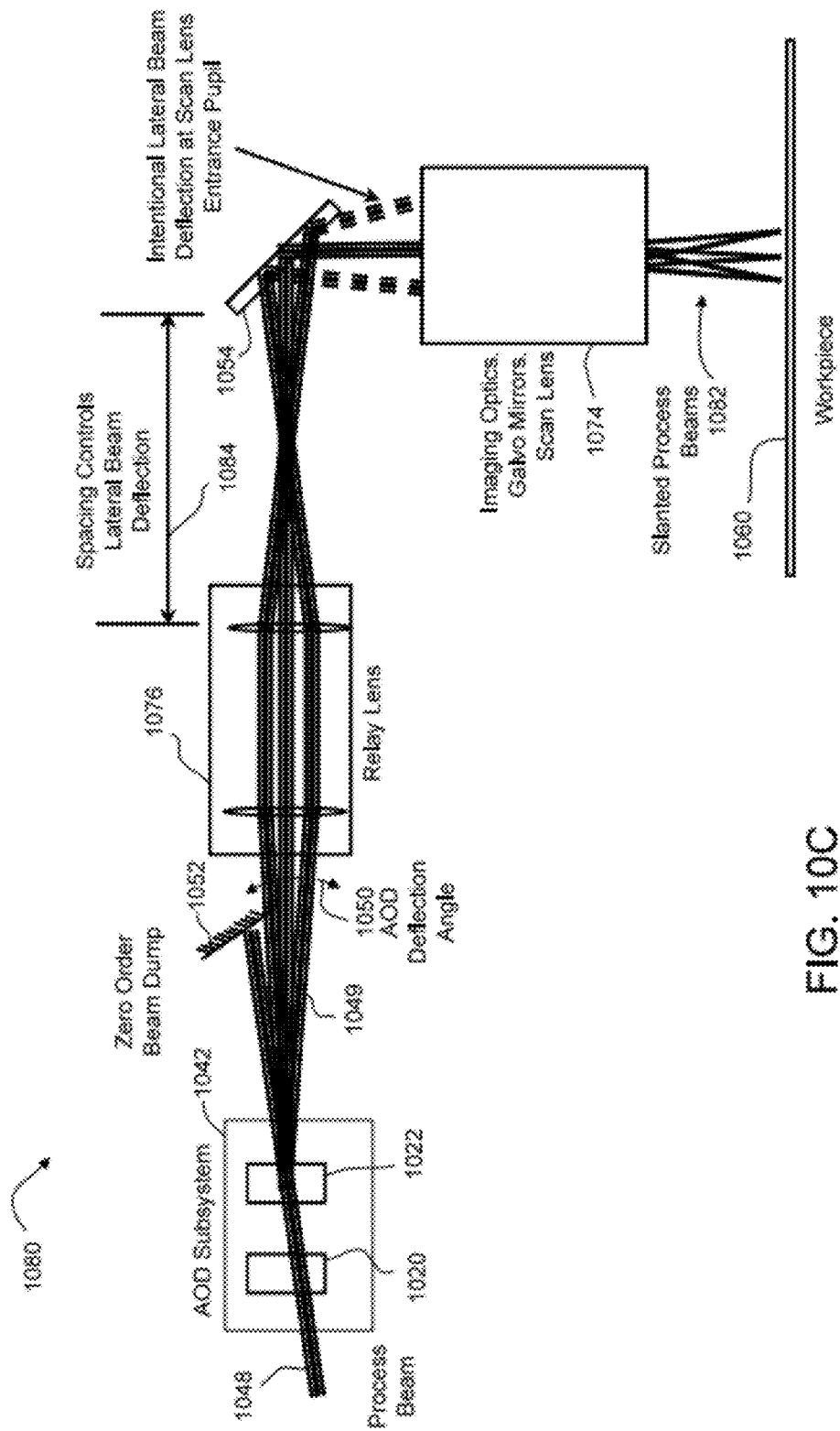
FIG. 10C is a block diagram of a system providing slanted process beams according to one embodiment.

FIG. 10C is a block diagram of a system 1080 providing slanted process beams 1082 according to one embodiment. The system 1080 includes the AOD subsystem 1042 (with the first AOD 1020 and the second AOD 1022), the zero order beam dump 1052, and mirror 1054 shown in FIG. 10A. The system 1080 further includes a relay lens 1076 and optical elements 1074 (e.g., imaging optics, galvo mirrors, and scan lens). For illustrative purposes, the first order beam 1049 in FIG. 10C is shown over a range of AOD deflection angles 1050. As shown in FIG. 10C, by properly designing and spacing 1084 the relay lens 1076 from the scan lens (e.g., from the scan lens 1056 shown in FIG. 10A), the first order beam 1049 deflected by the AOD subsystem 1042 can also be laterally deflected to create the sloped beam 1082 at the surface of the workpiece 1060. The amount of beam slope for a given deflection of the process spot at the workpiece 1060 may be controlled by either (a) using the AODs 1020, 1022 to substantially create the lateral spot deflection at the workpiece 1060, and varying the relay lens 1076 optics and spacing 1084 to the scan lens (e.g., scan lens 1056), or (b) coordinate the galvos (e.g., the galvos 1066, 1067 shown in FIG. 10A) and AODs 1020, 1022 such that a arbitrary lateral beam deflection at the scan lens (and thus an arbitrary beam slope at the workpiece 1060) may be imparted independently from the desired lateral spot deflection at the workpiece 1060.

Further details of shaping techniques are disclosed below in the section labeled "Example AOD Control Embodiments."

While beam dithering may be very effective and flexible for producing a desired fluence profile, an alternative (but sometimes more restrictive) approach to dithering includes varying the focus of the laser beam spot 1058 by applying a chirp waveform to at least one of the AODs 1020, 1022. With a chirp waveform, the instantaneous frequency of the acoustic wave varies linearly within the optical process beam 1048 passing through the AOD's crystal. The linear variation of the instantaneous frequency of the acoustic wave has the effect of applying a single-axis (astigmatic) focusing term to the process beam 1048, rather than displacing the laser beam spot 1058 in discrete steps. By applying chirp waveforms to both AODs 1020, 1022, according to certain embodiments, the laser beam spot 1058 can be symmetrically defocused, thus increasing the spot size at the workpiece 1060. This approach may be useful, for example, in the case of lower repetition rate lasers where the pulse repetition frequency may not be high enough to provide good overlap of pulses at the workpiece 1060 to avoid intensity variation when widening the trench 1064. Chirping may also be used to defocus a laser beam spot during a processing step that uses a lower fluence. For example, a laser process (e.g., scribing between integrated circuits formed on or in a semiconductor wafer) may include a first process step that cuts through an overlying metal (e.g., copper) layer, followed by a second process step that uses a reduced fluence to process an underlying dielectric layer. Rather than using two passes of the laser beam, one embodiment uses chirping to defocus the laser beam spot so that both layers can be processed in a single pass.

B. Dither Architecture

1. Basic Dither (or Raster) Table Architecture

Figure 11:
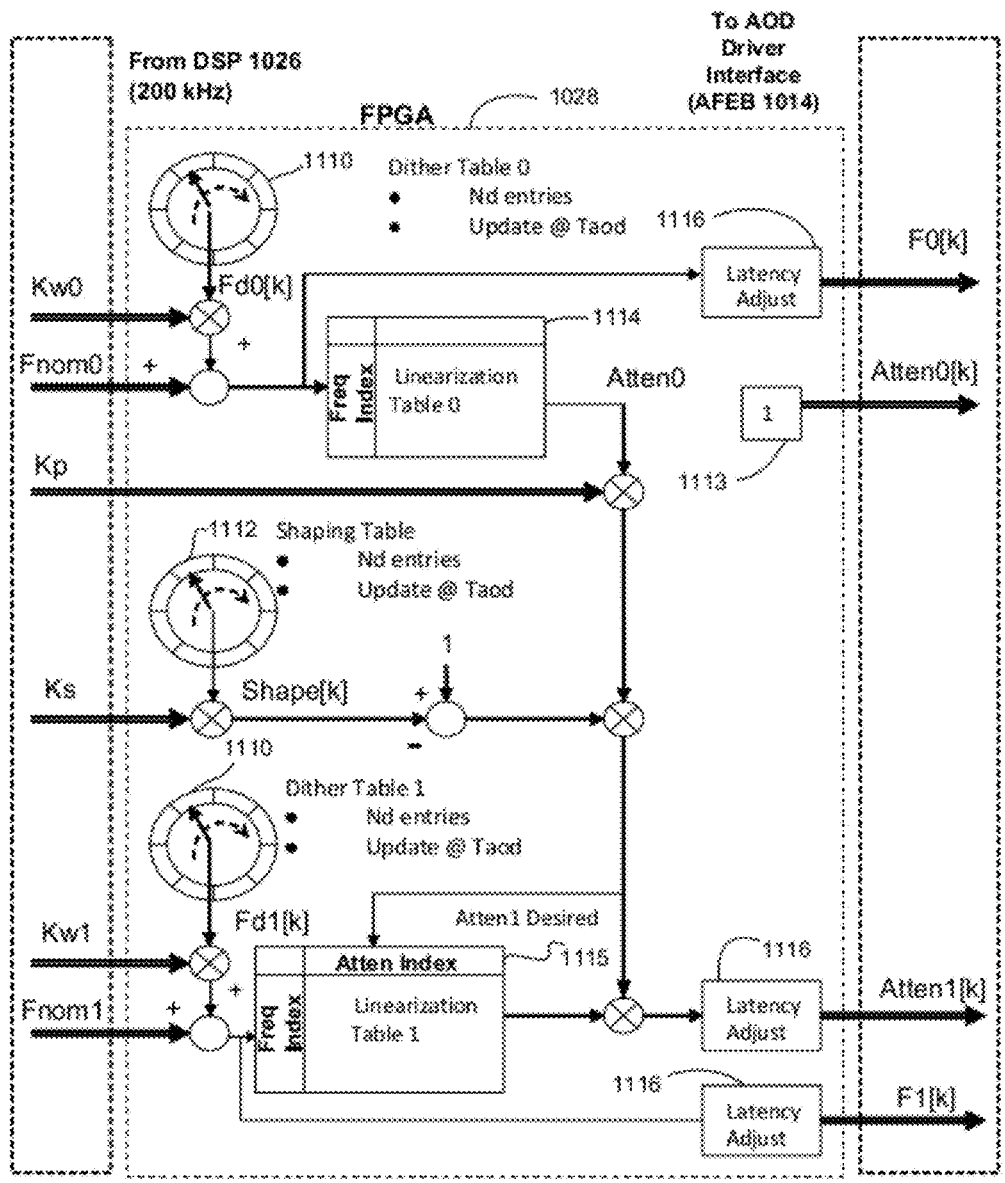
FIG. 11 is a block diagram representing AOD control data flow implemented in an FPGA according to one embodiment.

FIG. 11 is a block diagram representing AOD control data flow implemented in an FPGA 1028 according to one embodiment. It should be noted that dither and raster are often used interchangeably. They are both executed similarly; however, dither refers to one-dimensional beam deflection while rastering refers to two-dimensional deflection. The FPGA 1028 includes one or more dither tables 1110, shaping tables 1112, linearization tables 1114, 1115, and latency adjustment 1116.

Two sets of dither points are loaded in a dither table 1110. The dither table 1110 operates as a circular buffer, which can be addressed indefinitely. Many dither tables 1110 are stored in the FPGA 1028. Each dither table 1110 is identified by an address and a length. The FPGA 1028 automatically adjusts the circular buffer addressing to accommodate the specified table length.

During raster or dither operation, the dither table entries are read and conditioned by a transformation matrix to scale and rotate the dither (or raster) pattern, resulting in frequency commands to the two AOD channels.

A pair of additional frequency offsets is added to the transformed dither commands, providing a nominal command vector about which the dither commands are applied.

The set of linearization tables 1114, 1115 produces an AOD amplitude command based on the AOD frequency commands.

The Following definitions are also provided for FIG. 11.

F0: AOD frequency command, axis 0.

F1: AOD frequency command, axis 1.

Fnom: Nominal AOD frequency command for zero deflection.

Fd[1 ... Nd]: A set of deflection frequencies comprising the "dither table" 1110 described above.

Nd: Number of deflection frequency points (e.g., the number of dither points).

Kw: Dither width scaling factor. Kw=0 for no dither (nominal process beam).

Kp: Power command scale factor.

Ks: Intensity shaping factor.

Atten: Attenuation command.

2. FPGA Interface

Data is transmitted from the DSP 1026 to the FPGA 1028 every Tcmd update (e.g., 1 μsec).

3. DSP/FPGA Synchronization

Figure 12:
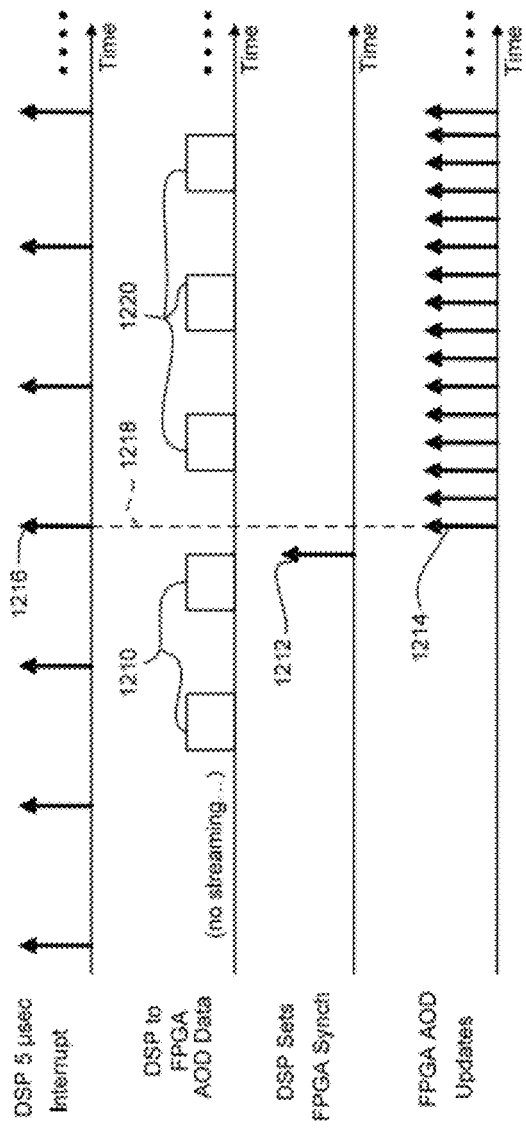
FIG. 12 is a timing chart illustrating example synchronization of a DSP and FPGA according to one embodiment.

During processing, the DSP 1026 streams data continuously to the FPGA 1028, and the FPGA 1028 synchronizes their data transmission and AOD control execution. This may be done with the following sequence, assuming an example update time (Tcmd) of 1 μsec. FIG. 12 illustrates this timing.

FIG. 12 is a timing chart illustrating example synchronization of a DSP and FPGA according to one embodiment. As shown in FIG. 12, The DSP 1026 writes 1210 ten sets of control data (enough for two 5-μsec DSP cycles) to the FPGA 1028. The DSP 1026 sets 1212 a "Synch" register in the FPGA 1028 to notify it that data is ready for processing. The FPGA 1028 begins data processing 1214 at the next 5 μsec DSP interrupt 1216, as indicated by the dashed line 1218. (The FPGA 1028 and the DSP 1026 receive the same interrupt). The DSP 1026 loads 1220 new data to the FPGA 1028 during each DSP cycle. The FPGA 1028 processes this data on a first-in-first-out (FIFO) basis. Galvo command data is calculated during each DSP cycle, but is applied to the galvo controller at the next DSP cycle. The galvos 1066, 1067 and AODs 1020, 1022 thus share the same timing reference. The DSP 1026 delays the AOD command data relative to the galvo command data to account for various signal processing delays between the galvos and the AOD control. This delay incorporates an adjustment for the two-cycle delay between initial data transmission (shown at 1210) and the beginning of data execution (shown at 1214) by the FPGA 1028.

4. Bank Parameter

One parameter is not shown in FIG. 11 is a "bank" parameter (Kb), which may be included in the LDA system dither definition. This parameter is used to vary the power applied across the width of the dithered beam to account for velocity differences between the inside and outside edges of an arc (like a banked racetrack turn). This is done by applying an additional scaling factor to the dither amplitude as a function of dither position, which is similar to the "shape" parameter used in certain embodiments.

Figure 13:
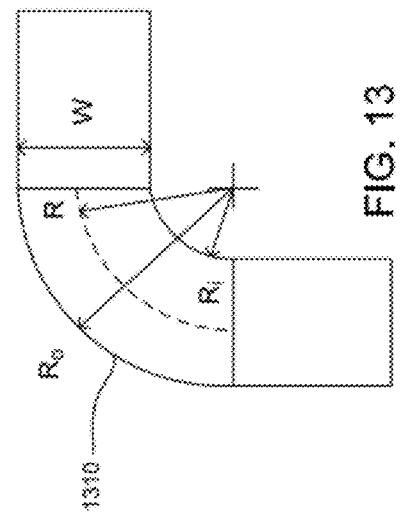
FIG. 13 is a schematic diagram illustrating a processing condition that uses banking according to one embodiment.

FIG. 13 is a schematic diagram illustrating a processing condition that uses banking according to one embodiment. FIG. 13 illustrates a wide arc 1310. The wide arc 1310 includes a relatively small mean radius R, which has a ratio of inside arc length Ri to outside arc length Ro that may be significantly different than 1, leading to fluence variation across the trench width W.

Defining the ratio of mean radius R to feature width W as a bank ratio $$Rb = R/W.$$

Then the ratio of outer and inner velocity is $$Vo/Vi = (2*Rb+1)/(2*Rb-1).$$

Figure 14:
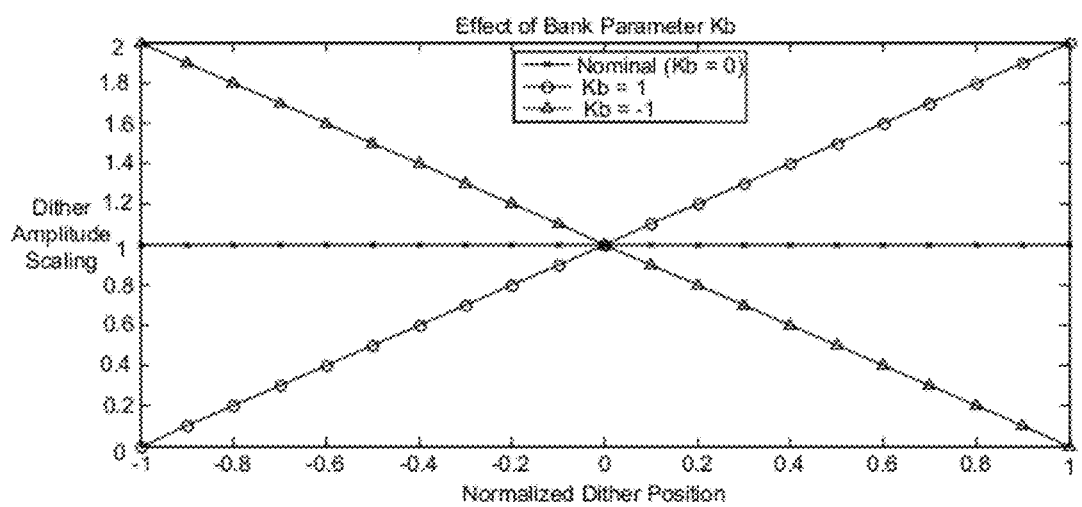
FIG. 14 graphically illustrates example bank parameter scaling according to one embodiment.

To adjust laser power across the dither width, a "bank parameter" Kb defines the variation in power scaling as a function of dither position. FIG. 14 graphically illustrates example bank parameter scaling according to one embodiment. The bank parameter Kb varies between −1 to +1, and can be defined as $$Kb = (K\text{start} - K\text{end})/2,$$

where
 Kstart=bank amplitude scaling at start of dither cycle, and
 Kend=bank amplitude scaling at end of dither cycle.
The bank parameter is related to the bank ratio by $$Kb = 1/(2*Rb).$$

For Kb=0, the scaling factor is 1 across the dither range (no effect). At the extremes (|Kb|=1), one end of the dither range is scaled down to zero and the other end amplified by 2×. When processing a typical arc, Kb may be set to an intermediate value (e.g., less than about 0.5).

Bank scaling at the center of the dither range (i.e. the centerline of the dithered beam) is not affected. Thus the centerline power (Pnom) remains unchanged, while the inner edge power is attenuated (to compensate for the lower beam velocity) and the outer edge power (Pouter) is amplified (to compensate for the higher beam velocity):

$$Pouter = Pnom*(1+Kb).$$

The LDA design rules in certain embodiments state that the ratio R/W should be limited to greater than about 2.0 to maintain reasonable velocity ratios and power scaling. During processing, the amplified power is checked to verify that it does not exceed maximum available power. The velocity in the arc is set to ensure that the amplified power does not exceed the maximum available power. Due to the tertiary profiling capabilities, this velocity reduction can occur instantly, at the ends of the arc segment.

5. Example Dither Operation

Figure 15:
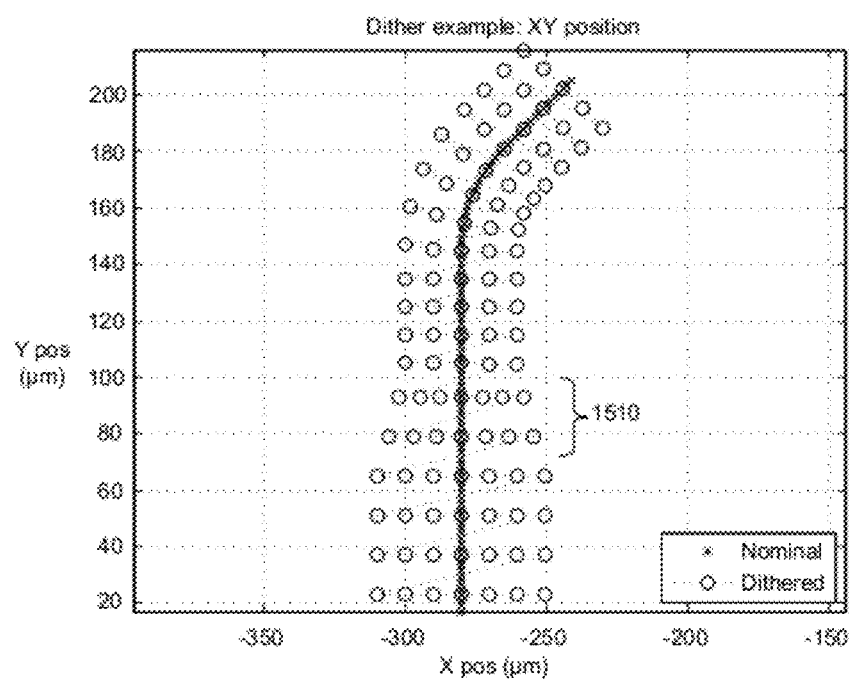
FIG. 15 graphically illustrates example XY beam positions according to the example dither operation.
Figure 16:
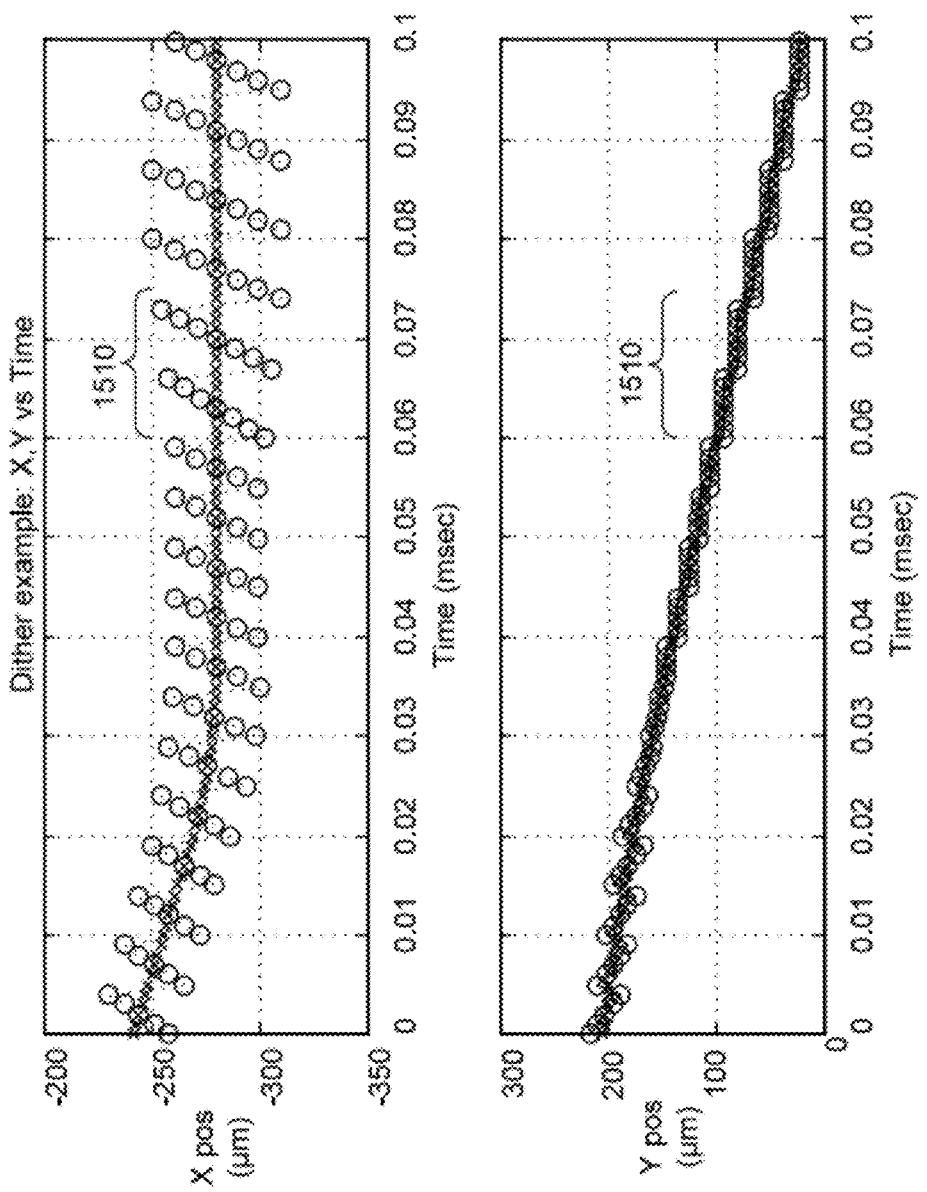
FIG. 16 graphically illustrates example X and Y beam positions vs. time according to the example dither operation shown in FIG. 15.
Figure 17:
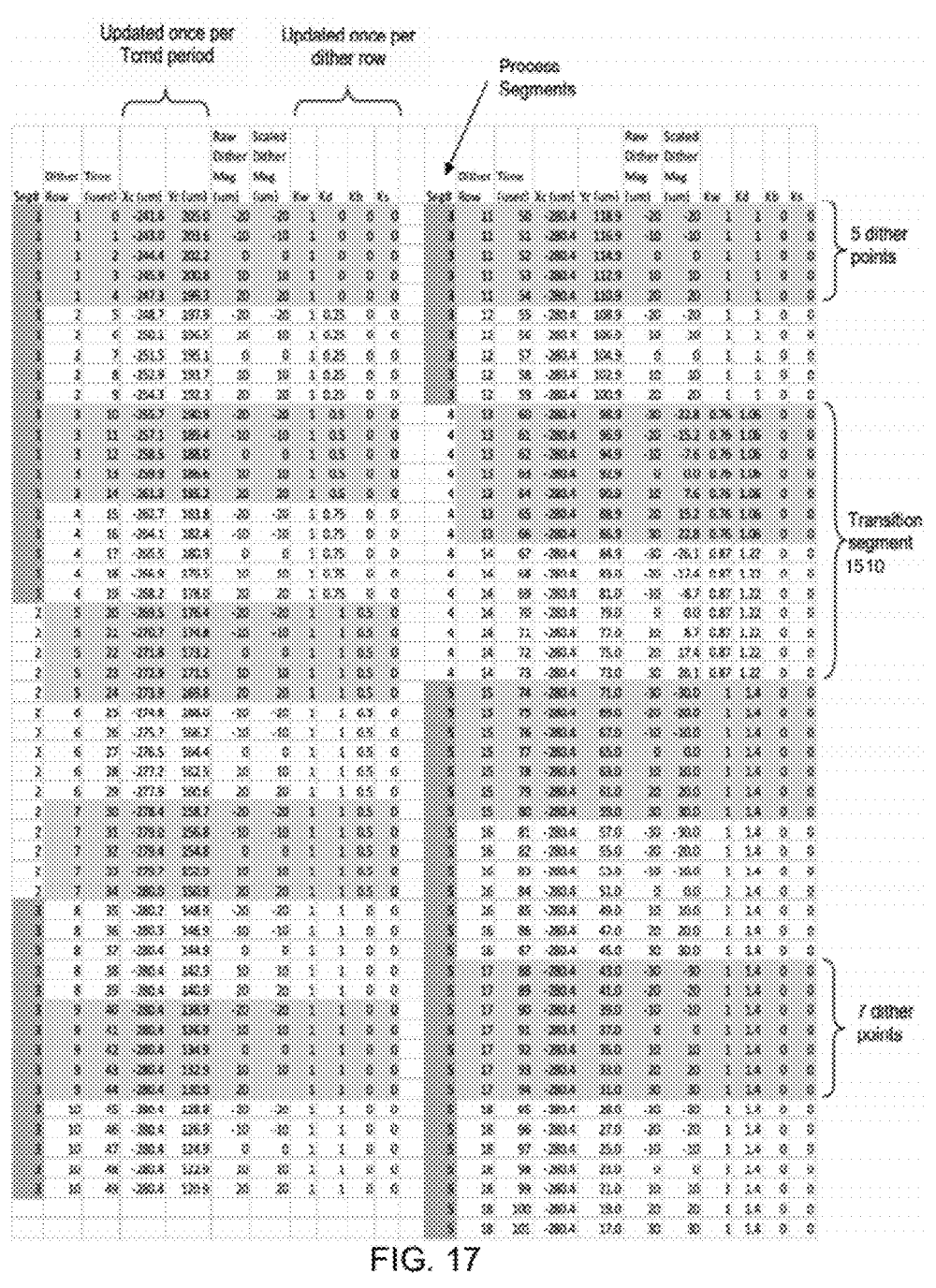

A simple example illustrates the timing of dither and command updates in FIGS. 15, 16, and 17. FIG. 15 graphically illustrates example XY beam positions according to the example dither operation. FIG. 16 graphically illustrates example X and Y beam positions vs. time according to the example dither operation shown in FIG. 15. FIG. 17 illustrates a table of example beam positions and process parameters of the example dither operation shown in FIGS. 15 and 16. In this example, Taod=Tcmd=1 μsec. An initial trench is cut with one dither table (Nd=5, Td=5 μsec). Dosage (Kd) is varied at the start of the cut. The bank parameter (Kb) is modified during the arc to normalize fluence on the inside and outside edges of the curve.

The trench in this example includes a transition segment 1510 where the trench width begins to increase. In this example, the transition segment 1510 includes the thirteenth and the fourteenth dither rows. In other embodiments, however, a different number of dither rows may be used (e.g., four, five, six, or more dither rows may be used in the transition region). Initially (e.g., beginning at the thirteenth row) a larger dither table (Nd=7) is compressed (Kw <1) to match the previous segment. Kw then increases over two dither rows, up to Kw=1 (full width). In other words, as shown in FIG. 17, Kw=0.76 in the thirteenth dither row, Kw=0.87 in the fourteenth dither row, and Kw=1 in the fifteenth dither row.

Dosage (Kd) is also modified as the width parameter changes. When the dither spacing is compressed (e.g., the start of the new dither table begins at the thirteenth dither row), dosage decreases to account for the greater pulse overlap. In other words, Kd=1.4 outside of the transition segment 1510 for Nd=7. Within the transition segment (where the dither table first changes from Nd=5 to Nd=7), however, Kd is decreased to 1.06 in the thirteenth dither row. Then, Kd is increased to 1.22 in the fourteenth dither row before increasing again to 1.4 in the fifteenth dither row.

Shape is held constant in this example, although in general it may vary in a manner similar to Kd, Kw, and Kb. For the LDA system in one embodiment, shape is ignored.

Note that process parameters (Kw, Kd, Kb, and Ks) and dither table selection (Nd) are held constant for each dither row. As noted earlier, the FPGA 1028 enforces this parameter update timing; the DSP 1026 can provide regular updates of all process parameters and allow the FPGA 1028 to apply them when appropriate.

C. AOD Coordinate Frame and Calibration

AOD beam deflection works in coordination with galvo beam deflection to produce the final work surface beam position. The calibration of AOD deflection, and its interaction with the galvo beam deflection during tertiary positioning, dithering, and rastering, is useful for maintaining local repeatability (e.g., to support intersection formation), and controlling dithered and rastered feature dimensions.

In one embodiment, the AOD subsystem 1042 and the galvo mirrors 1066, 1067 each deflect the process beam angle before it enters the scan lens 1056. Any AOD beam angle deflection is added to that of the galvos 1066, 1067, and thus the AOD deflection commands can be considered to be equivalent to galvo "raw" commands—which are "beam angle" coordinates. An AOD deflection command may be considered a "beam angle" command that is added to the "beam angle" command of the galvos 1066, 1067. In certain embodiments, this may be true only after scaling and rotating the AOD beam deflection coordinate frame to match that of the galvo coordinate frame (as described by FIG. 38), since the optics train layout may create a rotation between these two axes, and the AOD deflectors 1020, 1022 have unique scale factors.

There are second-order effects resulting from the displacement of the virtual AOD deflection pivot point from the galvo mirrors 1066, 1067. As the AODs 1020, 1022 deflect the beam, the lateral beam position shifts slightly within the lens entrance pupil, resulting in a small additional distortion. This error, expected to be sub-micron, may be ignored in certain embodiments.

This concept of the "incremental angle" applied by the AODs 1020, 1022 is useful when considering tertiary profiling, dithering, and rastering operation, with implications on the required calibrations and run-time corrections required to meet system performance objectives.

1. AOD Transformations

In certain embodiments, the command signals to the AOD subsystem 1042 are derived through coordinate transforms that are specific to the type of AOD processing. The following discussion references several coordinate systems. "Ideal" coordinates are calibrated worksurface coordinates. These may be defined by a glass grid calibration of the XY stage. The terms "desired" or "nominal" may be used herein in place of "Ideal". "Raw Galvo" coordinates are used to command the galvo servo loop. "Raw AOD" coordinates are used to command the AOD channels.

The following transforms are referenced herein: TMframe, TMfield, TMdither, and TMaod. TMframe transforms Raw Galvo coordinates to Raw AOD coordinates. The AOD commands formed by applying TMframe to a set of incremental raw galvo coordinates (deviating about a nominal galvo position) create an AOD beam deflection that is optically identical to incremental galvo deflection about this nominal position. Thus the AOD becomes a "virtual galvo" after application of TMframe to Raw Galvo commands. This transformation is fixed for a given optics layout, and does not change with glass grid calibrations. This transformation is calculated through the AOD Position Calibration routine.

TMfield is a local scan field distortion transformation. It transforms a set of incremental Ideal (or desired) coordinates (deviating about some nominal position in the scan field) into incremental Raw Galvo coordinates. Both a "forward" (Ideal to Raw Galvo) and "reverse" (Raw Galvo to Ideal) are used. This transformation is a function of scan field position. It varies with a glass grid calibration, since this calibration defines the Ideal coordinate frame. TMfield may be calculated from galvo calibration data.

TMdither is a set of transform terms that is passed from the SCC 1010 to the DSP 1026 for use in calculating TMaod during vector processing. TMdither is calculated by the SCC 1010 for each vector or skive process segment, and is a function of scan field position and beam velocity.

TMaod is a transformation that rotates and scales the Ideal AOD data stored in dither/raster tables inside the FPGA 1028. In vector or skive processing, this keeps the Ideal dither vector perpendicular to the Ideal trajectory vector. In raster processing, this scales and aligns two-dimensional raster data as required for intersection processing or general raster pattern formation. During vector or skive processing, this transformation is calculated in real-time by the DSP, based on the beam trajectory velocity vector and the TMdither transform. The TMaod transform is calculated once by the SCC 1010 during raster processing.

2. Scan Lens Field Distortion

The concerns about coordinate frames and calibration equations stem from the field distortion resulting from the scan lens 1056 and galvo mirror beam delivery system. In an ideal scan lens, the angle of the incoming beam is deflected to produce spot displacement at the work surface. For a well-designed telecentric scan lens (an "F-$\theta$" lens), if the beam pivots about the center of the lens entrance pupil, the spot displacement is proportional to beam angle, and no calibration is required. However, the physical constraints of packaging galvo mirrors 1066, 1067 at the entrance pupil prevent the beam from pivoting exactly about the ideal point; some beam translation occurs during beam deflection. This creates a scan field distortion pattern, as shown in FIG. 18.

Figure 18:
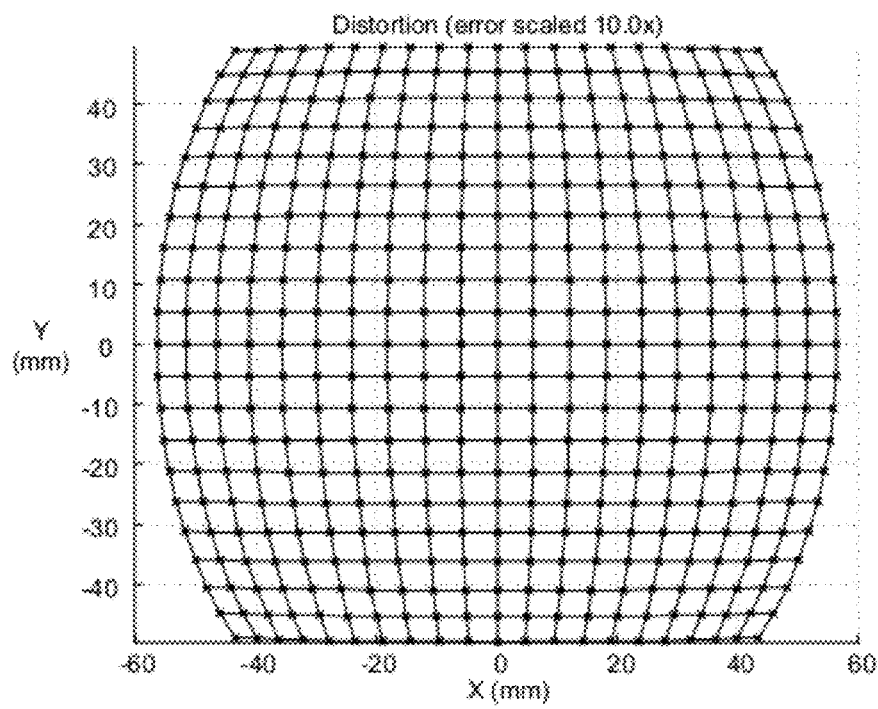
FIG. 18 graphically illustrates a scan field distortion pattern in an example embodiment wherein the LDA system includes an F/18 100 mm scan field lens.

FIG. 18 graphically illustrates a scan field distortion pattern in an example embodiment wherein the LDA system includes an F/18 100 mm scan field lens. In a typical laser processing system, this distortion pattern is mapped such that correction terms may be applied to the beam positioner, resulting in a (nominally) undistorted pattern at the work surface. The outputs of such a calibration transform are commands in the "raw" coordinate frame of the beam positioner—equivalent to mirror angle commands in the case of galvos 1066, 1067. Within the LDA galvo controller subsystem, a nominal scale factor (e.g., 2*lens focal length) is applied, resulting in raw commands in units of work surface μm. In embodiments that use an FSM positioning system, an FSM located at an entrance pupil of the scan field lens would have relatively little distortion to be corrected, as compared to that of galvos.

Note that the actual field distortion measured on a system is a combination of geometrical distortion in the optics train (galvo block+scan lens) and galvo positioner error (offset, scale factor, nonlinearity). The optics field distortion terms are common to both galvo and AOD deflection, and the same correction terms can be applied. However, any calibration error in the galvos 1066, 1067 themselves (angle-dependent linearity error and scale factor (SF) drift) are also included in scan field calibration terms, and create a calibration error when applied to AOD deflection. However, this galvo error is small, with scale factor (SF) nonlinearity error and temperature drift of <0.1%, which may result in a mismatch between the galvo and AOD deflection of <0.1 μm for a tertiary AOD deflection of 100 μm. However, the nominal scale factor tolerance on galvos 1066, 1067 may be large (e.g., 20%), which impacts the calibration procedure, as described below.

Figure 19:
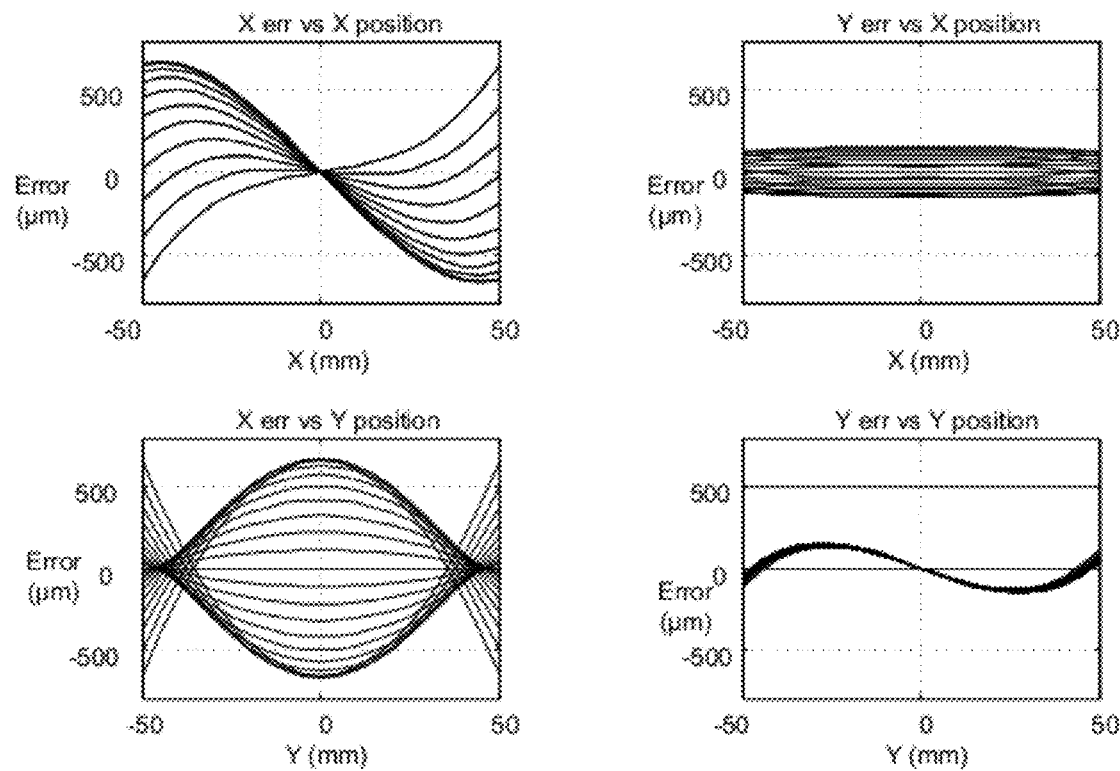
FIG. 19 graphically illustrates X and Y scan field distortion error vs. X and Y field position according to an example embodiment.
Figure 20:
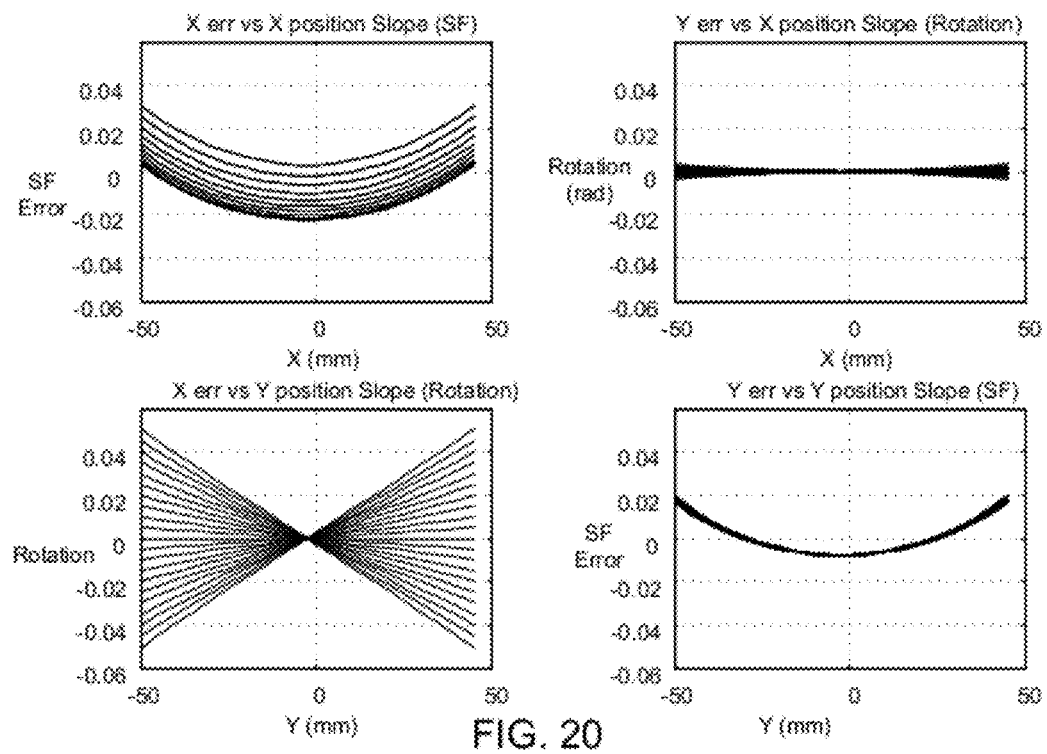
FIG. 20 graphically illustrates X and Y scan field distortion scale factor and rotation error vs. X and Y field position according to the example embodiment shown in FIG. 19.
Figure 21:
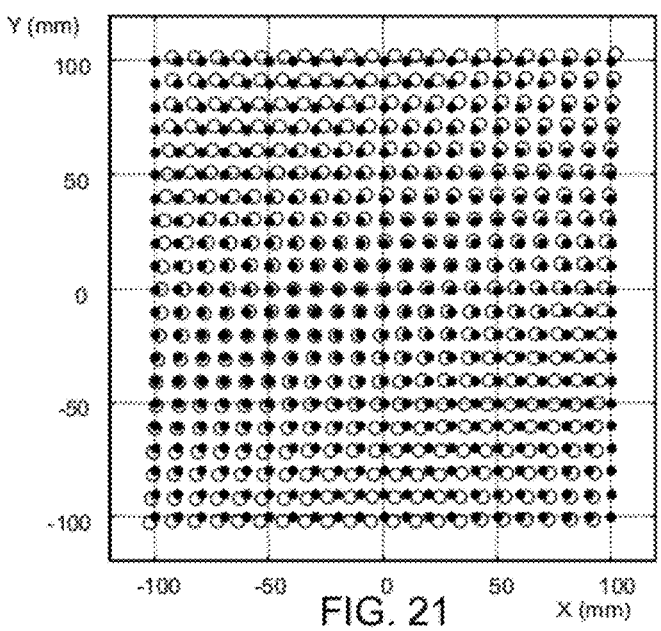
FIG. 21 graphically illustrates an example local position geometry correction distortion of a rastered feature according to the examples shown in FIGS. 19 and 20.

The scan field distortion pattern produces local distortion that varies as a function of scan field position. For example, FIG. 19 graphically illustrates X and Y scan field distortion error (err) vs. X and Y field position according to an example embodiment. FIG. 20 graphically illustrates X and Y scan field distortion scale factor (SF) and rotation error vs. X and Y field position according to the example embodiment shown in FIG. 19. FIG. 21 graphically illustrates an example local position geometry correction (PGC) distortion of a rastered feature according to the examples shown in FIGS. 19 and 20. The slope of X and Y errors as a function of XY field position can be treated as local scale factor and rotation error, e.g., PGC distortion terms. If these errors are large enough, the local PGC distortion may create unacceptable error in a raster pattern. For example, consider a 200×200 μm raster pattern located in the (−50 mm, −50 mm) field position. The local PGC distortion (taken from FIG. 20) would produce the distorted pattern shown in FIG. 21. The X error reaches 5 μm at the pattern corners due to the large rotation error, which may be large enough to produce unacceptable depth variation in an intersection formation.

The scan field distortion pattern impacts the LDA beam positioner in at least three ways: during all modes, when tertiary profiling defines AOD and galvo commands to produce a nominal beam trajectory; during vector or skive modes, when the AOD dither commands are scaled and rotated; and during raster mode, when potentially large raster areas may be distorted.

3. AOD Calibration Correction During Tertiary Profiling

Figure 22:
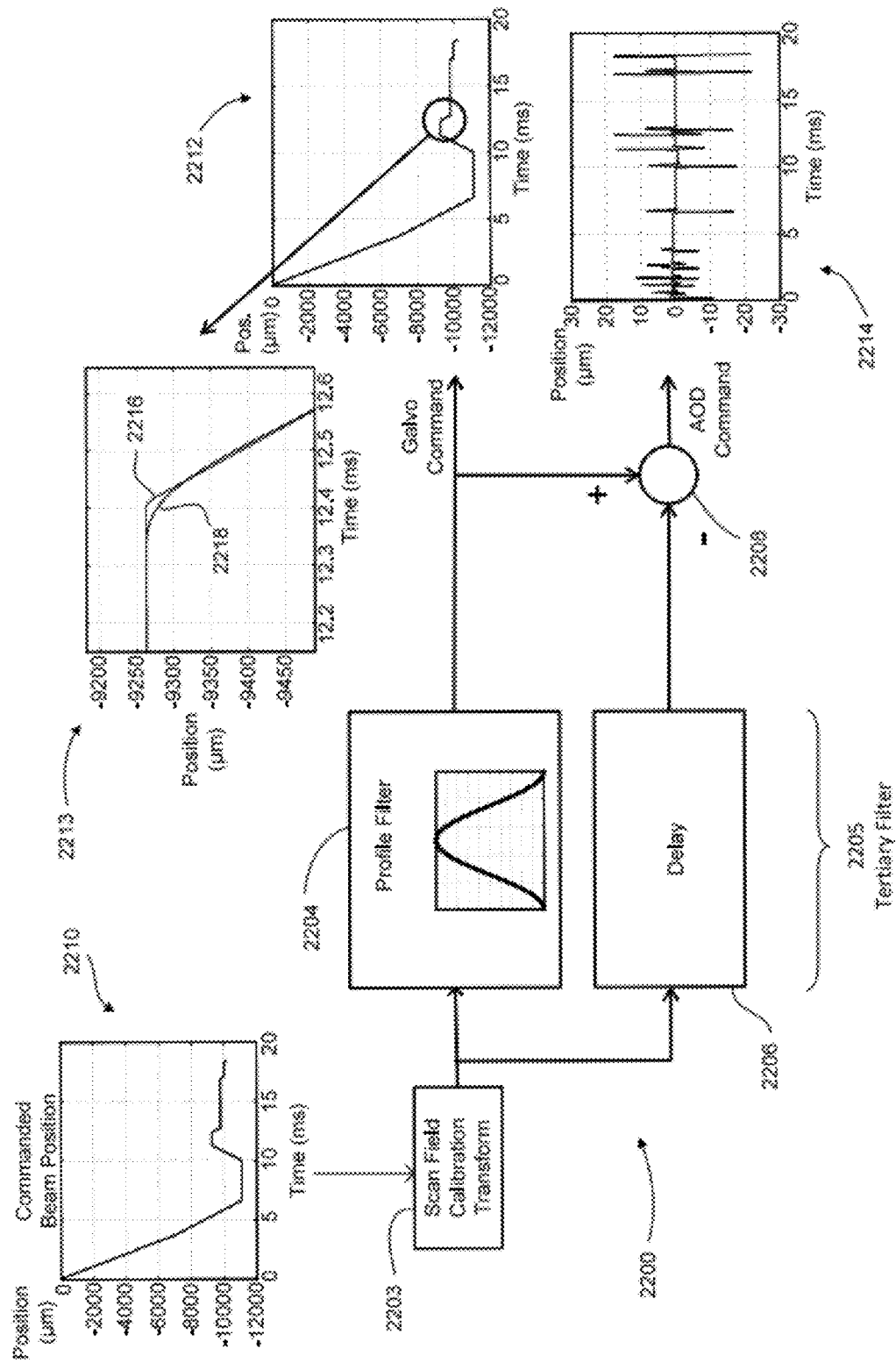
FIG. 22 schematically illustrates a tertiary profiling subsystem according to one embodiment.

FIG. 22 schematically illustrates a tertiary profiling subsystem 2200 according to one embodiment. In tertiary profiling, beam positioning is split between the galvo subsystem 1044 and the AOD subsystem 1042. Tertiary profiling refers to using the AOD subsystem 1042 as a tertiary positioner (e.g., in addition to XY stages and the galvo subsystem 1044). An example laser beam tertiary positioner is described in U.S. Pat. No. 6,706,999, which is assigned to the assignee of the present disclosure, and which is hereby incorporated by reference herein in its entirety. Tertiary profiling using the AOD subsystem 1042, as disclosed herein, allows for profiling the beam path at high speed (e.g., using updates at about 1 μs to provide timing resolution) wherein AOD commands are issued on discrete timing boundaries. The tertiary profiling subsystem 2200 includes a profiling filter 2204, delay element 2206, and a subtractor 2208.

FIG. 22 illustrates an example beam profile 2210 (which may also be referred to herein as an example "beam command") corresponding to a trench that is desired to be cut into a workpiece. The example beam profile 2210 includes sharp turns that may be difficult to track at high velocities using the galvo subsystem 1044. After passing through a scan field calibration transform 2203, the example beam profile 2210 is provided to a tertiary filter 2205, which includes the profiling filter 2204 and the delay element 2206. The profiling filter 2204 comprises a low-pass filter that filters out high frequency content that may be difficult for the galvo subsystem 1044 to track. The output of the profiling filter 2204 may be used as a galvo command (galvo control signal), as shown by position profile 2212. FIG. 22 illustrates an enlarged portion 2213 of the position profile 2212, which shows a commanded position 2216 with respect to an actual position 2218 provided by the galvo subsystem 1044. The AOD subsystem 1042 is used to correct for the difference between the commanded position 2216 and the actual position 2218.

In one embodiment, the profiling filter 2204 comprises an infinite impulse response (IIR) filter. In another embodiment, the profiling filter 2204 comprises a finite impulse response (FIR) filter. FIR filters naturally have a constant delay for signals in any frequency range. An artisan will recognize from the disclosure herein, however, that other types of filters may also be used. The delay element 2206 delays the example beam profile 2210 by approximately the same amount of delay introduced by the profiling filter 2204. The subtractor 2208 subtracts the output of the profiling filter 2204 from the output of the delay element 2206 to get the high frequency content that was removed from the galvo command. The high frequency content output by the subtractor 2208 may then be used as an AOD command signal for controlling the AOD subsystem 1042. FIG. 22 illustrates an example AOD position command profile 2214. Although not shown, differentials may be used on the position command profile 2214 to calculate corresponding velocity and acceleration command profiles.

The example beam command 2210 is the desired trajectory of the beam on the work surface, after application of panel alignment transforms, in "desired" coordinates. As discussed above, the example beam profile 2210 is provided (as a commanded beam position signal) to the scan field calibration transform 2203. The data is filtered to split the trajectory into low- and high-frequency components, allowing the AOD subsystem 1042 to track high-frequency, low-amplitude commands, and passing bandwidth-limited, large-amplitude commands to the galvo subsystem 1044. Applying the scan field calibration transform 2203 produces "raw galvo" coordinates. Since this occurs before commands are split by the tertiary filter 2205, the outputs of the tertiary filter 2205 are galvo and AOD components, each of which are in the same raw galvo coordinates.

If the AOD subsystem 1042 is calibrated to deflect the beam in the raw galvo coordinate frame, no further scan field calibration transform is required for the AOD tertiary displacement. This is useful, since it implies that a local AOD field distortion correction is not required. In other words, the scan field distortion effects are already accounted for when the scan field calibration transform 2203 is applied.

Another interpretation of this approach is that the tertiary profiling filter displaces the galvo command away from the desired command, in raw galvo coordinates. The AOD subsystem 1042 simply provides a compensating displacement to make up this galvo beam angle displacement.

The AOD command outputs, in "raw galvo" coordinates, is then transformed (scale and rotation) to produce the "raw AOD" deflection commands. This transform is referred to as the "TMtert" transform.

The TMtert transform is kept separate from the TMaod transform (shown in FIG. 11) used to modify dithering, for at least two reasons. First, the scaling inside TMtert cannot be used during dithering, since it corrects for both AOD and galvo SF, and thus does not apply to the dithering process, which is independent of galvo motion. Second, the rotation term in TMtert is fixed and independent of the velocity vector angle, as opposed to the TMaod dither transform (applied inside the FPGA 1028) which varies with the trajectory angle. Thus the TMtert transform is applied to AOD trajectory data before its transmission to the FPGA 1028, and this data is not further affected by TMaod.

Applying the TMtert transformation to "raw galvo" coordinates also provides the opportunity to add AOD error correction terms to the tertiary AOD data. This is convenient, since the galvo controller error (which is filtered to produce AOD error correction data) is in raw galvo coordinates.

Figure 51:
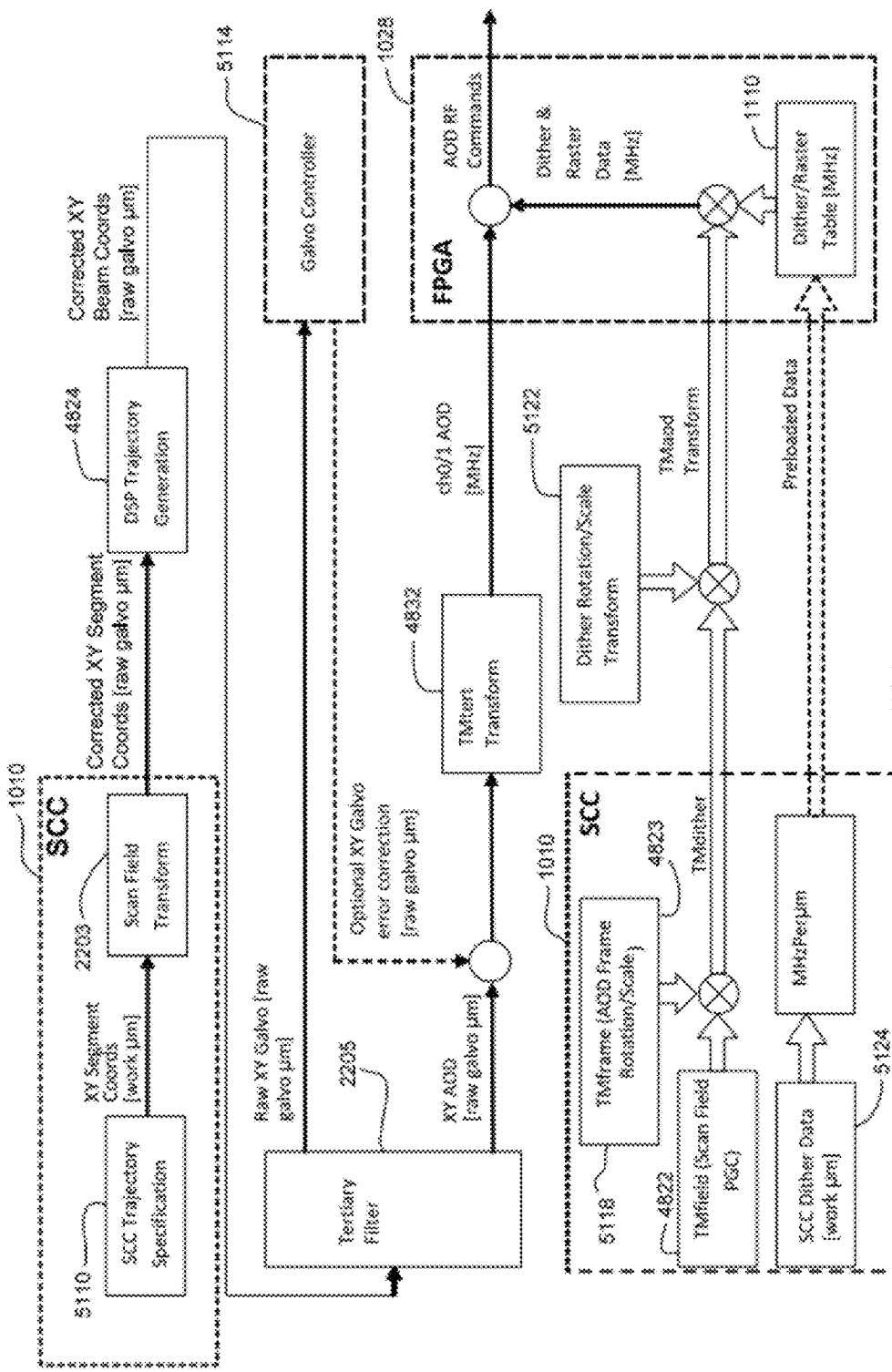
FIG. 51 is a block diagram of illustrating galvo and AOD calibration data flow 5100 according to one embodiment.

The resulting calibration data flow is outlined in FIG. 51.

The above discussion applies only to the processing of the beam center trajectory position supplied to the tertiary filter algorithm. Calibration effects on dithering and rastering are slightly different, as described below.

4. AOD Calibration Correction During Raster Patterning

As noted above, the local scan field PGC distortion may be large enough to require a local calibration correction for raster patterns as a function of field position. Note that this case differs from that of tertiary profiling described above, because the AOD deflection is not performed in place of a pre-compensated galvo deflection (which implies pre-compensation of the AOD deflection command); rather, only the center point of the raster pattern is compensated for field distortion. The AOD deflection used to process the raster pattern is not compensated.

The local PGC correction is derived from the scan field calibration transform, and can be transmitted from the SCC 1010 to the DSP 1026 during or before raster processing. The local PGC transformation is combined with other AOD transformations for dither angle and AOD coordinate frame rotation, as described later under "Vector Process Summary".

5. AOD Calibration Correction During Dithering

In the case of dithering, the local PGC distortions of the AOD field can affect width and rotation of the dither vector. Since the beam is dithered across the width of the trench, the cross-axis ("rotation") distortion error components produce a deflection in the on-axis direction (along the trench), and have a negligible effect on width (e.g., a cosine error of <0.2%). PGC scaling error in the cross-axis directly affects trench width by about 2% to about 3%.

However, a very wide trench may have its endpoints shifted by the rotational distortion, as in a large raster pattern. Since this can affect an intersection for a wide trench, a PGC correction is appropriate for dithering. The distortion terms are transmitted from the SCC 1010 to the DSP 1026 every process segment, and can be represented by eight (8) bits, providing a 12.5% error range and 0.1% resolution after scaling by $1/1024$.

6. AOD Calibration Procedure

Figure 23:
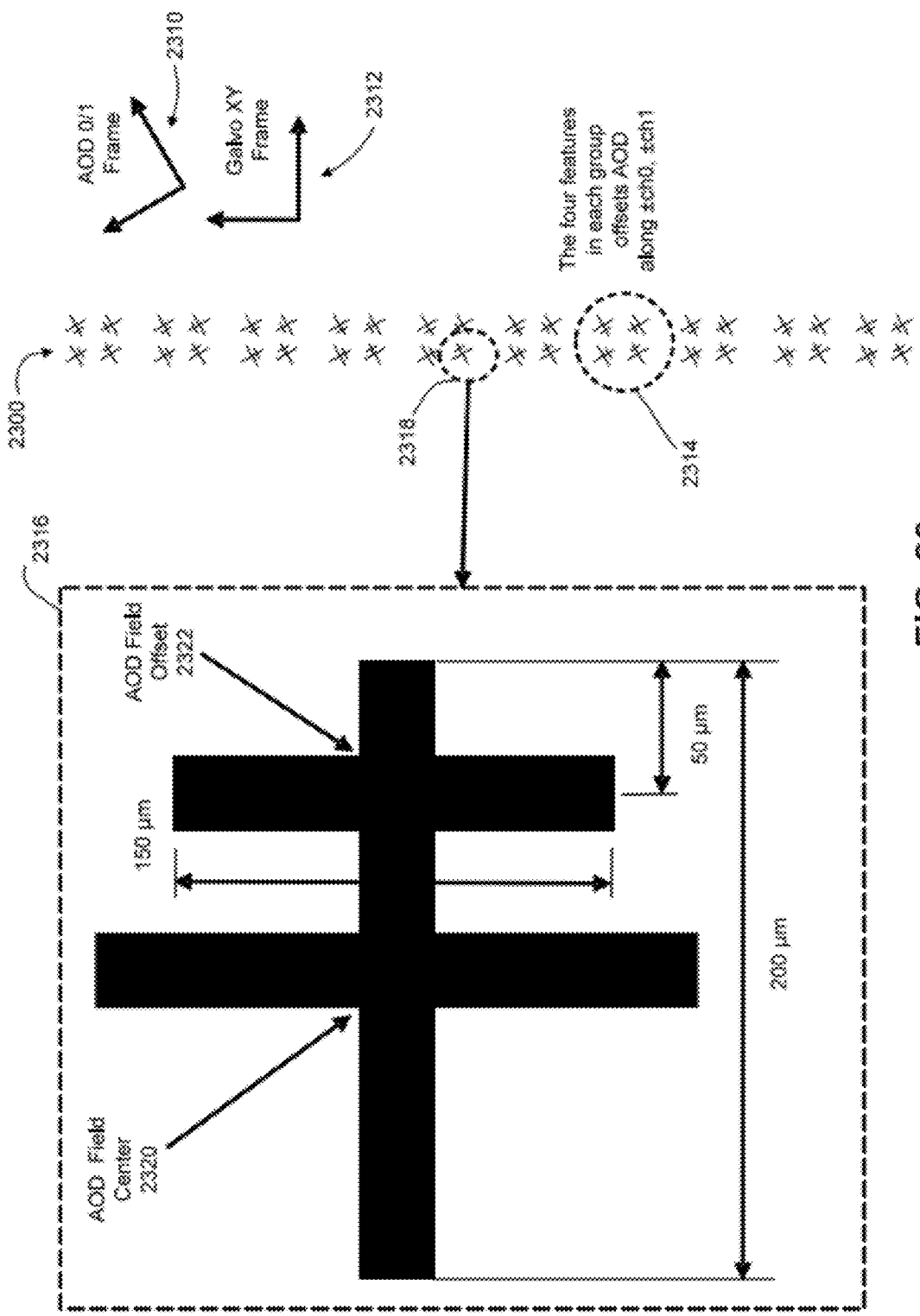
FIG. 23 schematically illustrates AOD calibration patterns according to one embodiment.

FIG. 23 schematically illustrates AOD calibration patterns according to one embodiment. The following procedure calibrates the AOD frame rotation 2310 relative to the galvo frame 2312, and AOD scale factors. The calibration for the TMtert transform is performed near the center of the scan field, where the scan field distortion is negligible. Note that rotation of the galvo frame 2312 may not be a concern for both dithering and rastering. As long as the AOD frame 2310 is orthogonal and aligned to the galvo frame 2312, dithering and rastering are properly aligned, since these operations are relative to the galvo frame 2312.

The procedure includes setting the TMtert transform to the default (identity matrix*nominal SF), and moving the X stage to its center of travel. Then, the FPGA 1028 is loaded with four crosshair raster patterns 2314. For purposes of discussion, FIG. 23 shows an enlarged (and rotated) version 2316 of one of the crosshair raster patterns 2318. Each pattern includes a central crosshair 2320 (zero AOD displacement), and a crosshair 2322 displaced in one of the AOD axes (+ch0, −ch0, +ch1, −ch1). Note that these displacements are in the raw AOD coordinate frame (ch0,1) rather than workpiece or galvo frames (XY). The procedure includes scaling the group of four crosshair calibration patterns 2314 and/or each individual pattern 2318 with the process spot size, which can change depending on the system setup. The process spot size is a system configuration parameter.

The procedure also includes cutting each of the four patterns 2314 in a grid pattern centered about the scan field center. For each pattern, the galvo is moved to the pattern's respective location, and settled (e.g., for 1 ms) before rastering. In an example embodiment, all patterns may fall within a 1 mm square from the scan field center. The procedure repeats the step of cutting each of the four patterns 2314 a predetermined number of times, moving the Y linear stage to displace the patterns. For example, as shown in FIG. 23, the four patterns 2314 may be cut ten times (or another predetermined number of times depending on the particular embodiment). The procedure includes collecting data to locate the displaced AOD crosshairs 2322 relative to their corresponding zero-displacement crosshair 2320. Then, the procedure averages the (e.g., ten) data sets, and calculates AOD scale factor (AOD MHz per micron) and rotation relative to the galvo coordinate frame 2312. Note that the four center crosshairs (zero AOD displacement) provide information on galvo rotation. The rotation of the AOD axes should be calculated relative to the angle of the galvo axes. The procedure may also include verifying that galvo pattern rotation is less than about 1% as a check for the optical setup.

i. Scale Factor Separation and TMtert Formation

The AOD calibration procedure produces two scale factors (SF):

MHzPerRawμm: [$AOD$ MHz]/[raw galvo μm],

MHzPerμm: [$AOD$ MHz]/[μm].

The first SF (MHzPerRawμm), with X and Y components, composes the scaling terms in the TMtert transform. As explained above, tertiary profiling produces AOD commands in raw galvo coordinates in order to coordinate with the galvo subsystem 1044 during tertiary positioning. Thus, this SF represents the combination of AOD and galvo SF terms.

The second AOD SF (MHzPerμm) converts SCC dither (or raster) table data (specified in units of XY worksurface μm) to AOD units (MHz) before the data is downloaded to the FPGA 1028.

The results of the AOD calibration produce MHzPerμm. To generate MHzPerRawμm, the galvo scale factor data embedded in the galvo calibration is applied. The galvo SF terms (RawμmPerμm=[raw galvo μm]/[μm]) can be extracted from the XY scale factors of the galvo calibration data, evaluated at the center of the scan field where field distortion is negligible. Then for each of the XY components:

MHzPerRawμm[$X, Y$]=MHzPerμm/RawμmPerμm[$X, Y$].

Figure 24:
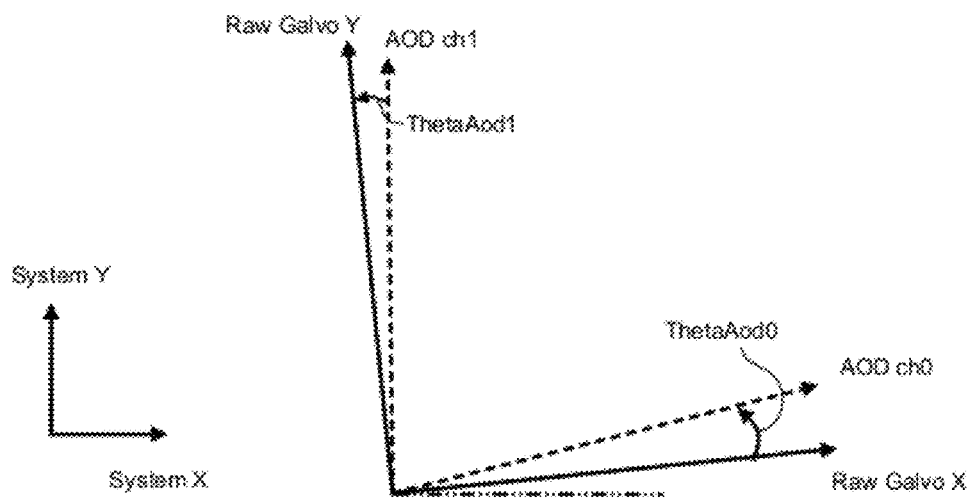
FIG. 24 graphically illustrates AOD calibration angles according to certain embodiments.

To form the TMtert transform, the rotation of the AOD frame relative to the galvo frame is combined with the scale factors determined above. The AOD frame rotation may be non-orthogonal due to mechanical tolerances in the AODs 1020, 1022 and mounts; thus two separate rotations terms are included. FIG. 24 graphically illustrates AOD calibration angles according to certain embodiments. The rotation transform for the AOD frame (TMframe) may be defined as $$TMframe = \begin{bmatrix} K0*\cos(ThetaAod0) & -K1*\sin(ThetaAod1) \\ K0*\sin(ThetaAod0) & K1*\cos(ThetaAod1) \end{bmatrix}^{-1},$$

$$TMframe = \begin{bmatrix} \cos(ThetaAod1)/K0 & \sin(ThetaAod1)/K0 \\ -\sin(ThetaAod0)/K1 & \cos(ThetaAod0)/K1 \end{bmatrix} / \cos\left(\begin{array}{c} ThetaAod0 - \\ ThetaAod1 \end{array}\right),$$

where

ThetaAod0=the angle between the ch0 and X galvo axis,
ThetaAod1=the angle between the ch1 and Y galvo axis,
K0=magnitude scaling of AOD ch0 vs worksurface (μmAOD0/μm), and K1=magnitude scaling of AOD ch1 vs worksurface (μmAOD1/μm).
as illustrated in FIG. 24.

In FIG. 24, angles and scaling are evaluated at the center of the scan field. TMframe is meant to align the AOD coordinate frame to the galvo coordinate frame. The TMfield transform corrects for scan field distortions and nominal galvo alignment, including any sign flips of the galvo axes. To avoid confusion, in certain embodiments, any sign flips in the AOD axes are accounted for by the rotation angles (additional 180° rotation), and not by the K0/1 scaling factors. K0 and K1 do not include the MHzPerμm scaling factor. This scaling is applied when loading dither (or raster) tables, or (for profiling) is included in the TMtert transform. Rather, K0 and K1 represent possible scaling variations between AOD0 and AOD1 after applying the nominal MHzPerμm scale factor. In certain embodiments, K0 and K1 are expected to equal 1.0.

Then TMtert, the transformation applied during tertiary profiling, is given by $$TMtert = TMframe * \begin{bmatrix} |MHzPerRawUmX| & 0 \\ 0 & |MHzPerRawUmY| \end{bmatrix}.$$

Here, the MHzPerRawμm[X,Y] scaling terms should include only magnitude scaling; signs are accounted for in the rotation terms of TMframe.

TMtert is used in run-time calculations, applied to the AOD command outputs from the tertiary filter:

$$\begin{bmatrix} AODch0 \\ AODch1 \end{bmatrix} = TMtert * \begin{bmatrix} AODx \\ AODy \end{bmatrix}.$$

Note that the definition of TMtert implies a scale factor correction followed by a rotation. Thus, when evaluating the AOD calibration data, the TMframe transform is first applied to rotate the AOD data into alignment with the galvo frame, before evaluating the AOD deflections to calculate MHzPerRawμm[X,Y].

D. Power Control

Power control is used in the LDA system to maintain consistent laser power during dithering and during velocity changes. Power control includes linearization of the AOD power attenuation, and calibration of the linearized AOD power control to work surface power.

1. AOD Power Linearization

Figure 25:
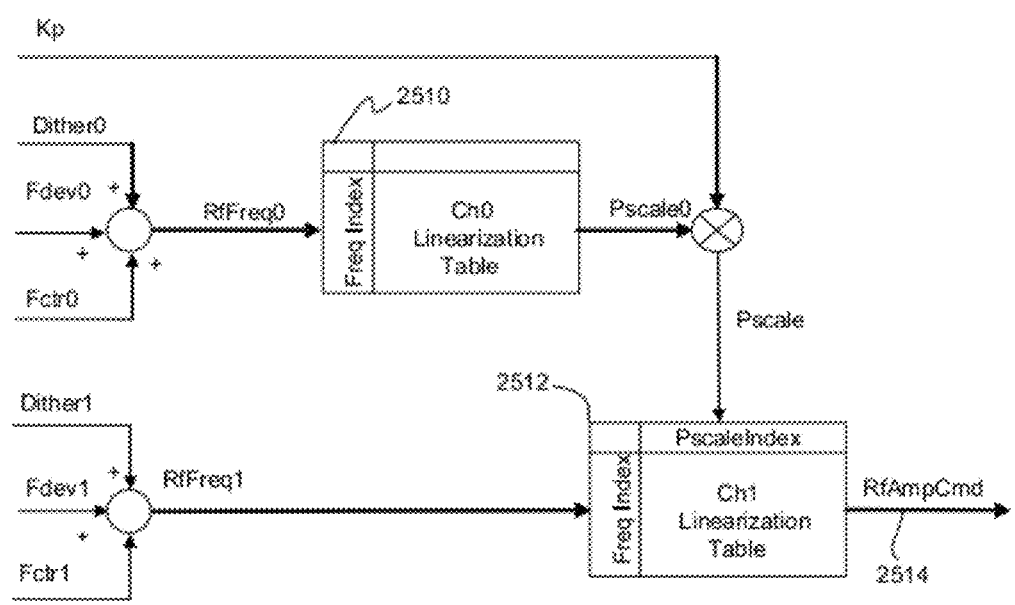
FIG. 25 is a block diagram illustrating the signal flow for power control according to one embodiment.

FIG. 25 is a block diagram illustrating the signal flow for power control according to one embodiment. Two linearization tables 2510, 2512 are used to generate the ch1 RF signal amplitude command 2514 to linearize the optical output power as a function of applied RF signal frequencies and desired optical output power.

For each of the two AOD cells 1020, 1022 (ch0 and ch1), dither (e.g., Dither0 or Dither1) is added to the frequency deviation (beam trajectory) command (Fdev0 or Fdev1) and nominal center frequency (Fctr0 or Fctr1) to generate the total frequency command (RfFreq0 or RfFreq1). The ch0 frequency command RfFreq0 indexes into the ch0 linearization table 2510, producing the Pscale0 power scaling command. The Pscale0 power scaling command represents the optical output power scaling factor that is used to keep the ch0 optical output power linearized as a function of frequency. The linearization table 2510 is one-dimensional function of ch0 frequency only.

Pscale0 is multiplied by the system power command scale factor Kp (commanded by the DSP 1026), resulting in a total power scale factor Pscale. This command, along with the ch1 frequency command RfFreq1, indexes into a two-dimensional lookup table 2512 to produce RfAmpCmd 2514, the ch1 RF signal amplitude command. Note that the RF signal amplitude for ch0 is held constant. In other words, all output power control in this example embodiment is performed through the RF signal amplitude modulation of ch1.

i. Linearization Tables

Figure 26:
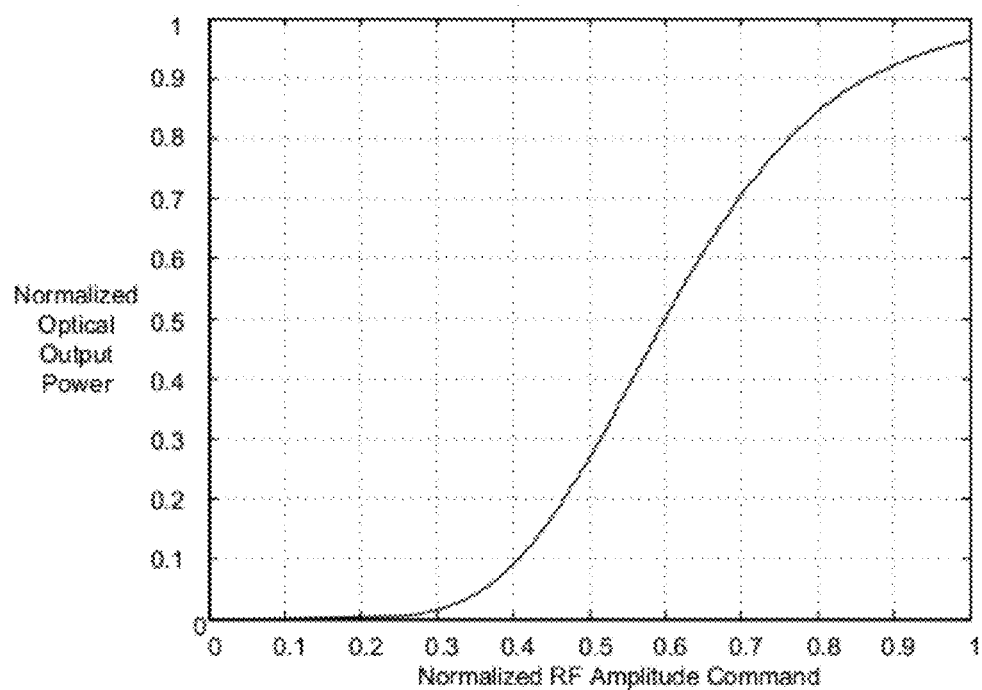
FIG. 26 graphically illustrates an example power control curve according to one embodiment.

The AODs 1020, 1022 control optical power by varying the RF signal power level applied to the AOD cells. FIG. 26 graphically illustrates an example power control curve (normalized optical output power vs. normalized RF signal power) according to one embodiment. Note that FIG. 26 illustrates the optical power output resulting from an RF amplitude command.

In certain embodiments, the nonlinear curve shown in FIG. 26 is mapped to produce a lookup table that converts a desired normalized output power (from 0 to 1, 1 being maximum output power) to the AOD RF signal power required to achieve this output. This can be considered as a flip of the X and Y axes of FIG. 26: given a desired optical power, determine the required RF amplitude command.

Figure 27:
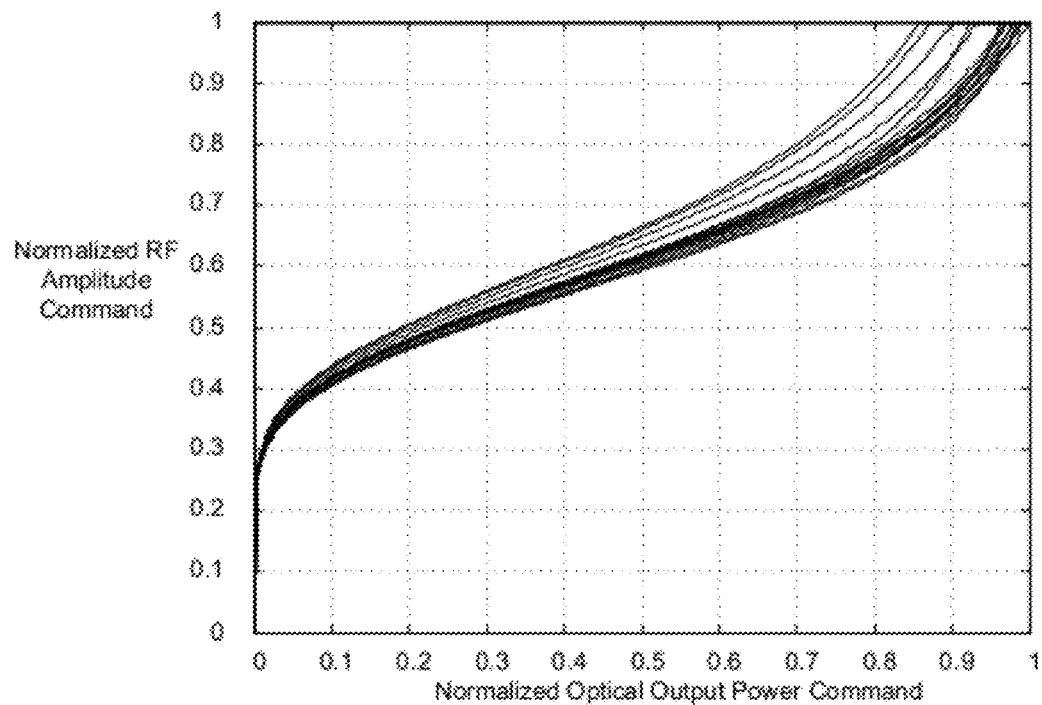
FIG. 27 graphically illustrates an example ch1 AOD power linearization curve set according to one embodiment.

The resulting linearization curve is shown in FIG. 27. FIG. 27 graphically illustrates an example ch1 AOD power linearization curve set according to one embodiment. Note that the power control curve shown in FIG. 26 represents the AOD behavior at a single RF signal frequency. In reality, this curve varies with the RF signal frequency applied to the AOD cell 1020, 1022. Thus, the nonlinear mapping is repeated for several RF signal frequencies over the operating frequency range of the AOD subsystem 1042. FIG. 27 shows the set of linearization curves.

The ch1 linearization table generates the RF amplitude command required to produce the requested optical output power scaling. The RF signal amplitude output influences the optical output power, but does not directly set the output power.

Figure 28:
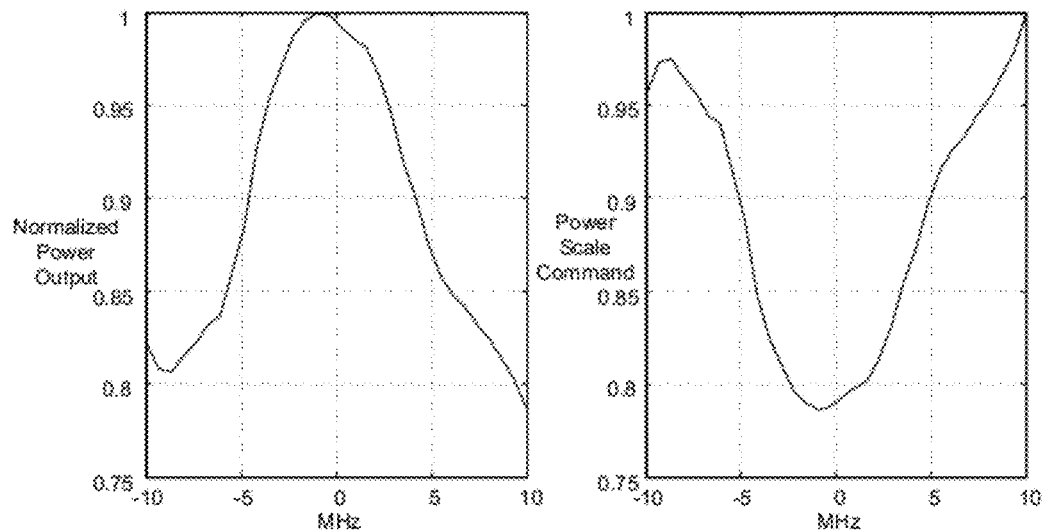
FIG. 28 illustrates an example curve for ch0 AOD according to one embodiment.

In contrast to the ch1 table, the ch0 table generates the Pscale0 power scale factor (rather than an RF amplitude command). Pscale0 linearizes the ch0 response as a function of ch0 RF signal frequency. The ch0 RF signal amplitude is held constant and is not used in the linearization table. FIG. 28 illustrates an example curve for ch0 AOD according to one embodiment. FIG. 28 shows the variation in ch0 optical efficiency vs RF signal frequency (left plot), resulting in the required power scaling for linearization (right plot).

As shown in FIG. 28, the AODs 1020, 1022 are linearized over their frequency range by reducing the amplitude command as a function of frequency such that the output power at any frequency equals the power at the lowest-efficiency frequency. Thus, linearization reduces the effective optical efficiency of the AOD subsystem 1042, and the operating frequency range of the AODs 1020, 1022 has an impact on the subsystem's optical efficiency.

ii. High-Power Mode: Efficiency Gain

The power linearization procedure described above can provide a fully power-linearized AOD subsystem 1042 over the entire operating RF signal frequency range, at a decreased optical efficiency equal to the product of the worst-case optical efficiency in ch0 and ch1. The AOD subsystem 1042 can be conservatively operated in this mode, with properly linearized power and no RF amplitude command saturation.

However, significant optical efficiency gains can be realized by calculating the actual AOD subsystem 1042 optical efficiency as a function of the ch0 and ch1 RF signal frequency range (or, equivalently, the AOD XY deflection range). This allows the AOD subsystem 1042 to be operated in a range narrower than the full power calibration range at higher power levels, without saturating the RF amplitude command, since the higher optical efficiency requires lower RF amplitude commands. Or, equivalently, this approach allows the AODs 1020, 1022 to be power-calibrated over a frequency range much larger than normal to accommodate large raster fields or very wide trenches, while not affecting normal operation in the more typical smaller deflection ranges.

In one embodiment, the optical efficiency gain is calculated by determining the minimum efficiency over a selected frequency range (for both ch0 and ch1), calculating the worst case efficiency by multiplying the two worst-case values, and repeating for several possible frequency ranges. This procedure produces a conservative curve for efficiency gain vs. frequency range, appropriate for general use and when rastering. A further improvement is possible when considering vector processing, where the AOD deflection is split between dithering and AOD transients. Dithering produces AOD deflection along a line with some angular rotation in the AOD coordinate frame. The actual AOD range used in the ch0 and ch1 deflectors depends on the dither angle (as sin and cos functions). Neither axis undergoes full deflection simultaneously. Thus, the total efficiency may be higher than the conservative estimate produced above.

However, AOD transient excursions may also be accounted for during dithering. Such AOD transient excursions may occur in either axis, depending on the beam trajectory.

Figure 29:
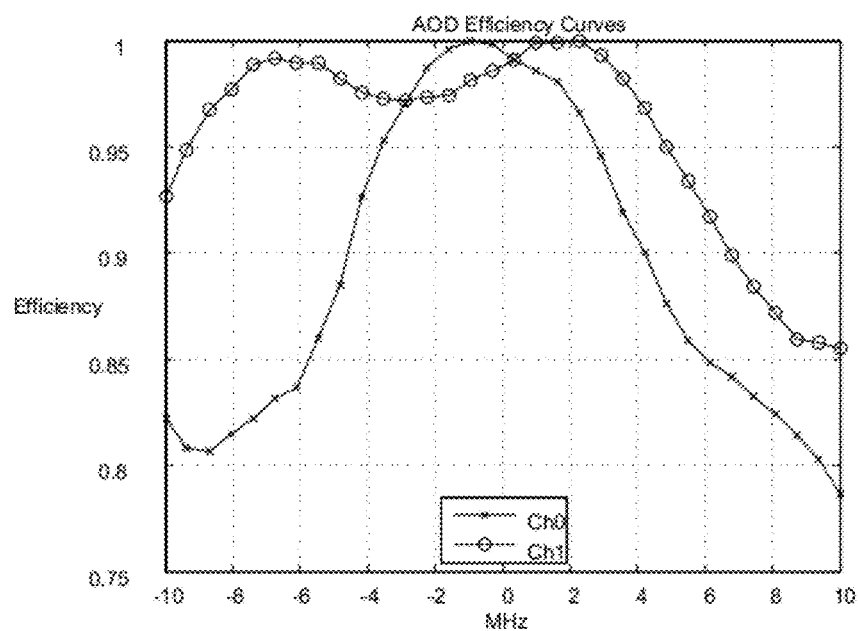
FIG. 29 is a graph illustrating example AOD efficiency curves according to certain embodiments.
Figure 30:
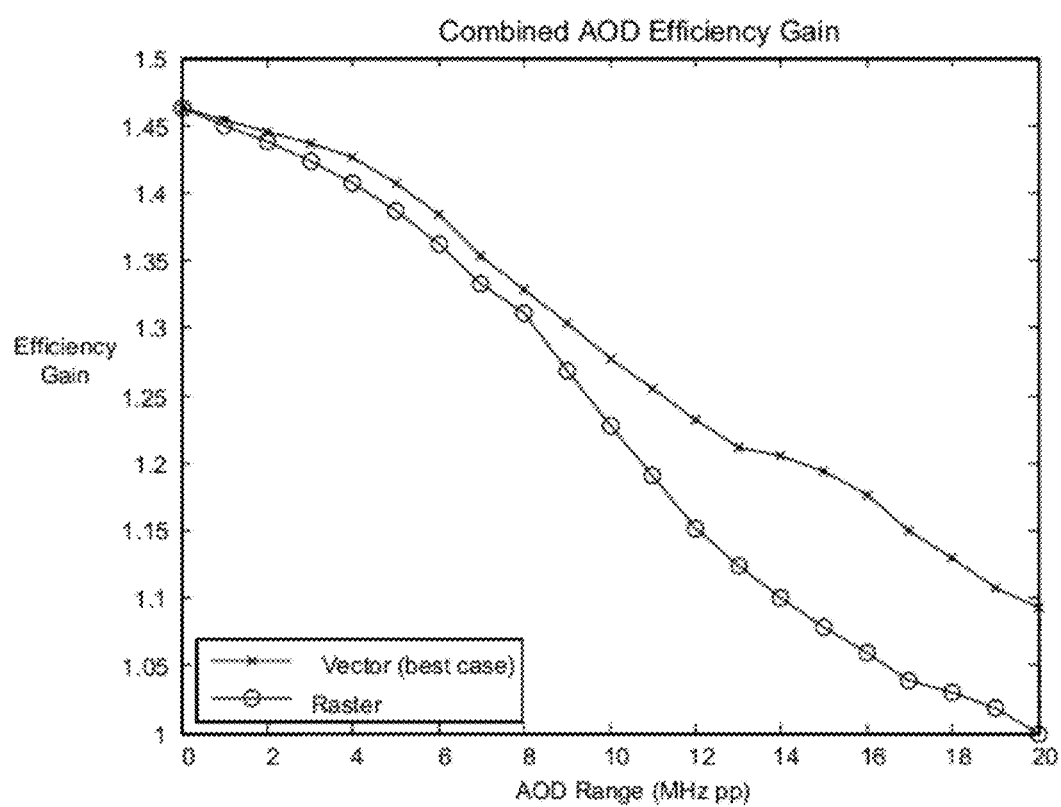
FIG. 30 is a graph illustrating example AOD efficiency gain according to certain embodiments.

FIG. 29 and FIG. 30 are graphs illustrating the results of the efficiency gain calculation. FIG. 29 is a graph illustrating example AOD efficiency curves according to certain embodiments. FIG. 30 is a graph illustrating example AOD efficiency gain according to certain embodiments. For example, FIG. 29 shows the efficiencies of two AOD cells 1020, 1022 (ch0 and ch1), while FIG. 30 shows the efficiency gain, relative to the fully linearized, unsaturated efficiency, for both raster and vector modes.

2. AOD Work Surface Power Calibration

After completion of the above linearization procedures, the linearization tables are loaded into the FPGA 1028 AOD controller. A normalized power command (Kp, ranging from 0 to 1) sent to the FPGA 1028 then results in an optical power output that may be a linear function of the commanded power amplitude, and independent of the RF frequency commands applied to the AODs 1020, 1022. In certain embodiments, linearization table quantization and calibration uncertainty produces a residual linearity error between about 1% and about 2%.

However, in certain embodiments, the scaling of the linearized power output is arbitrary. In a final power calibration step, the normalized laser power command is set to several values between 0 and 1 while a chuck power meter (CPM) measures the resulting work surface power. A linear fit determines the CPM offset and a scale factor Kpwr that converts work surface power (watts) to the normalized power command Kp sent from the DSP 1026 to the FPGA 1028 during processing.

Figure 31:
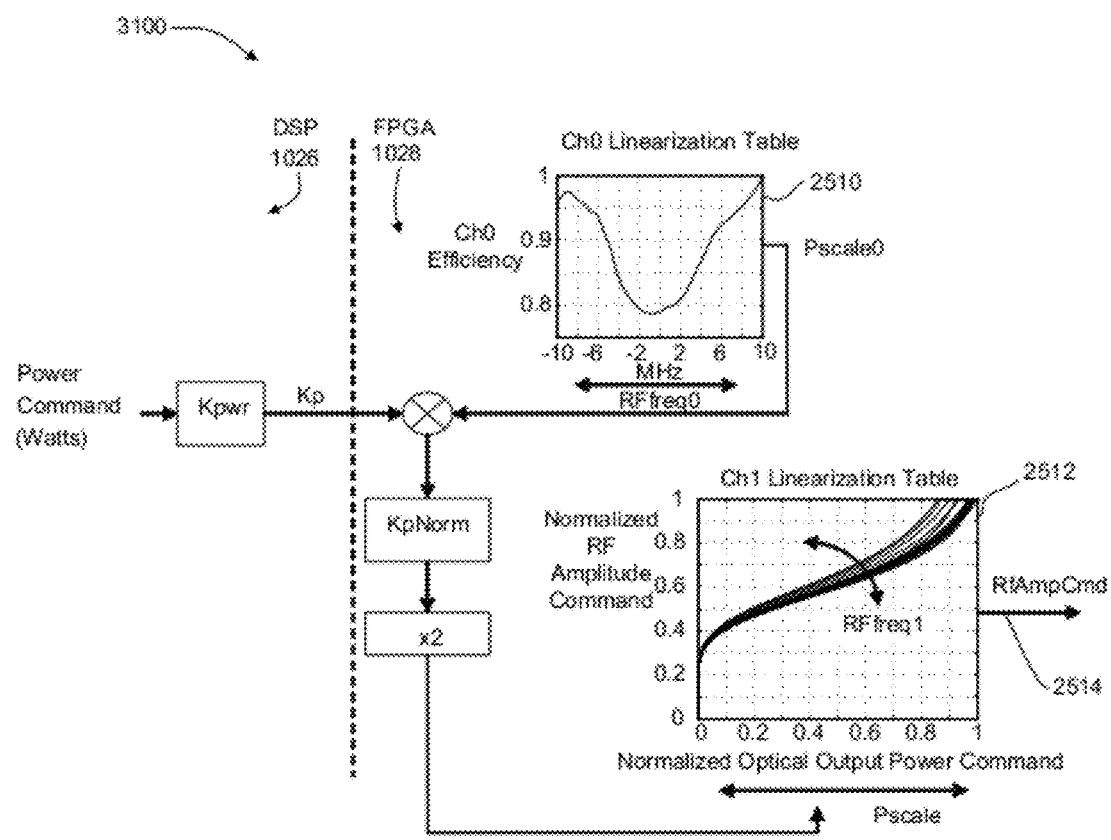
FIG. 31 is a block diagram illustrating power calibration data flow according to one embodiment.

FIG. 31 is a block diagram illustrating power calibration data flow 3100 according to one embodiment. The power control data flow 3100 shown in FIG. 31 also supports the high-power mode enabled by efficiency gain. This includes an ×2 gain inside the FPGA 1028 to amplify the fractional Kp value, enabling the use of efficiency gains greater than 1. An additional FPGA 1028 scaling factor KpNorm normalizes the Kp command, such that Kp=0.5 represents the maximum unsaturated linearized output power, and values greater than 0.5 represent higher power that may be achieved (without saturation) within reduced AOD ranges due to efficiency gain.

A method for providing worksurface power calibration, according to one embodiment, includes performing the AOD power linearization calibration. From this data, the system determines PscaleCal, the minimum ch1 efficiency. The method further includes loading linearization tables in the FPGA 1028 and setting the FPGA 1028 scale factor KpNorm to PscaleCal. Then, the method includes setting the DSP 1026 power scale factor Kpwr to 0.5 and issuing a power command equal to 1. Accounting for the internal FPGA 1028 scaling, this command limits the ch1 Pscale value to no more than PscaleCal, for any Fdev0 or Fdev1 frequency command within the power linearization calibration range. This ensures that the linearized output power is obtainable over the entire AOD frequency range without saturation. Note that Pscale may be less than PscaleCal when Pscale0 (the output of the ch0 linearization table) is less than 1, but this only occurs at ch0 frequencies with higher optical efficiency. Thus the actual optical output power would nominally remain constant over all Fdev0 frequencies. The same principle holds for the ch1 linearization output also. The method also includes recording LinPmax, the worksurface power as measured by the chuck power meter with the fully-linearized, unsaturated power command (set in the previous step). Then, set the DSP 1026 power scale factor Kpwr to 0.5/LinPmax. This normalizes the DSP 1026 power command (in watts) such that the FPGA 1028 power control produces the calibrated worksurface power. The power command (in watts) may now exceed LinPmax for AOD ranges where the efficiency gain is greater than 1. In such cases, Pscale0 and/or the ch1 linearization table entries are set to be less than 1, such that the resulting amplitude command remains unsaturated.

In summary, the following data may be stored as calibration data, and loaded to the DSP 1026 and FPGA 1028 during initialization: Ch0 linearization table; Ch1 linearization table; KpNorm; Kpwr; efficiency Gain table; and LinPmax.

E. Process Velocity Limits

For trenches, the maximum processing segment velocity is determined by several factors, including: dither timing (required spot size overlap between dither rows); AOD dynamics due to tertiary filtering; laser power available to process the trench; and data rate limits.

1. Dither Velocity Limit

A velocity limit due to dithering results from the overlap used between dither rows. In certain embodiments, the maximum position increment between dither rows is 0.35*Deff (assuming 65% overlap to provide safety margin). Thus the velocity limit to maintain this overlap is 0.35*Deff/Td=0.35*Deff/(Nd*Taod).

Dosage and width parameters are held constant over this time for each dither row, with any changes taking effect only at the start of the next dither row. Since the low-level FPGA 1028 control algorithm enforces this, the parameters calculated by the DSP 1026 and passed to the FPGA 1028 may be linearly interpolated; the dither row parameters are updated at the proper time by the FPGA 1028.

In general, the dither generation discussed above is designed such that dither updates are not a limiting factor, allowing the system to run at the limits of laser power.

2. Tertiary Filter Limit

The process of tertiary filtering, given a limited calibrated AOD field size, imposes a limit on process velocity.

During tertiary filtering, a step change in velocity between process segments produces a transient response in the AOD command. For example, FIG. 32 graphically illustrates a tertiary filter response to velocity change according to one embodiment. The magnitude of this response is proportional to the step change in velocity, and the decay time is a function of the tertiary filter bandwidth and damping ratio.

Figure 32:
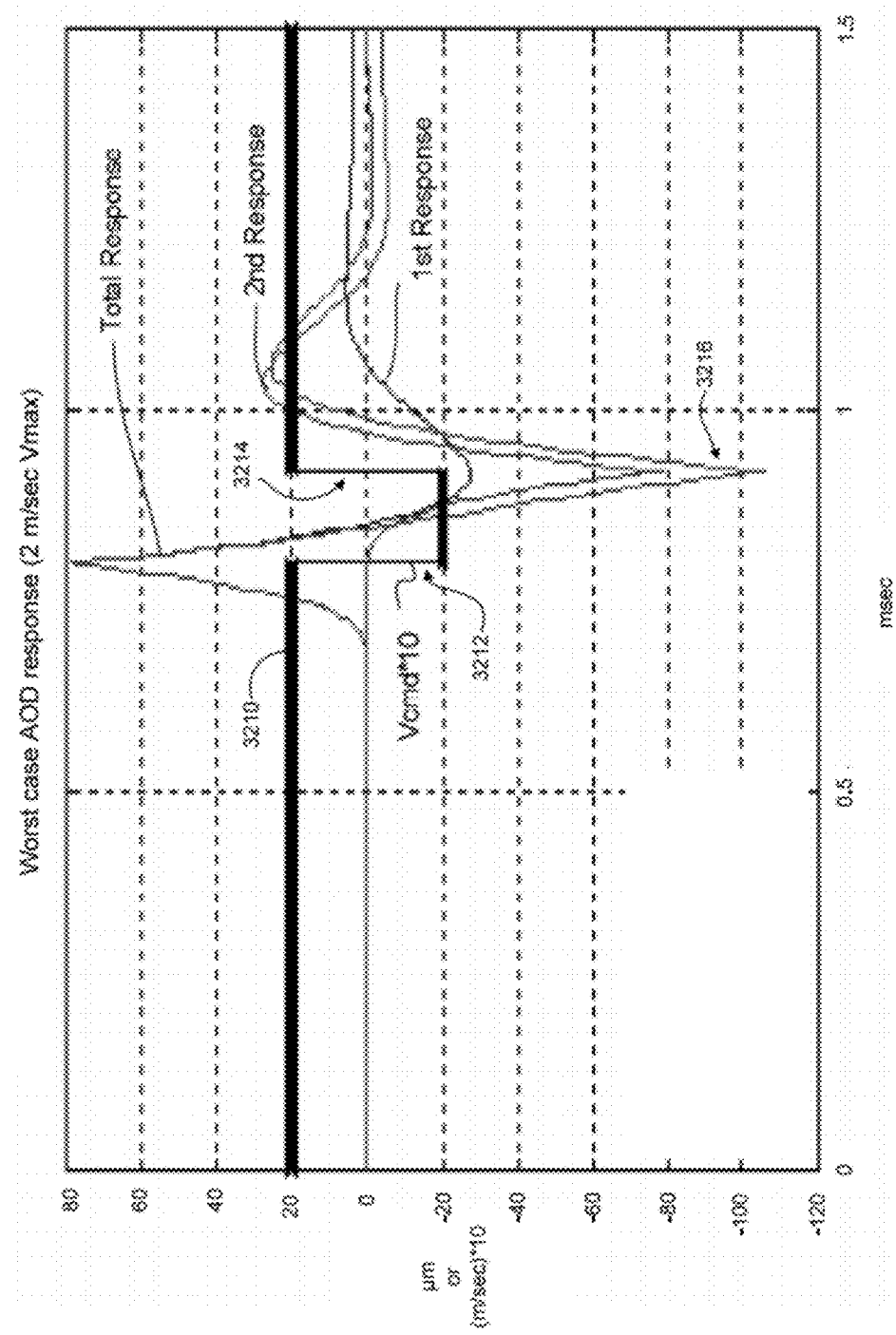
FIG. 32 graphically illustrates a tertiary filter response to velocity change according to one embodiment.

FIG. 32 shows a worst case velocity profile 3210 that maximizes the AOD excursion, which occurs when one velocity change 3210 (equals to 2*Vmax) is followed by a second velocity change 3214, of equal magnitude but opposite sign, timed at the peak of the tertiary filter's overshoot 3216 (about 0.12 msec after the velocity change, for a 3 kHz tertiary filter).

If an AOD transient scale factor is defined as "Ktrans," then for a process segment velocity change deltaV, $$delta Aod = K\text{trans} * delta V.$$

An example value of Ktrans is 26.6 μm/(m/sec), for a $4^{th}$ order 3 kHz tertiary filter. Thus, for example, for a segment with 2 m/sec process velocity, which could make a +2 to −2 m/sec velocity change, the bound on deltaAod=2*(2 m/s)*(26.6 μm/(m/s))=106.4 μm.

Figure 33:
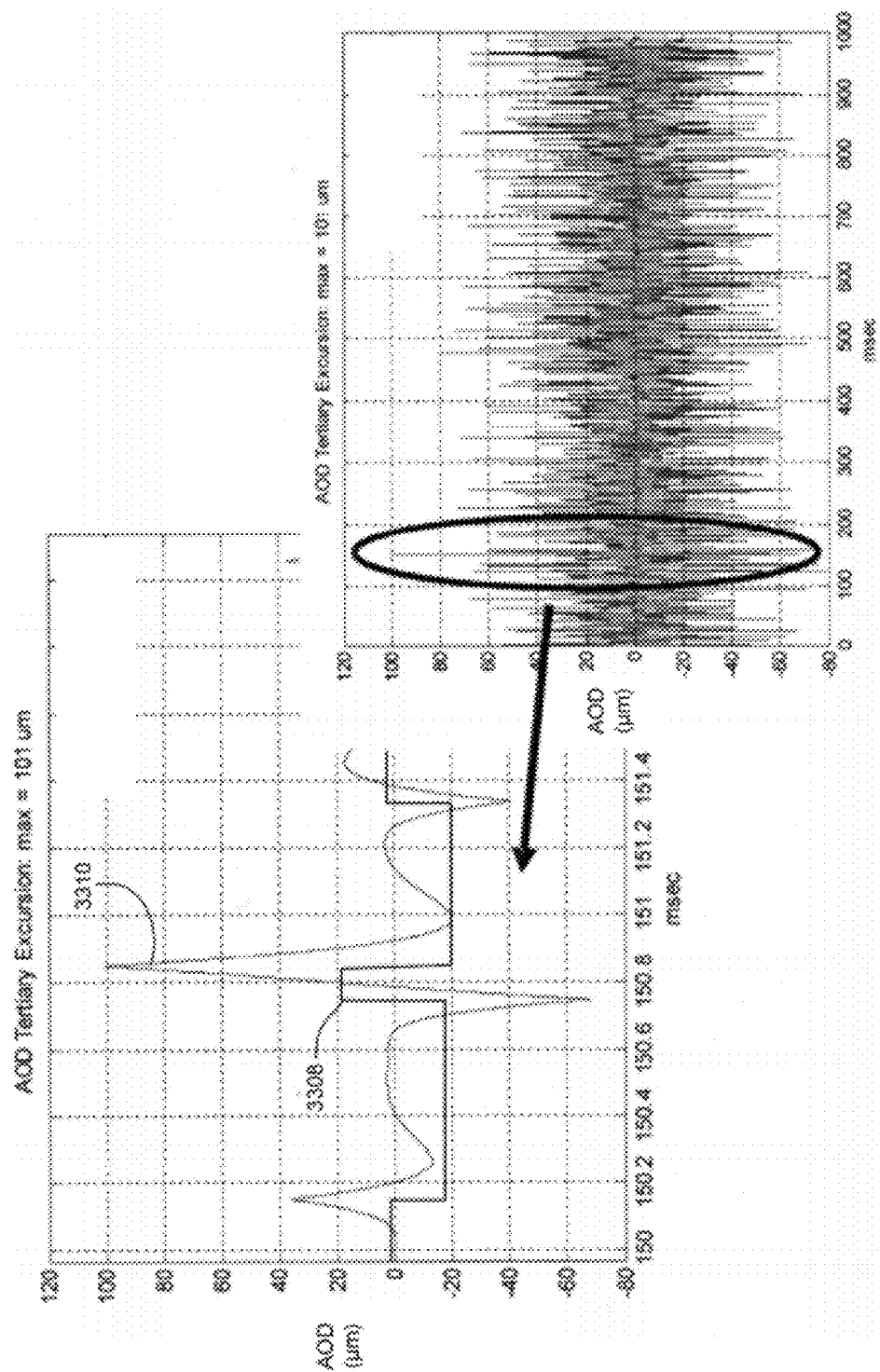
FIG. 33 graphically illustrates a Monte-Carlo AOD transient simulation according to one embodiment.

FIG. 33 graphically illustrates a Monte-Carlo AOD transient simulation according to one embodiment. The simple Monte Carlo model of random velocity sequences 3308 with random timing and random velocity segment magnitudes (up to +−Vmax) confirms that the scenario discussed above with respect to FIG. 32 bounds the AOD excursion 3310 (as shown in FIG. 33). So the tertiary filter response reliably predicts the worst-case AOD excursion for a given laser process velocity.

3. Laser Power Limit

Laser power imposes a fundamental limit on process velocity. To a first-order approximation, the dosage (power/velocity=W/(m/sec)=J/m) required to process a trench depends on the trench area. For a trench cut by an undithered Gaussian beam, the cross-sectional area is approximately 0.65*Width*Deff, in an example embodiment, where Deff=effective spot size. When the width is increased by dithering, the total area is D*(0.65*Deff+Width-Deff).

An example model for dosage requirements is $$Dosage(J/m) = Area(\mu m^2)/143 + 0.3).$$

On a calibrated LDA system, the Process Map provides a calibrated value for dosage, where $$Dosage = Fluence * EffectiveWidth.$$

Since dosage equals power/velocity, the required dosage determines the maximum velocity for a given available laser power.

Figure 34:
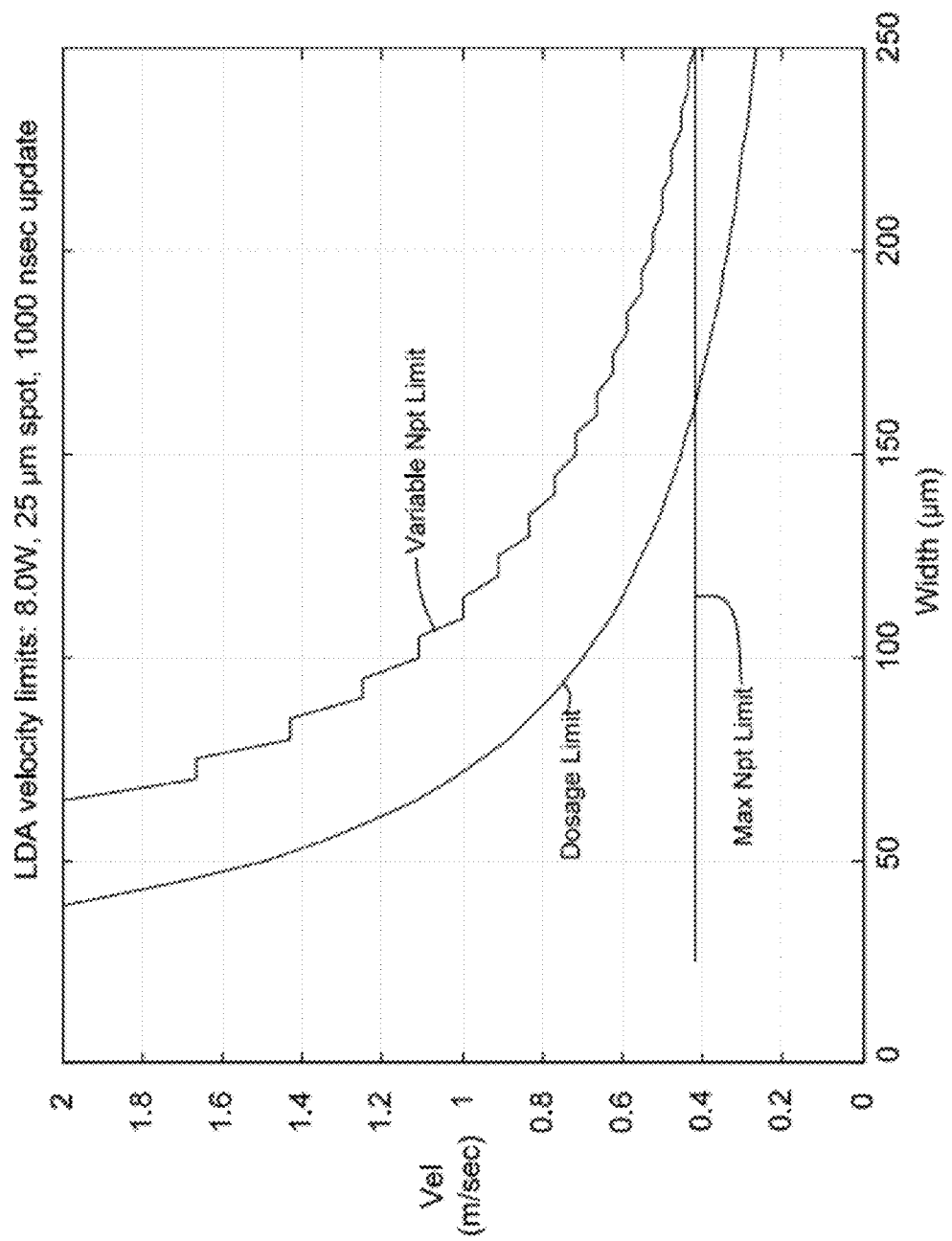
FIG. 34 graphically illustrates example velocity limitations with Taod=Tcmd=1 μsec according to one embodiment.

FIG. 34 graphically illustrates example velocity limitations with Taod=Tcmd=1 μsec according to one embodiment. FIG. 34 includes an example curve for a dosage limit and an example curve for a variable number of points (Npt) limit. The work surface laser power limit (approximately 8 W for an example LDA system) limits the process velocity as a function of width, as shown in FIG. 34. The illustrated example curves may be optimistic according to certain embodiments, since they do not include the effects of AOD efficiency (e.g., 65-70% at the maximum width) or the additional AOD deflection required by tertiary profiling. Still, the illustrated upper bound on laser-limited process velocity forms a conservative lower bound that the other velocity limits (beam positioner and dithering) exceed to avoid limiting throughput. FIG. 34 highlights the fact that if the dither table used the maximum number of points (max Npt limit) required for the largest width, the maximum speed at smaller widths would be unacceptably limited.

In reality, maximum work surface power is a function of optical train efficiency, which varies with AOD range (due to the AOD efficiency curve). The desired trench width determines the gridWidth (required dither deflection), which determines maximum power levels (due to AOD power linearization). Tertiary AOD deflection is also included in this calculation, since it requires additional AOD deflection and thus lowers maximum efficiency. Thus, available laser power decreases with trench width and affects the curve in FIG. 34.

The required AOD range, as a function of segment velocity Vseg, is given by $$AOD\text{range} = [grid\text{Width} + 4 * V\text{seg} * K\text{trans}] * 1.10.$$

This includes components due to: the required gridWidth for the trench (the maximum gridWidth if variable); AOD excursion due to tertiary filter dynamics (through the "Ktrans" scale factor) (note that for a segment velocity Vseg, the largest velocity change is 2*Vseg, and the pk-pk AOD deflection range is 2*(2*Vseg)*Ktrans); and 10% safety margin, including scan field distortion and velocity-dependent dither angle effects.

Figure 35:
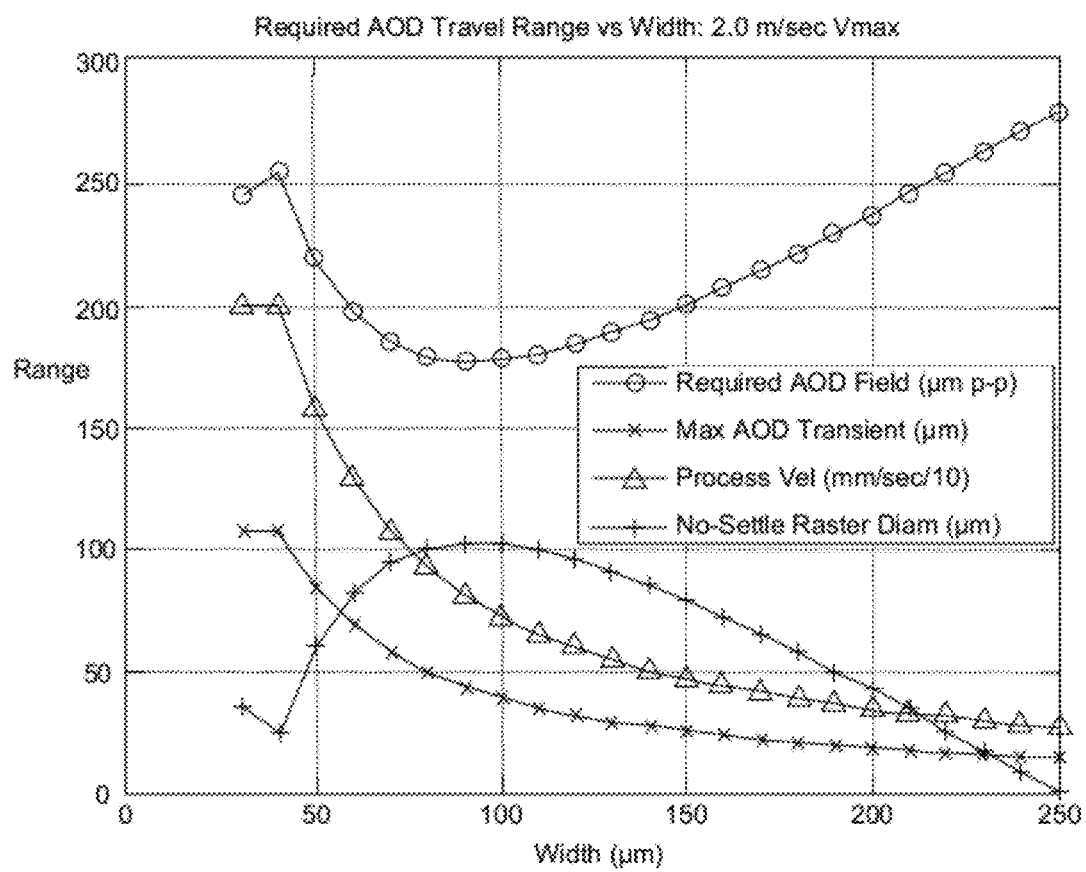
FIG. 35 graphically illustrates AOD travel range vs. feature width according to one embodiment.

Example results are shown in FIG. 35, which graphically illustrates AOD travel range vs. feature width according to one embodiment. The example shown in FIG. 35 uses 2 m/sec velocity, 8 W laser power, and 280 μm AOD range. This model also predicts the maximum raster diameter than can be processed without settling after a move to the raster location. This may be, for example, <100 μm—not large enough for most pads, but sometimes adequate for trench intersections. The alternative for larger raster areas is to settle at the raster point for a period defined by the tertiary filter response (generally 0.4-0.5 msec).

Figure 36:
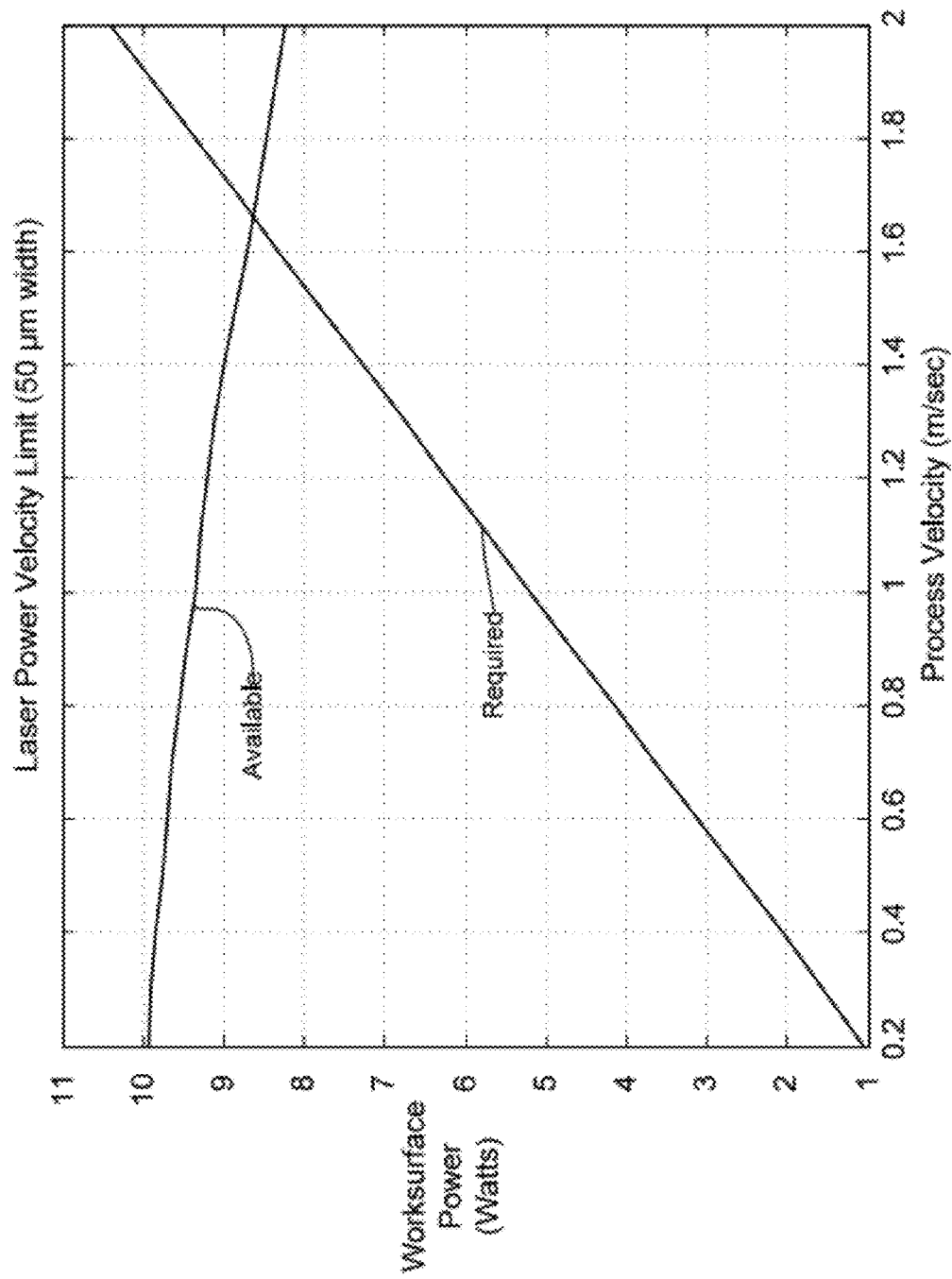
FIG. 36 graphically illustrates laser power limit on process velocity according to one embodiment.

Note that FIG. 35 does not include the effects of AOD range on AOD efficiency. To incorporate this influence on the process velocity calculation, the calculated AOD range is combined with the Efficiency Curve (FIG. 30) to calculate available laser power as a function of Vseg. The laser power limit on process velocity can then be determined by comparing available laser power (based on velocity-dependent AOD range) to required laser power (based on dosage). For example, FIG. 36 graphically illustrates laser power limit on process velocity according to one embodiment. In the example shown in FIG. 36, a 50 μm trench is shown, in which the process velocity is 1.65 m/sec.

i. Arc Processing Effects

During wide arcs, the outside power is amplified by (1+W/R/2), which may force a lower centerline velocity in the arc to avoid power limitation on the outer edge. But the above model shows that any step change in velocity (less than twice the nominal velocity) can be accommodated, as long as the nominal process velocity was selected to accommodate worst-case AOD travel. Thus wide arcs may be processed without concern about AOD travel range limitations.

4. Data Rate Limit

Data flow rate limitations set a lower bound on the acceptable processing time for any process segment (approximately 7 μsec). Given the length of the process segment, this sets an upper bound on the segment velocity. For example, a 21 μm segment would have a 3 m/sec velocity limit due to data rate.

5. Process Velocity Limit Summary

In one embodiment, the calculation of process velocity for a trench follows these steps. An artisan will recognize from the disclosure herein that certain of the following steps may be performed in a different order.

In a first step, use the Process Map to determine Fluence, gridWidth, and EffectiveWidth based on trench dimensions (width and depth).

In a second step, calculate Dosage=Fluence*EffectiveWidth for the trench. The required laser power, as a function of process velocity Vseg, is then Preq=Dosage*Vseg.

In a third step, calculate the required AOD deflection range as a function of Vseg. Use this result to determine the velocity limit due to AOD travel range (Vaod), given the maximum calibrated AOD range.

In a fourth step, using the Efficiency Gain curve (see "High-Power Mode"), calculate the maximum available laser power as a function of AOD range.

In a fifth step, determine the velocity limit due to laser power (Vlaser): the process velocity at which the required laser power equals the available laser power.

In a sixth step, determine the velocity limit due to dither overlap (Vdither).

In a seventh step, determine the velocity limit due to minimum segment time (Vsegtime).

In an eighth step, set the process velocity as the minimum of Vaod, Vlaser, Vdither, and Vsegtime.

IV. Processing Modes

In one embodiment, the LDA system processes material in three different modes. Vector mode processes linear traces of varying width and depth, both of which can be controlled arbitrarily. Raster mode processes creates small features of arbitrary 2D shape, within one AOD scan field (e.g., ten times larger than the process spot size). Skive mode processes large areas of arbitrary shape, with good control over the precision of the perimeter position and the consistency of material ablation depth within the skived area.

A. Vector Processing

Vector processing of trenches relies on AOD dithering to control trench width. In certain embodiment of LDA systems, for example, there may be concern about the inconsistent approach to dithering, in which the dither pattern starts at an arbitrary location at the start and end points of the trench, and with a dither angle (relative to the main beam trajectory) that varies with trajectory velocity.

To address this concern, one embodiment applies dither for an integral number of rows for each process segment to produce uniform, repeatable, and well-defined segment ends. Process segment commands are tailored to support the timing of such integral dither rows.

The number of integral dither rows supports the trace-end transition regions that are used to produce intersections. An example 40-50 μm transition allows 2-3 μm of beam position error while maintaining a 5-10% depth tolerance. For the nominal 25 μm effective spot size used in one embodiment of the LDA system, this transition length uses 4-5 dither rows of dosage transition.

Dosage is held constant during each dither row to maintain a consistent width at trace ends. All dosage control may be applied on a per-dither-row basis to create predictable trench widths variation during dosage changes.

In certain embodiments, dither is applied such that consecutive spots overlap by >60% of the spot diameter. Dither may also be applied fast enough to provide >60% overlap between consecutive rows. For wide trenches, this may become an issue, due to the large number of dither pulses required, and constraints on the AOD update period.

Figure 37:
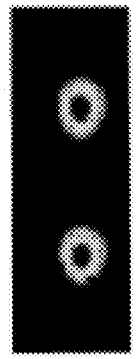
FIG. 37 graphically illustrates example spot distortions according to certain embodiments.

The AOD update period is constrained by the transit time of the acoustic wave across the optical beam in the AOD. The LDA system AODs 1020, 1022, in one embodiment, can operate at update times >500 nsec. At fast update rates, distortion in the deflected spots due to transients in the acoustic wave become quite noticeable; even at 500 nsec, spot distortion may be a problem. Spot diameter enlargement reduces work surface fluence, leading to depth variation. In one embodiment, the AODs 1020, 1022 are updated at rates faster than 750 nsec, which is the actual transit time of the acoustic wave across the 4.5 mm optical beam in the AOD. FIG. 37 graphically illustrates example spot distortions according to certain embodiments. From left to right, FIG. 37 compares the distortion of two deflected spots at 440 nsec, 640 nsec, and 1240 nsec update periods.

Another embodiment of the LDA system runs at much higher beam trajectory velocities. The combination of higher velocity, spot overlap requirements, and limited AOD update rates means that the number of dither points varies with the feature width. In other embodiments, one dither table is used and the feature size is varied by scaling the distance between dither points.

1. Dither Parameter Calculation

In certain embodiments, the following terms define the calculation and setup of dither parameters.

Input Parameters:

Deff: Effective spot size (μm); the width of an undithered trench at the desired depth. Note that Deff varies with the optical spot diameter, as well as the desired depth (since the dosage increase required to increase depth also increases width).

BiteSizeRatio: The maximum deflection per spot that provides enough overlap to maintain a smooth fluence distribution, expressed as a fraction of a spot diameter. BiteSizeRatio is <=0.4 for a Gaussian spot.

Taodmin: Minimum AOD update period (μsec); around 400-700 nsec for one embodiment of the LDA system.

Tclock: AOD clock period (μsec); Taod is quantized to this period. Nominally 0.04 μsec.

Output parameters:

Taod: Actual AOD update period (μsec).

Nd: Number of dither points required for a desired trench width; a function of width and Deff.

Td: Total dither period (μsec)=Nd*Taod. Process parameters (width, depth, shape, bank), held constant for each dither row, are updated at this rate.

Tcmd: The time period (μsec) between updates to the nominal beam position. Nominally 1 μsec.

Ncmd: Number of Tcmd command periods between changes to process variables and/or dither parameters (Nd, Taod).

Since there may be a variable number of dither points, the AOD update period may be adjusted to update an entire row on Tcmd boundary. In addition, the AOD update period is quantized to 20 nsec intervals.

The calculation of dependent parameters begins with the desired feature width. The width of a dithered trace is roughly approximated by Width=*Deff*+*Nd*\**Deff*\*BiteSizeRatio.

The number of dither points used for the desired width is rounded up to a discrete value, and is given by

*Nd*>=1+ceil((Width−*Deff*)/(*Deff*\*BiteSizeRatio)), where "ceil" is a ceiling function that rounds up to the next integer.

Due to rounding, Nd may normally be larger than required, and BiteSizeRatio may be reduced to scale the width to the desired value (through the Kw parameter). Given a value of Nd, the command parameters are given by

*N*cmd=ceil(*Nd*\**Taod*min/*T*cmd), and

*Taod*=ceil(*N*cmd/*Nd*\**T*cmd/*T*clock)\**T*clock.

For example, for Deff=25 μm, Width=250 μm, BiteSizeRatio=0.4, Taod=0.5 μsec, and Tcmd=1 μsec, $$Nd=\mathrm{ceil}((250-25)/(25*0.4))=23,$$

$$N\mathrm{cmd}=\mathrm{ceil}(23*0.5/1.0)=13,\ \mathrm{and}$$

$$Taod=\mathrm{ceil}(13/23*1.0/0.02)*0.02=0.580\ \mathrm{\mu sec}.$$

The maximum deflection range of the LDA system's AODs 1020, 1022 in one embodiment is equivalent to 10*Deff. If the full AOD range is used, Nd<=24.

The above equations give the general solution for dither parameters. It may be more desirable to hold Taod constant and enforce values of Nd that produce discrete values for Ncmd. For instance, for Tcmd=1 μsec, Nd may be powers of 2 and Taod=0.5 μsec, or Nd may be powers or 4 and Taod=0.75 μsec. As described in the next section, the combination of AOD frequency limitations, optical spot quality, and the above equations results in the LDA system, according to one embodiment, using 1 μsec period for Taod and Tcmd.

2. Nominal Frequency

Dither is applied as frequency deviations relative to a pair of nominal AOD frequencies (Fnom0/1), which specify the nominal beam path (i.e. the centerline of the trench). Fnom0/1 is updated at the command update rate (every Tcmd seconds), and is thus generally updated multiple times per dither row. In one embodiment, the Fnom0/1 is applied immediately, without waiting for dither row completion, to maintain accuracy in the main beam trajectory. This contrasts with the update of process parameters (width, shape, dosage, bank), which are held constant over each dither row.

However, Fnom updates, in certain embodiments, only take effect at the next available AOD update (every Taod seconds). If Fnom updates are not synchronized with the AOD update cycle, they have an effective timing uncertainty equal to Taod. In addition, the magnitude of this jitter varies if Taod is not held constant (e.g., calculated as a function of Nd, as described above).

The uncertainty introduced by unsynchronized operation degrades process accuracy, since the random jitter cannot be calibrated out. For instance, for Taod=750 nsec, a trench processed at 2 m/sec has an additional positioning uncertainty of ±0.75 μm.

To avoid this error, Tcmd may be a multiple of Taod. Assuming updates are sent to the FPGA 1028 every DSP1 servo cycle (5 μsec), with Tcmd=1 μsec, the natural values of Taod are 500 or 1000 nsec. Another choice is Taod=Tcmd=750 nsec, although this may require a variable number of data packets per servo cycle.

As shown in FIG. 37, distortion of the deflected beam out of the AOD is marginal at about 500 nsec. To avoid this distortion, vector mode processing runs with Tcmd=Taod=1000 nsec. In other embodiments, AOD designs may allow smaller values of Taod (e.g., 250 nsec). Thus, the architecture accommodates variation of Tcmd and Taod.

3. Dither Angle Correction and Magnitude Scaling

Figure 38:
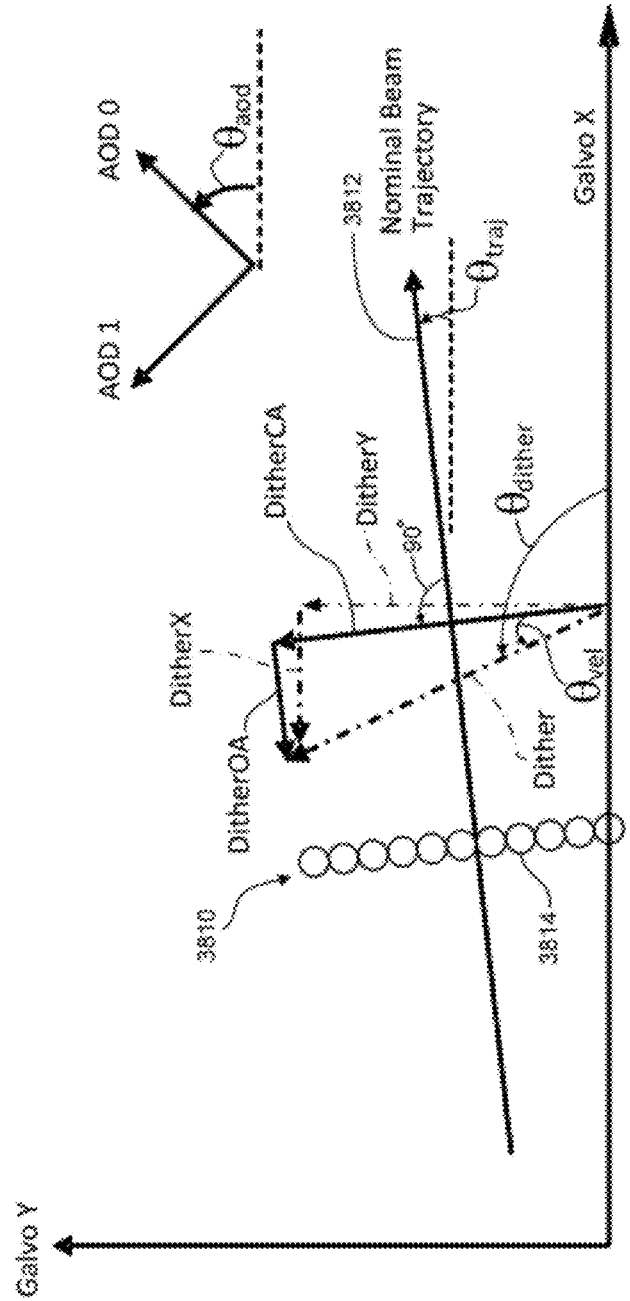
FIG. 38 schematically illustrates a dither row aligned perpendicular to a nominal beam trajectory according to one embodiment.

In one embodiment, the orientation of the AOD dither pattern is adjusted to keep it oriented normal (i.e., perpendicular) to the nominal beam trajectory. For example, FIG. 38 schematically illustrates a dither row 3810 aligned perpendicular to a nominal beam trajectory 3812 according to one embodiment. A process that accounts for skewing due to beam velocity is described below, using the nomenclature described in FIG. 38. Each laser spot location 3814 (eleven shown) is linearly aligned along the dither row 3810 regardless of the velocity of the laser beam as it moves with respect to the beam trajectory 3812.

i. Sign Conventions

As used in example embodiments disclosed herein, a dithered beam is defined as being dithered in the galvo X axis, and then rotated into the correct orientation to keep the dithered beam perpendicular to the beam trajectory 3812. The AOD subsystem 1042 is calibrated to match the galvo XY coordinate frame in the center of the scan field. The following equations develop the dither rotation matrices. Unless otherwise indicated, the convention for angles is positive counterclockwise (CCW) with zero along the +X galvo axis.

ii. AOD Rotation and Transform Components

The final AOD command may be calculated with the following equation:

$$AOD\mathrm{cmd}=TM\mathrm{frame}*TM\mathrm{field}*R\mathrm{dither}*\mathrm{Dither},$$

or $$AOD\mathrm{cmd}=TM\mathrm{aod}*\mathrm{Dither},$$

where:
AODcmd=AOD RF frequency commands to their respective RF drivers (2-element vector);
TMframe=Non-orthogonal transform matrix that converts AOD XY commands to the AOD coordinate frame, as defined in the AOD calibration section;
TMfield=Local scan field distortion correction, in the galvo XY frame (4-element matrix);
Rdither=Rotation matrix to orient the dither vector relative to the beam trajectory 3812 (4-element matrix);
Dither=Dither (or raster) table loaded in FPGA 1028; and
TMaod=Complete AOD command transformation matrix, resulting from the above components—the elements of this matrix are transmitted to the FPGA 1028, replacing the Kw0, Kw1 terms.

The TMfield correction term (two-axis scaling and rotation) is applied to account for local scan field distortion. This may be used because the AOD 1020, 1022 is operating without any scan field calibration correction. This transform may be derived from the galvo calibration data. The elements of this matrix are $$TM\mathit{field}=\begin{bmatrix}SFx & Ryx\\ Rxy & SFy\end{bmatrix},$$

where:
SFx=X-axis scaling (nominally 1.0);
SFy=Y-axis scaling;
Ryx=Rotation of the Y axis into the X axis (rad); and
Rxy=Rotation of the X axis into the Y axis.

iii. Rdither Derivation

The dithered beam has on-axis and cross-axis components, with magnitudes (over one dither cycle) of:

$$\mathrm{Dither}CA=\mathrm{Width},$$

$$\mathrm{Dither}OA=Vel*Taod*(Nd-1).$$

Note that the OA dither component moves the dithered beam "backward" relative to the beam trajectory 3812 such that the on-axis positions of all points in each dither row remain fixed (e.g., the laser spot locations 3814 remain fixed along the dither row 3810 shown in FIG. 38). Thus, the OA dither component is based on the velocity vector so as to maintain each dither row perpendicular to the beam trajectory

3812. The OA and CA dither components combine to form a "dither vector" at an angle $\theta_{dither}$ relative to the +X galvo axis. As shown in FIG. 38, the OA and CA dither components define a velocity compensation angle $\theta_{vel}$ as:

$\theta_{vel}=a\tan(\text{Dither}OA/\text{Dither}CA)$.

The dither vector orientation includes the velocity compensation angle $\theta_{vel}$, plus the trajectory angle $\theta_{traj}$ and a 90° rotation (i.e., the 90° illustrated between the beam trajectory 3812 and the OA dither component DitherCA in FIG. 38):

$\theta_{dither}=\theta_{vel}+\theta_{traj}\pi/2$.

Thus, the dither angle $\theta_{dither}$ is the total dither vector angle relative to the galvo XY frame. The dither vector may then be aligned to the AOD frame by the angle $\theta_{aod}$, which may be rotated relative to the galvo XY frame due to the optics train layout.

During processing, the trajectory angle ($\theta_{traj}$) is updated in realtime (as a function of the beam trajectory velocity components Vx and Vy), while the AOD angle ($\theta_{aod}$) is constant after calibration. For the realtime updates (1 μsec updates), trigonometric calculations may be minimized. This can be done by applying trigonometric identities: e.g. $\sin(a\tan(y/x))= y/\text{sqrt}(x^2+y^2)$.

The following variables may be used by the DSP 1026 to calculate dither orientation:

ditherRange=total range of the current dither table (μm);

Kw=scaling factor applied to the dither table to create the desired dither width (this may be interpolated for tapering segments);

Nd=number of dither points in the current dither table (constant for each segment);

Taod=dither table update rate (μsec);

Vx, Vy=X and Y components of the beam trajectory 3812 in raw galvo XY coordinates (m/sec); and Vel=sqrt($Vx^2+Vy^2$)=velocity vector magnitude.

Then the trigonometric identities allow the sin and cos terms for the Rdither rotation matrix to be calculated by

```
// Nominal cross-axis dither width after scaling
    ditherCA = ditherRange*Kw (µm);
// Required on-axis increment during one dither row to keep
dither points aligned
    ditherOA = Vel*Taod*(Nd-1);
// Magnitude of full dither vector due to velocity compensation
(vector sum of OA, CA)
    ditherMag= sqrt(ditherOA^2 + ditherCA^2);
// Avoid divide by zero issues; default to Identity matrix
if abs(Vel*ditherMag) <1e-6
    cosThetaDither = 1;
    sinThetaDither = 0;
else
    cosThetaDither = -(Vy*ditherCA + Vx*ditherOA)/
        (Vel*ditherMag);
    sinThetaDither = (Vx*ditherCA - Vy*ditherOA)/
        (Vel*ditherMag);
end.
``` iv. Scaling and TMaod Calculation

The magnitude of the dither vector may be adjusted to account for the extra hypotenuse length in the velocity-corrected dither vector. Thus, KwCorr=Kw*ditherMag/ditherCA=ditherMag/ditherRange.

The final transformation matrix is then given by the matrix product $$TMaod = \begin{bmatrix} T11 & T12 \\ T21 & T22 \end{bmatrix} = TMframe * TMfield * Rdither * KwCorr.$$

The first two terms (TMframe, TMfield) may be pre-calculated in the SCC 1010 and passed in as the "TMdither" transformation matrix:

$$TMdither = \begin{bmatrix} D11 & D12 \\ D21 & D22 \end{bmatrix} = TMframe * TMfield.$$

The last two terms (Rdither, KwCorr) may be calculated in realtime, based on the velocity vector and interpolated Kw. Note that both Rdither and KwCorr contain the ditherMag term, and the product Rdither*KwCorr results in ditherMag being cancelled out—avoiding a costly sqrt( ) calculation in the DSP 1026. If we define cos ThetaDitherCorr=−(Vy*ditherCA+Vx*ditherOA)/(Vel*ditherRange);

sin ThetaDitherCorr=(Vx*ditherCA−Vy*ditherOA)/(Vel*ditherRange);

or, alternatively (avoiding a calculation of ditherOA and ditherCA), cos ThetaDitherCorr=−(Vy*Kw/Vel+Vx*(Nd−1)*Taod/ditherRange);

sin ThetaDitherCorr=(Vx*Kw/Vel−Vy*(Nd−1)*Taod/ditherRange);

then $$Rdither * KwCorr = \begin{bmatrix} \cos ThetaDitherCorr & -\sin ThetaDitherCorr \\ \sin ThetaDitherCorr & \cos ThetaDitherCorr \end{bmatrix}.$$

The four elements of TMaod are then transmitted to the FPGA 1028, which calculates RF signal frequency updates as $$\begin{bmatrix} AOD0 \\ AOD1 \end{bmatrix} = \begin{bmatrix} T11 & T12 \\ T21 & T22 \end{bmatrix} * \begin{bmatrix} DitherX \\ DitherY \end{bmatrix},$$

where DitherX and DitherY are the entries in the AOD dither table. Raster calculations follow the same process. As noted above, by convention the DitherY entries are zero in vector or skive mode; the dither entries are generated by the Dither Map fill DitherX.

The terms in the TMframe matrix are constant and can be pre-calculated and stored in the DSP 1026. The terms in the TMfield matrix are pulled from the galvo calibration data. This transform is applied in the galvo XY frame, since the TMframe rotation may be large (rotation is not commutative for large rotation angles).

v. Additionally Calibrated TMaod Calculation

Certain embodiments include a calculation of TMaod during dithering that accounts for the effects of calibration corrections to the trajectory command. In the derivation presented above, ideal (worksurface) velocities were assumed. In certain embodiments, however, scan field distortion corrections are applied to the trajectory commands before they are transmitted to the DSP 1026. These corrections modify the trajectory velocity, as calculated by the DSP 1026. This creates a minor error in the dither vector velocity angle calculation that may result in a few microns of error. To provide further correction, a local field distortion correction can be embedded in the TMdither matrix.

First, redefine the terms forming the transformation matrix that rotates and scales the dither vector:

$$\begin{bmatrix} \cos ThetaDitherCorr \\ \sin ThetaDitherCorr \end{bmatrix} = \begin{bmatrix} -Koa & -Kca \\ Kca & -Koa \end{bmatrix} * \begin{bmatrix} VxIdeal \\ VyIdeal \end{bmatrix},$$

where cross-axis and on-axis dither angle coefficients are defined as $Kca = Kw/VelIdeal$, and $Koa = Taod*(Ndither-1)/ditherRange$.

Both Kca and Koa can be calculated by the SCC based on process segment parameters, using the trajectory velocity in Ideal coordinates.

This formulation presents various implementation options. In one embodiment, the value for Kw is kept constant over a process segment, and a single constant TMdither transform is passed from the SCC 1010 to the DSP 1026. Holding Kw constant may be a tolerable restriction in certain embodiments, since tapered lines can be created by a sequence of short segments, each with a constant Kw value. In another embodiment, the terms for TMdither are expanded to create two transforms: one constant, and one scaled by Kw. The DSP 1026 can then update TMdither within the process segment:

$TMdither = TMdither1 + Kw*TMdither2$.

The value for Kw can then be interpolated over a process segment to create tapered line widths. This implies more computation by the DSP 1026, and more data transmitted from the SCC 1010 to DSP 1026. The tradeoff is the ability to provide shorter and more precise width transitions.

The final dither commands are generated by the FPGA 1028:

$$\begin{bmatrix} AOD0 \\ AOD1 \end{bmatrix} = TMaod * \begin{bmatrix} DitherX \\ DitherY \end{bmatrix} = \begin{bmatrix} T11 & T12 \\ T21 & T22 \end{bmatrix} * \begin{bmatrix} DitherX \\ DitherY \end{bmatrix}.$$

But by convention, only the DitherX component is non-zero in the FPGA dither tables. Thus only the first column of TMaod is required during dithering:

$$\begin{bmatrix} AOD0 \\ AOD1 \end{bmatrix} = TMaod * \begin{bmatrix} DitherX \\ 0 \end{bmatrix} = \begin{bmatrix} T11 & 0 \\ T21 & 0 \end{bmatrix} * \begin{bmatrix} DitherX \\ 0 \end{bmatrix}.$$

Based on the equations in the previous section, this column is given by $$\begin{bmatrix} T11 \\ T21 \end{bmatrix} =$$

-continued $$TMframe * TMFieldIdealToRawGalvo * \begin{bmatrix} -Koa & -Kca \\ Kca & -Koa \end{bmatrix} * \begin{bmatrix} VxIdeal \\ VyIdeal \end{bmatrix}.$$

However, the beam trajectory data available in the DSP 1026 is in Raw Galvo, rather than Ideal, coordinates. The angle and magnitude of the beam trajectory velocity vector, which were modified by scan field distortion, distorts the dither vector. In order to properly calculate the dither vector in Ideal coordinates, the local scan field distortion (described by TMfield) may be removed according to certain embodiments from the velocity vector before calculating the dither vector:

$$\begin{bmatrix} VxIdeal \\ VyIdeal \end{bmatrix} = TMFieldRawGalvoToIdeal * \begin{bmatrix} VxRaw \\ VyRaw \end{bmatrix}.$$

This conversion allows the dither vector to be calculated in Ideal coordinates, then transformed into Raw AOD coordinates. This procedure uses three transforms: TMfield (Raw Galvo to Ideal), TMfield (Ideal to Raw Galvo), and TMframe (Raw Galvo to Raw AOD). The first column of TMaod is then given by $$\begin{bmatrix} T11 \\ T21 \end{bmatrix} = TMframe * TMFieldIdealToRawGalvo * \begin{bmatrix} -Koa & -Kca \\ Kca & -Koa \end{bmatrix} *$$

$$TMFieldRawGalvoToIdeal * \begin{bmatrix} VxRaw \\ VyRaw \end{bmatrix}, \text{ or}$$

$$\begin{bmatrix} T11 \\ T21 \end{bmatrix} = \begin{bmatrix} D11 & D12 \\ D21 & D22 \end{bmatrix} * \begin{bmatrix} VxRaw \\ VyRaw \end{bmatrix} = TMdither * \begin{bmatrix} VxRaw \\ VyRaw \end{bmatrix}.$$

The TMdither matrix is calculated by the SCC 1010 for each segment, and passed to the DSP 1026 for processing based on real-time values of VxRaw and VyRaw. This then simplifies DSP processing since the dither transform terms are pre-calculated on the SCC 1010.

The full TMaod matrix transmitted from the DSP to the FPGA 1028 will then be $$TMaod = \begin{bmatrix} T11 & 0 \\ T21 & 0 \end{bmatrix}.$$

This form of TMaod is a special case only for dithering. For raster processing, a full TMaod matrix is generally used.

vi. Dither Direction Control

The direction of dithering (relative to the velocity trajectory) may be used, e.g., during skiving, when large ablated areas are consistently processed. Experience has shown that the direction of laser processing relative to debris assist airflow can significantly impact process results. Generally processing "into the wind" is preferred to avoid interaction with the debris plume.

Given the above equations, dither direction may be changed simply by changing the sign of Kca in the TMdither equation, which effectively reverses the cross-axis dither motion. This can be performed at the SCC level, based on the velocity trajectory of the skive pass. Note that skive passes are generally arranged in regularly spaced rows in one angular orientation, which enables simple control of dither direction relative to the debris assist airflow.

4. Dither Row Fluence Control

In certain embodiments, the implementation of fluence control during dithering maintains constant dosage per dither row. This allows dosage to be ramped down at the end of a process segment, while keeping the dosage consistent across the width of the line. This may be useful, for example, for rapid dosage ramps with wide dithered lines.

Figure 52:
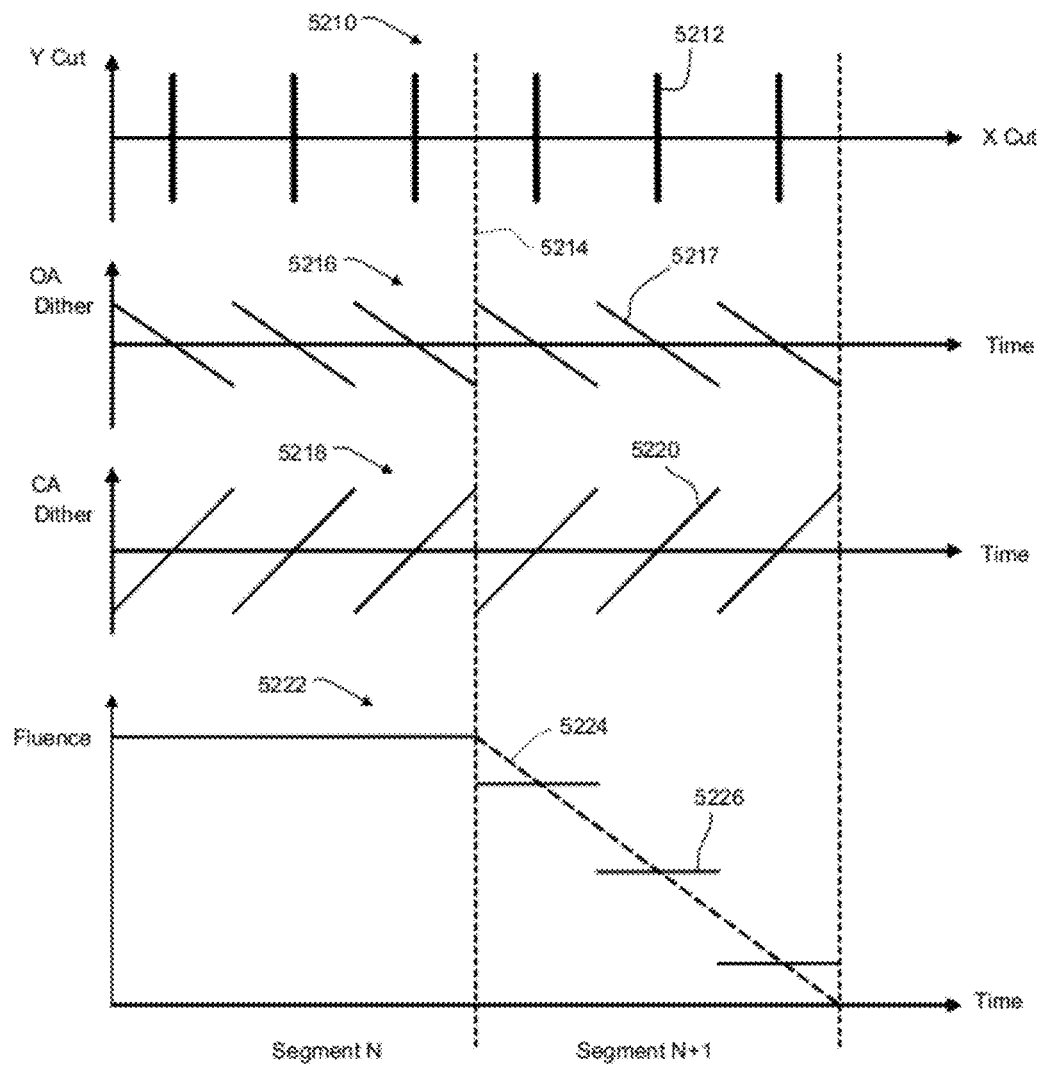
FIG. 52 graphically illustrates dither row fluence control according to one embodiment.

FIG. 52 graphically illustrates dither row fluence control according to one embodiment. The top plot 5210 shows a series of dither rows 5212 (six shown) spanning two process segments (shown as Segment N and Segment N+1 separated by dashed line 5214). The second plot 5216 shows the on-axis (OA) dither commands 5217 for each dither row 5212. The third plot 5218 shows the cross-axis (CA) dither commands 5220 for each dither row 5212. Note that the OA dither component has a negative slope, keeping the dither stationary relative to the workpiece as the main beam trajectory moves at constant velocity. The bottom plot 5222 shows the ideal fluence commands 5224 and actual fluence commands 5226. Note that in the second process segment (left of the dashed line 5214), the fluence is ramped down (e.g. to form one leg of an intersection). The continuous fluence ramp is converted to a series of fluence steps, with the fluence held constant for each dither row. The fluence level for each dither row is given by the fluence ramp value at the dither row center.

Note also that the on-axis position of the dither rows 5212 does not line up with the start or end of the process segments, with an offset equal to Taod*Vel*(Ndither−1)/2. This keeps the concept of a process segment generalized, such that the any segment can be processed in any direction. Any processing artifacts produced by this small offset can be mitigated by reducing velocity in the particular segment to reduce dither row spacing.

This describes the approach of keeping fluence constant per dither row. A similar approach may be used if dither width is allowed to change within a process segment.

5. TMaod Limits

In certain embodiments, the magnitude of the TMaod entries are limited to <2. This is seen in the following derivation:

$$|\cos ThDitherCorr| = (Vy/Vel*ditherCA + Vx/Vel*ditherOA)/ditherRange,$$

or $$|\cos ThDitherCorr| = \sin ThVel*ditherCA/ditherRange + \cos ThVel*ditherOA/ditherRange.$$

To maintain spot overlap, the spacing of dither table entries is less than ~0.35*Deff. Similarly, segment velocity is limited such that the spacing between dither rows (ditherOA) is less than ~0.35*Deff. This ensures that ditherOA/ditherRange<=1, even for the worst dither case (Nd=2). By definition, ditherCA/ditherRange=Kw<=1. So the largest value of |cosThDitherCorr| occurs when each of these terms=1, and $$|\cos ThDitherCorr| = \sin ThVel + \cos ThVel,$$

which has a maximum of 1.414 at ThVel=45 deg. A similar limit applies to |sinThDitherCorr|.

The terms of TMfield may have magnitudes slightly larger than 1 (e.g., perhaps up to 1.2) due to scan lens distortion local scale factors. Non-orthogonality may create terms in TMframe up to ~1.1. Thus the magnitude of all TMaod terms is <2.

To ensure this limit, the Dither Map spaces the dither table points out properly (increasing Nd as ditherRange increases), and segment velocities are limited to constrain |ditherOA|.

Note that the scaling in TMaod may be greater than 1, but this does not imply a change in spot overlap, since the scaling terms in TMaod compensate for other scaling effects. For instance, the longer hypotenuse of the dither vector (due to velocity compensation, see FIG. 38) appears to reduce spot overlap, but as the spots are actually applied to the work surface, the velocity effect lines them up and the geometry returns to normal. A similar argument holds for local lens distortion scaling (TMfield terms >1 normalize for local lens scaling <1). Thus, the Dither Map can specify nominal spot spacing without regard to TMaod scaling effects.

6. Vector Process Summary

Figure 48:
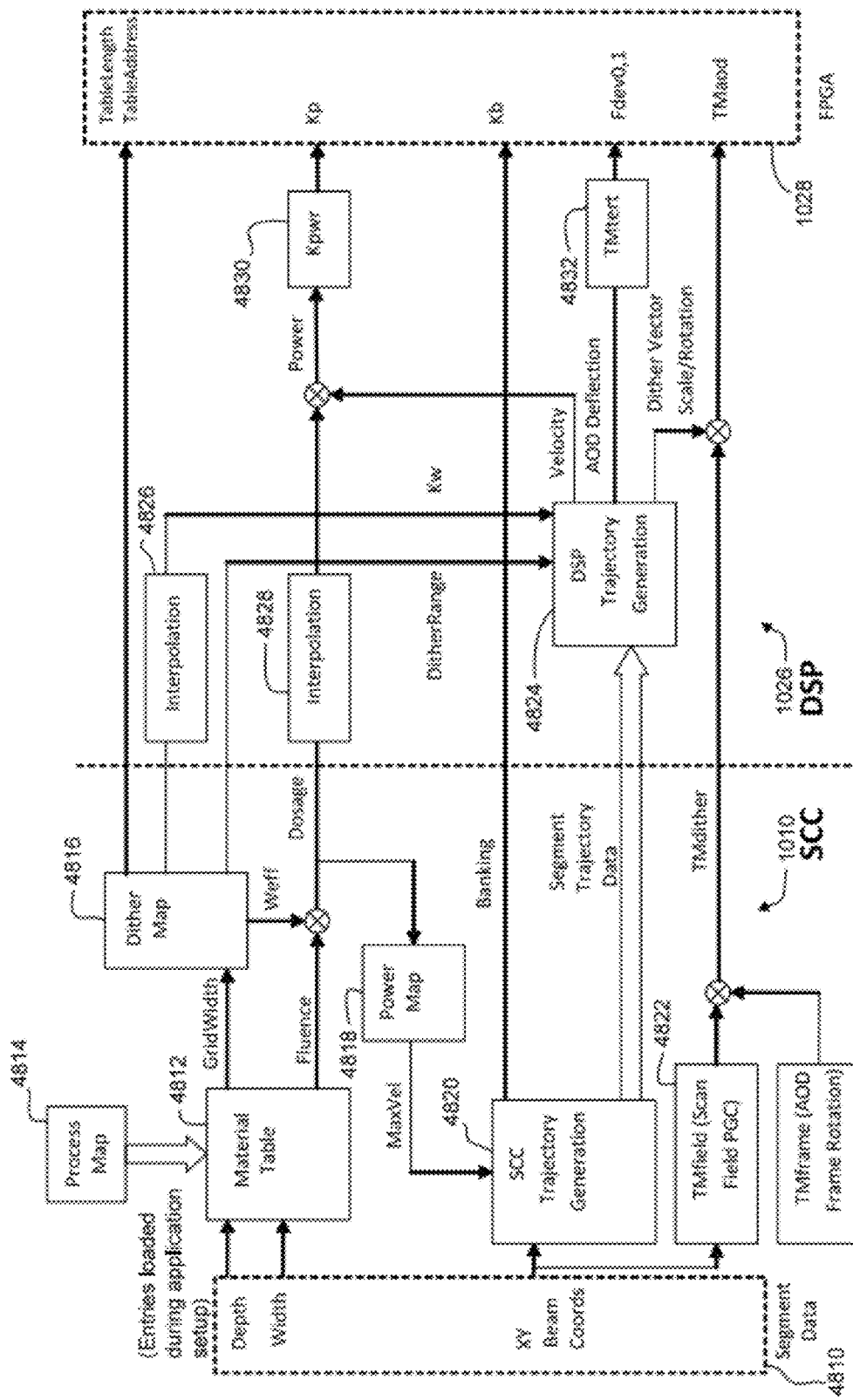
FIG. 48 is a block diagram illustrating AOD command generation for vector processing according to one embodiment.

In certain embodiments, processing in vector mode can be summarized as follows. The following steps are followed for each process segment in an application. FIG. 48 (discussed below) illustrates this processing flow for translating vector process segment data into commands to the FPGA 1028. An artisan will recognize from the disclosure herein that certain of the following steps may be performed in a different order.

Step 1: The SCC 1010 breaks up the application into separate process segments using the following rules: separate segments are required for arcs; all segments are less than maxSegmentLength (~1 mm, for calibration); and all segments process in greater than 12.5 µsec (for this particular example, processing supports sustained update rates of 12.5 µsec per segment, which would support 25 µm minimum segment length at 2 m/sec; of course, other embodiments may use different update rates).

Step 2: The SCC 1010 uses the Process Map and the trench geometry (width, depth) to determine the required process parameters (GridWidth and Fluence).

Step 3: The SCC 1010 uses the DitherMap to determine dither table parameters (Nd, Kw) corresponding to the required GridWidth. Note that Nd is held constant for each segment but Kw may be interpolated over transition segments.

Step 4: The SCC 1010 uses the DitherMap to determine the dither table parameters tableAddress and tableLength corresponding to Nd.

Step 5: The SCC 1010 uses the DitherMap to calculate an EffectiveWidth. Since Kw may be interpolated, EffectiveWidth may also be interpolated over transition segments.

Step 6: The SCC 1010 calculates Dosage=Fluence*EffectiveWidth. This may be interpolated over transition segments.

Step 7: The SCC 1010 calculates Kb based on the segment arc radius (if required).

Step 8: The SCC 1010 assigns a segment velocity (held constant over the segment) based on one or more of the following limits: a. Laser power-limited velocity, based on the Power Map and the required dosage; b. AOD velocity limit due to the required GridWidth, the AOD field size, and the tertiary filter transient magnitude; c. AOD velocity limit due to the maximum spacing between dither rows (=Taod*(Nd−1)*Vel), which may be <0.35*Deff; and e. segments may have a lower velocity if required to meet the minimum segment time requirement noted in step 1.

Step 9: The SCC 1010 transmits the process and position profile data to the DSP 1026. (The shape parameter Ks is not used in this example). The data transmitted from the SCC 1010 to the DSP 1026 includes segment endpoint XY coordinates, segment arc center XY coordinates and radius, number of trajectory samples (~velocity), dither tableAddress, dither tableLength, Dosage, Kw, and Kb.

Step 10: The DSP 1026 calculates centerline position data (Xc, Yc), at an update period of Tcmd, and processes the data with the tertiary filter.

Step 11: The DSP 1026 calculates new dither (Kw) and process (Kp, Kb) parameters once per dither row (every Nd*Taod seconds), interpolating if required (in transition segments).

Step 12: The DSP 1026 calculates the TMaod transform components based on trajectory angle and velocity.

Step 13: The DSP 1026 sends the low-level commands to the FPGA 1028 to control AOD operation. Since the DSP 1026 and FPGA 1028 operate at different update periods (Tdsp vs. Taod), enough data is transmitted each DSP cycle to allow the FPGA 1028 to process for the next Tdsp seconds (i.e. a total of Tdsp/Tcmd data sets).

B. Raster Processing

Raster processing is similar to vector processing, except that a 2D raster table is used for AOD control, rather than a 1D table as in vector processing.

In one embodiment, raster processing is implemented inline with vector processing, which avoids wasted time revisiting raster locations and minimizes the elapsed time between vector writes and intersection processing to minimize laser beam wander effects. In addition, examination of the large-field scan lens distortion characteristics indicates that large raster patterns (e.g., 200 µm wide) may have PGC scaling and rotation corrections applied, especially if they will be intersected by trenches.

The LDA system, according to one embodiment, mixes vector and raster processing by using the same hardware architecture for raster and vector processing. Since a unique dither table is specified for each process segment, a raster operation is seamlessly integrated into the process flow as another table.

The velocity of the nominal beam position is, in general, set to zero during raster processing. In addition, if a large raster area is processed (consuming most of the AOD range), the tertiary filter is allowed to settle to minimize the added AOD tertiary deflection. Generally, in certain embodiments, this is on the order of 0.25 msec.

A scaling/rotation correction may be provided as a set of PGC terms, as described in the previous dither rotation discussion. For raster processing, the Rdither matrix includes the rotation of the raster pattern in the galvo XY coordinate frame, and is transmitted by the SCC 1010 for each raster pattern (rather than being calculated by the DSP 1026 based on trajectory velocity). This rotation may orient an intersection raster pattern relative to surrounding traces for proper intersection formation.

To account for scan field distortion, the SCC 1010 also identifies a PGC correction based on the XY scan field location of the raster and the galvo calibration data. In certain embodiments, this corrects errors of up to 5-6% in X/Y error over the raster area. This may be an uncorrected error during raster processing. Note that in vector processing, scan field calibration is explicitly applied to segment endpoints; the nonlinearity error between endpoints over short distances (~1 mm) is small.

1. Raster Processing Summary

Figure 49:
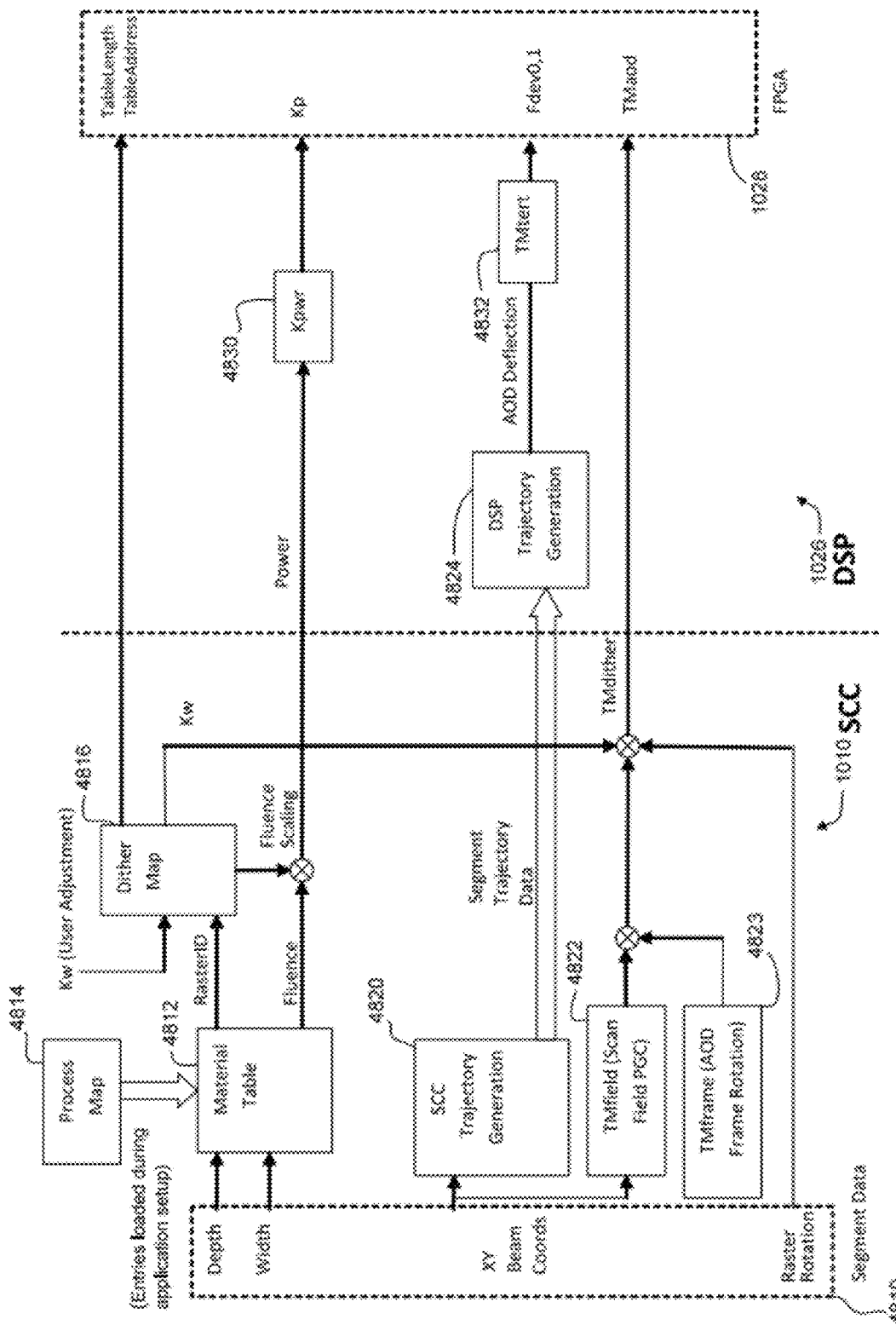
FIG. 49 is a block diagram illustrating AOD command generation for raster processing according to one embodiment.

Processing in raster mode can be summarized as follows. The following steps may be followed for each process segment in an application. FIG. 49 (discussed below) outlines this processing flow for translating raster process segment data into commands to the FPGA 1028. An artisan will recognize from the disclosure herein that certain of the following steps may be performed in a different order.

Step 1: The SCC 1010 calculates raster patterns and builds a raster table with a number of individual patterns during "translation" of the application. In some cases, a single raster "site" may be composed of several smaller raster patterns (e.g. round pads+"tabs" at various angles). These can be combined into one larger pattern, or processed separately. Note that some raster patterns may be used several times throughout an application, at different rotation angles.

Step 2: The SCC 1010 identifies rotation angles for all raster patterns, e.g., in CAD (computer aided design, for the particular application) coordinates.

Step 3: The SCC 1010 downloads raster table data to the FPGA 1028 before the application starts.

Step 4: The SCC 1010 creates a TMdither transformation for each raster location. This PGC corresponds to the TMaod transform sent to the FPGA 1028. The TMdither transformation includes, the raster rotation in CAD coordinates, the workpiece alignment rotation, the local scan field distortion PGC, and additional scaling adjustments optionally specified by the user.

Step 5: The SCC 1010 forms a raster process segment, with zero velocity for the duration of the raster. If the user specifies repetition of the raster (e.g., for better process control), multiple segments may be chained together.

Step 6: The SCC 1010 may include a leading and trailing zero-velocity segment with a settle time duration to allow the tertiary filter to settle, preventing excess AOD excursion for large raster patterns.

Step 7: The SCC 1010 calculates the desired fluence based on the specified raster depth and the Process Map.

Step 8: The SCC 1010 calculates nominal Power based on the raster spot pitch and the optional Kw scaling adjustment factor.

Step 9: The SCC 1010 sends raster parameters to the DSP 1026. Note that the DSP 1026 may interpret "dosage" as "power" for a raster segment, that geometry scaling is incorporated in the PGC terms rather than in a Kw term, and that banking is not used. "raster mode" identification may be useful to flag this as a different data structure. The raster parameters sent from the SCC 1010 to the DSP may include segment endpoint XY coordinates (identical for zero velocity), segment arc center XY coordinates and radius (unused), number of trajectory samples (raster time), raster tableAddress, raster tableLength, power (in place of dosage), and TMdither (field distortion & raster angle).

Step 10: The DSP 1026 sends the above raster parameters to the FPGA 1028 for processing. Since the raster is seen as a dither, no special mode needs to be set.

2. Tiled Raster Processing

Figure 39:
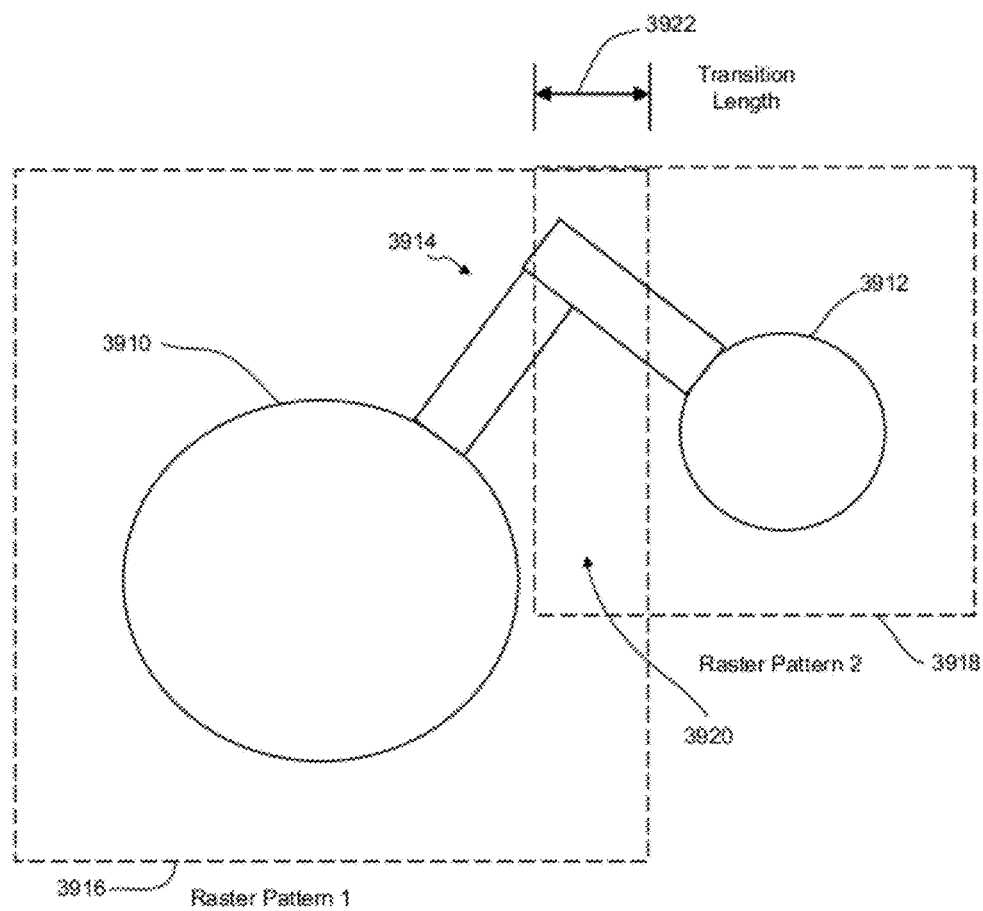
FIG. 39 schematically illustrates an example of tiled raster processing according to one embodiment.

A variation of raster processing may be useful in certain situations. FIG. 39 schematically illustrates an example of tiled raster processing according to one embodiment. In FIG. 39, two pads 3910, 3912 are close together and connected by a short trace 3914. The entire region is too large for a single raster pattern, and the pads 3910, 3912 may be spaced too close together for a typical pad-trace-pad process sequence. The region could be skived, although the laser duty cycle would be low due to the shape of the processed area.

An alternative approach, according to one embodiment, is to process this region as two raster patterns 3916, 3918, which are tiled and overlapped to provide a transition region 3920 between the two raster areas 3916, 3918. The raster patterns 3916, 3918 can be defined on the SCC 1010 as follows: decompose an arbitrary "blob" (i.e., an area with arbitrary shape and/or dimensions) into several overlapped raster areas 3916, 3918, with the overlap equal to the desired transition length 3922 (e.g., about 40-50 µm), and a border around each blob exceeding the transition length 3922; fill each area with a spot grid with unity amplitude; apply an FIR filter along each dimension to ramp down raster amplitude in the transition regions 3920 (e.g., like the skiving filter); within each raster area, zero out the data outside of the blob region, which results in a well-defined blob region, with a sloped transition region between tiles; and download and execute each raster pattern at the appropriate locations.

This may work well for smaller blobs that can be contained within a few raster fields, and may be faster than skiving for low-density patterns as shown in FIG. 39, since only the required points may be rastered (skipping all the empty space), and since only a few galvo moves may be made between AOD fields.

Repetitive patterns can be repeated (with the appropriate rotation), as opposed to recalculating new skive data each time. Of course, identifying "identical patterns" may be difficult.

C. Skive Processing

Figure 40:
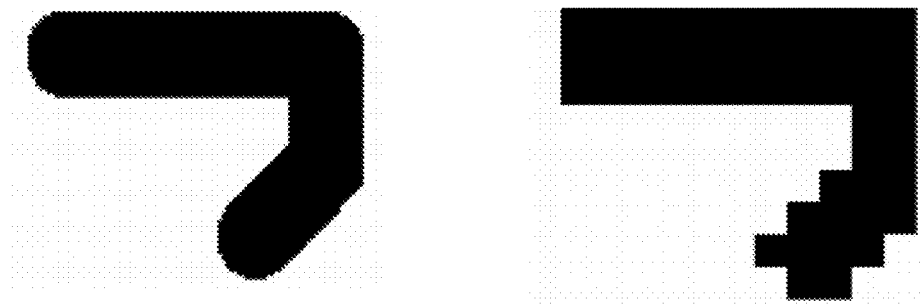
FIG. 40 schematically illustrates pixilation error due to wide-line skiving according to certain embodiments.

Skiving is the process of removing material over large areas (rather than thin trenches). The approach outlined below allows dither-widened lines to remove material much more efficiently than with the nominal spot, while avoiding "pixelation" effects that could result from using such wide lines. For example, FIG. 40 schematically illustrates pixilation error due to wide-line skiving according to certain embodiments. In FIG. 40, an example blob (left) to be processed includes rounded edges that are processed with a beam fine enough to provide adequate resolution. Using a wide beam to process the feature (right) results in excessive pixelation and an unacceptable loss of resolution.

In certain embodiments, it is useful to shape the side and end slopes of the skive beam. These "transition slopes" allow the adjacent skive passes to overlap properly and produce uniform fluence on the workpiece (e.g., for uniform depth control) and to provide tolerance to beam position errors. In addition, slopes on the ends of the skived beams are desired in cases where the skive area is to be intersected by a trench (again, providing uniformity and tolerance to position errors).

In one embodiment, such shaping of a wide skive beam is performed with dosage and shape control. However, the wide-line pixelation problem makes this approach difficult if the line width is held constant during processing.

In another embodiment, the wide dither pattern is varied by processing a "grid of pixels", and applying filters to the grid to produce the desired side and end slopes.

Figure 41:
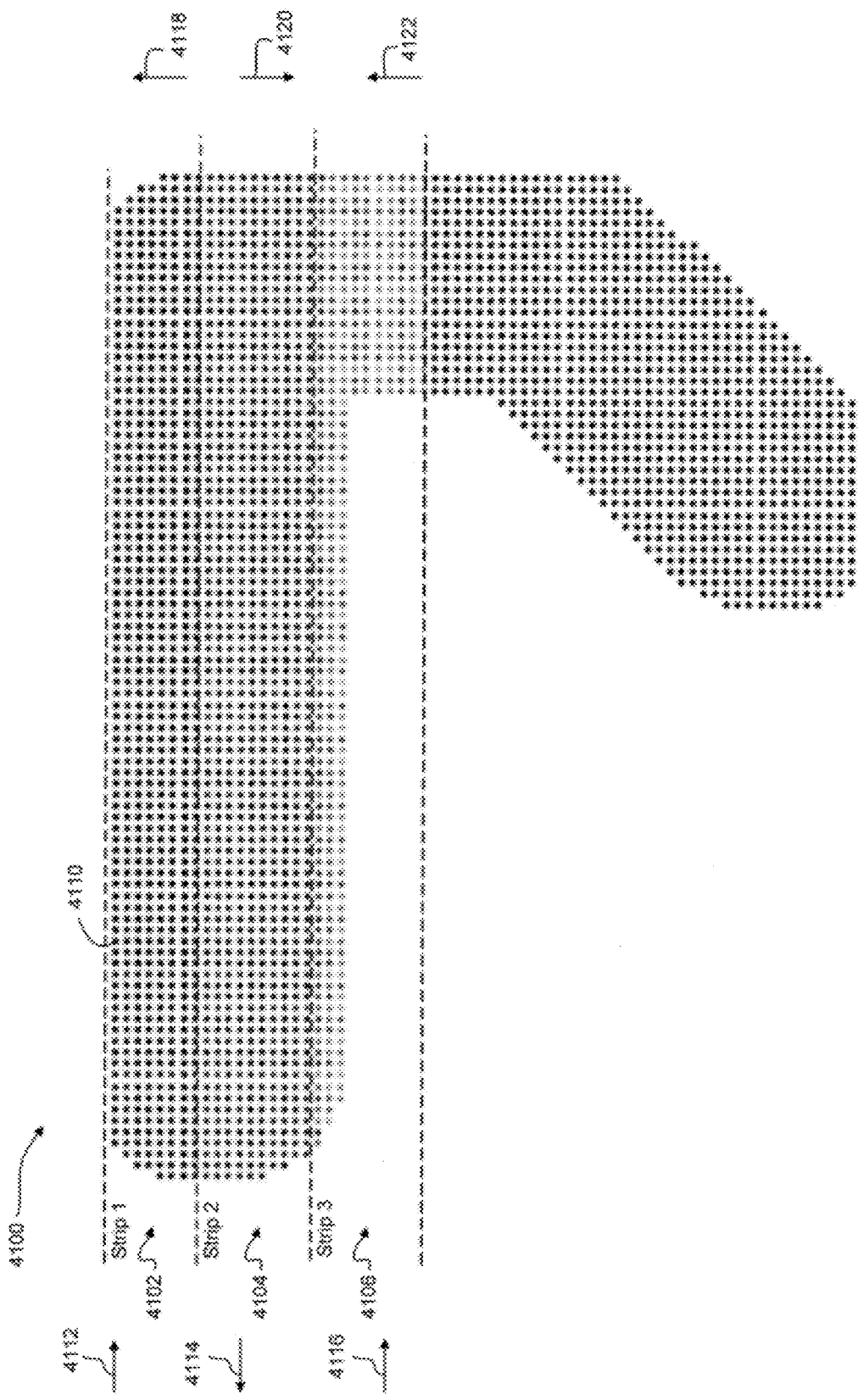
FIG. 41 schematically illustrates a skive area divided into grid strips according to one embodiment.

FIG. 41 schematically illustrates a skive area 4100 divided into grid strips 4102, 4104, 4106 according to one embodiment. While only three strips 4102, 4104, 4106 are shown, additional strips may be used to complete the entire skive area 4100. A generic or arbitrary "blob" area is converted into a grid of pixels 4110, with a minimum spacing between pixels 4110 based on the fundamental spot size (e.g., requiring >60% overlap). A skive object may have one elongated axis, which may be aligned with the skive beam trajectory (e.g., left-to-right for the first strip 4102 as indicated by arrow 4112 in the example of FIG. 41).

The grid spacing along this main beam trajectory (the "on-axis") may be smaller than the required spacing in the orthogonal axis ("cross-axis"), depending on velocity, dither point update rates, and number of dither points. The spot grid is set up such that the skived area is accurately outlined, especially if any other feature will intersect the skived area. Thus the final spot grid spacing depends on the outline dimensions. Also, according to certain embodiments, since the dither row execution time is fixed and quantized (=Taod*Nd), the skive trajectory velocity is adjusted such that the integer number of skive dither rows exactly fill the skive area.

The grid is then divided into separate passes (shown in FIG. 41 as 4102 (Strip 1), 4104 (Strip 2), and 4106 (Strip 3), which for illustrative purposes are shown as being divided by dashed lines). During each pass, the beam is dithered to create a desired width. Normally this may produce unacceptable pixelation error, as shown in FIG. 40. However, if the dither pattern can be tailored as a function of on-axis position, such pixelation can be avoided.

Figure 42:
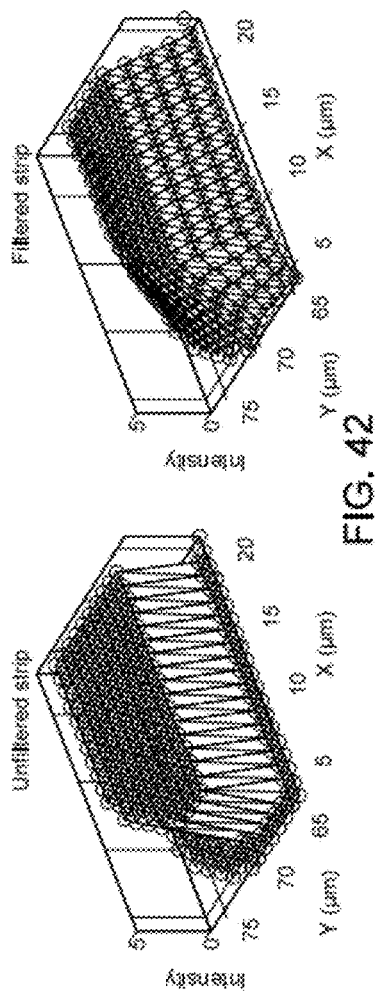
FIG. 42 graphically illustrates an unfiltered grid of skive dither points and a corresponding filtered grid of skived dither points according to one embodiment.
Figure 43:
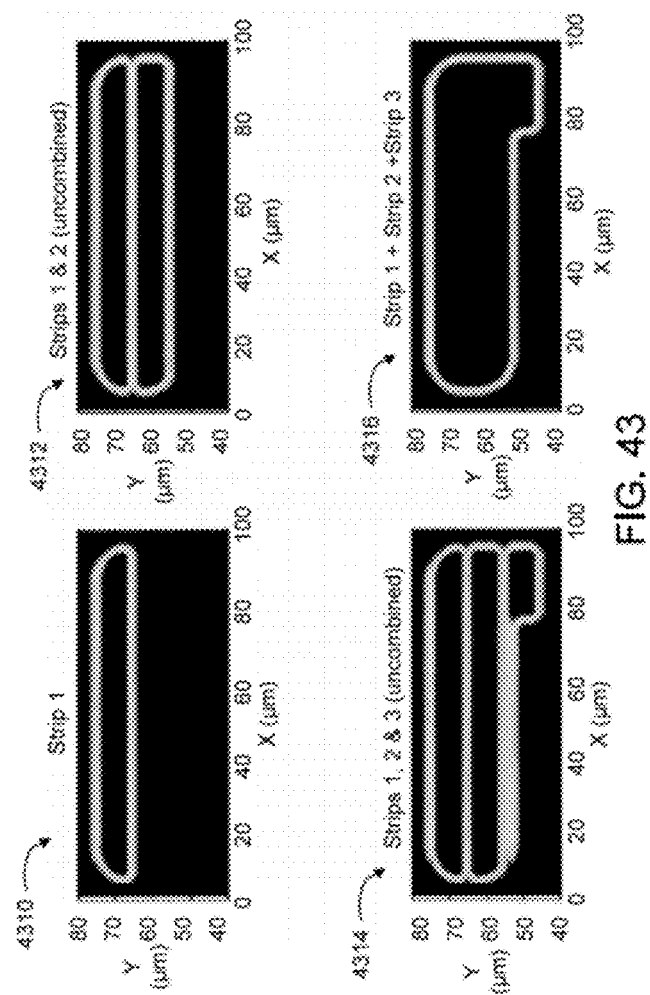
FIG. 43 graphically illustrates fluence distributions of the first three skive beams corresponding to the strips shown in FIG. 41 according to one embodiment.

To avoid pixelation, the grid pattern is sequentially loaded into the FPGA 1028 AOD controller, with each "dither row" specified by a binary pattern. This pattern is then filtered to produce side and end slopes. The results of a filtered grid are shown in FIG. 42. FIG. 42 graphically illustrates an unfiltered grid of skive dither points (on left) and a corresponding filtered grid of skived dither points (on right) according to one embodiment. FIG. 43 graphically illustrate fluence distributions of the first three skive beams corresponding to the strips 4102, 4104, 4106 shown in FIG. 41 according to one embodiment. A first graph 4310 shows a fluence distribution corresponding to the first strip 4102. A second graph 4312 shows a fluence distribution corresponding to the addition of the second strip 4104. A third graph shows a fluence distribution corresponding to the addition of the third strip 4106. A fourth graph 4316 shows a fluence distribution of the combined fluence corresponding to the strips 4102, 4104, 4106.

In certain embodiments, a dither direction (a cross-axis direction with respect to the skive beam trajectory) switches between passes from one strip to the next based on the direction of the skive beam trajectory. For example, referring again to FIG. 41, the skive beam trajectory 4112 for the first strip 4102 is from left to right, a skive beam trajectory 4114 for the second strip 4104 is from right to left, and a skive beam trajectory 4116 for the third strip 4106 is again from left to right. As the main beam trajectory reverses direction between each skive pass, FIG. 41 illustrates that the dither direction (as indicated by arrows 4118, 4120, 4122) along each dither row also changes direction. For the first pass, as the skive beam trajectory 4112 moves from left to right, each dither row in the first strip 4102 is processed in a first dither direction 4118 (e.g., from bottom to top). For the second pass, as the skive beam trajectory 4114 moves from right to left, each dither row in the second strip 4104 is processed in a second dither direction 4120 (from top to bottom). For the third pass, as the skive beam trajectory 4116 again moves from left to right, each dither row in the third strip 4106 is processed in the first dither direction 4122 (from bottom to top). Switching the dither direction based on the direction of the skive pass, according to certain embodiments, affects control and quality of the skiving process (e.g., it affects the depth of the skive). In certain embodiments, a user is allowed to select whether to reverse or maintain the dither direction during the skive (e.g., based on the direction of the skive pass).

The summary below outlines the skive procedure according to one embodiment.

The selection of skive row width is used to optimized efficiency. Two example scenarios are discussed below.

Figure 44:
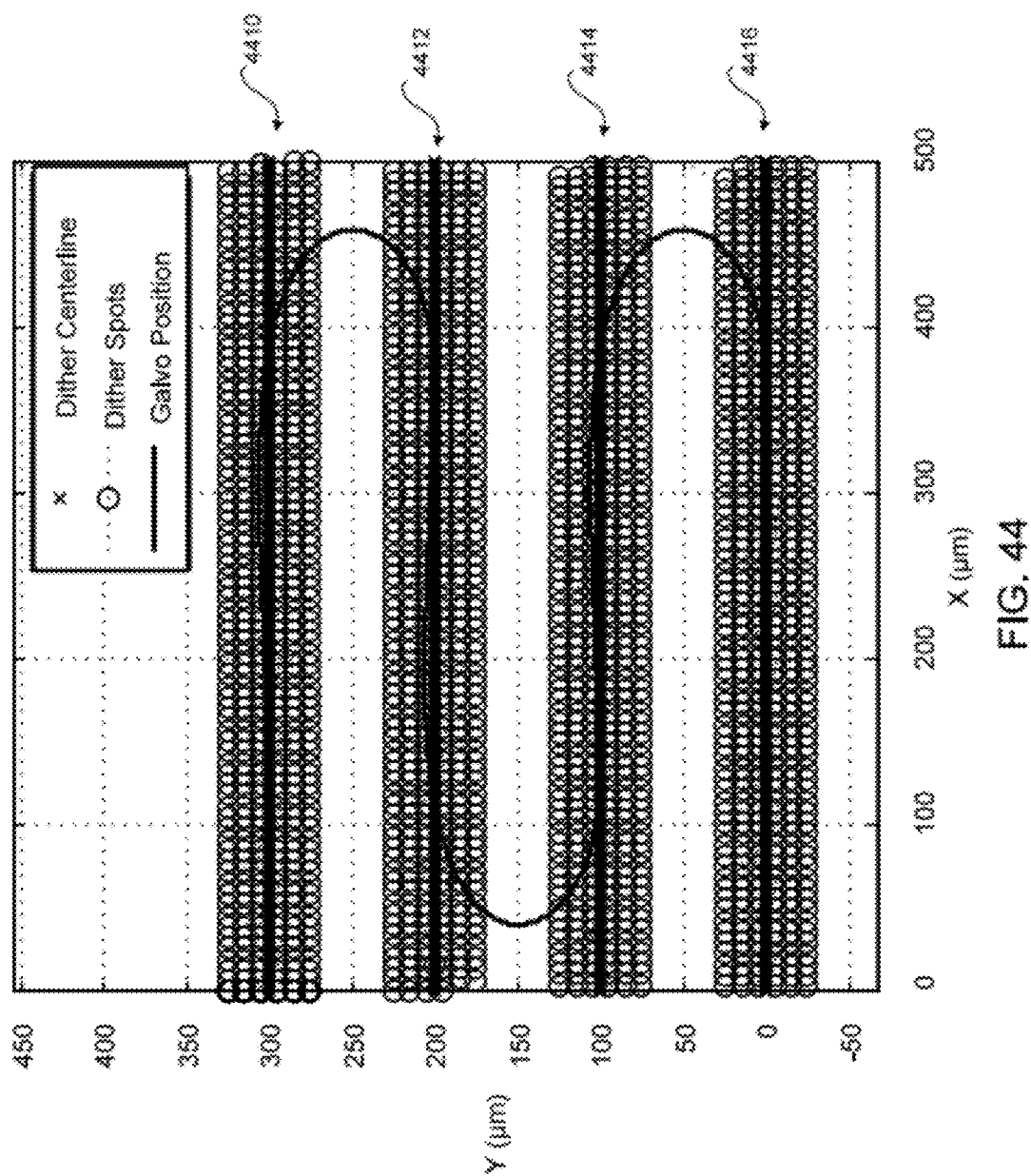
FIG. 44 graphically illustrates a skiving example according to one embodiment.
Figure 45:
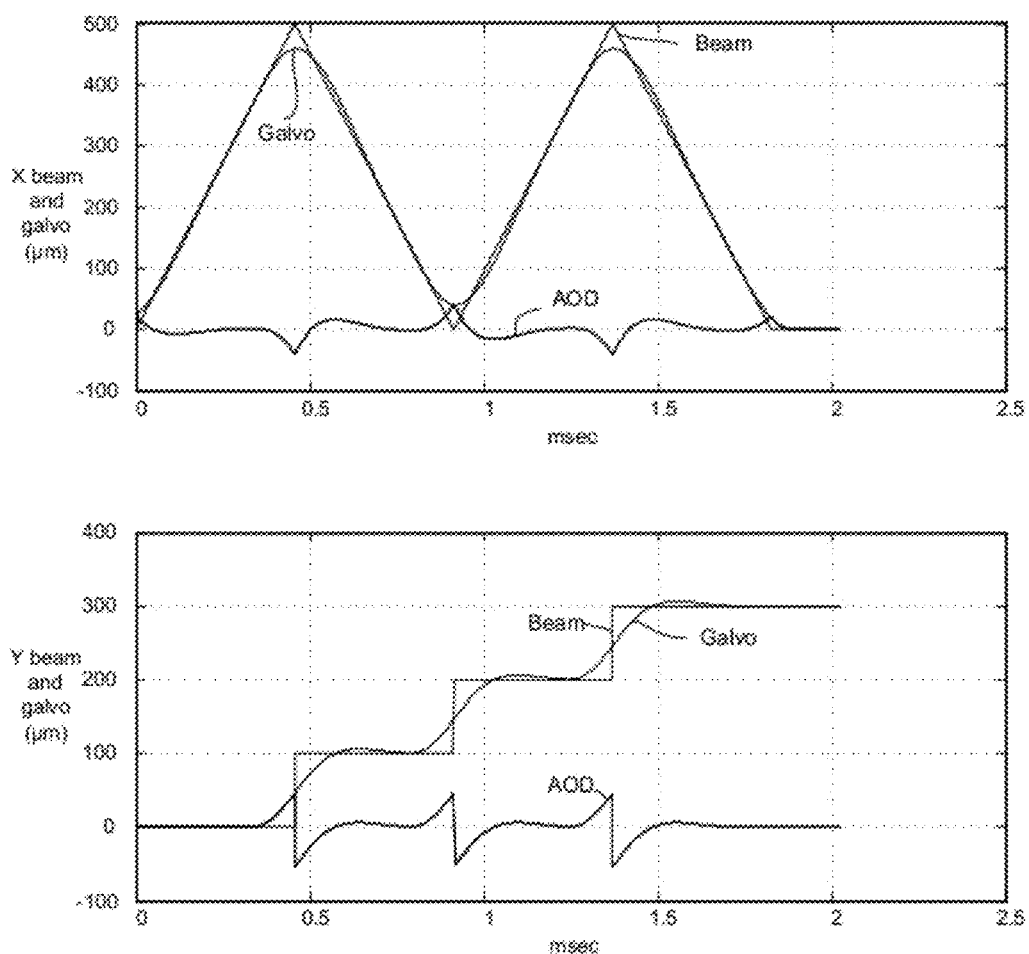
FIG. 45 graphically illustrates beam commands during skiving according to one embodiment.

The first scenario assumes no settling after moves between skive rows, as illustrated in FIG. 44 and FIG. 45. FIG. 44 graphically illustrates a skiving example according to one embodiment. In FIG. 44, a plurality of skive rows 4410, 4412, 4414, 4416 are separated from one another for illustrative purposes. However, as discussed above with respect to FIGS. 41 and 43, artisans will understand from the disclosure herein that the skive rows 4410, 4412, 4414, 4416 may also be adjacent to one another (or partially overlap one another). FIG. 45 graphically illustrates beam commands during skiving according to one embodiment. As each skive row 4410, 4412, 4414, 4416 is processed, the tertiary AOD position is centered (after the tertiary filter has settled), and the AOD subsystem 1042 dithers about the center by ±half the row width. As the beam positioner completes each row and moves to the next, it creates (due to tertiary profiling) an additional deflection in the AOD field equal to half of a row width (the AOD deflection is split between the current row and the next). Thus the maximum AOD deflection after a jump to the next row consumes a total of one row width. In this "unsettled" approach, although no settling is required after the jump to the next row, the length of each row is selected so as to be long enough to allow the tertiary filter to settle after the previous row jump. Depending on the selected skive width, shorter row lengths may still use an additional "settle segment" to provide this time. Note that even though the skive width is set well below the max AOD range, the power (and thus velocity) may be set to accommodate the worst-case AOD efficiency over its entire deflection range, thus reducing the efficiency of this approach.

A second scenario allows the full AOD width to be used, but with a settle segment always inserted to allow the tertiary transient to decay before skive row processing begins. This allows wider skive widths to be used. While this may increase skiving efficiency by removing more area per row, the efficiency gained by increasing skive width is offset by the lower AOD efficiency at wider deflection ranges (assuming that the system allows power to increase as a function of AOD deflection width).

Figure 46:
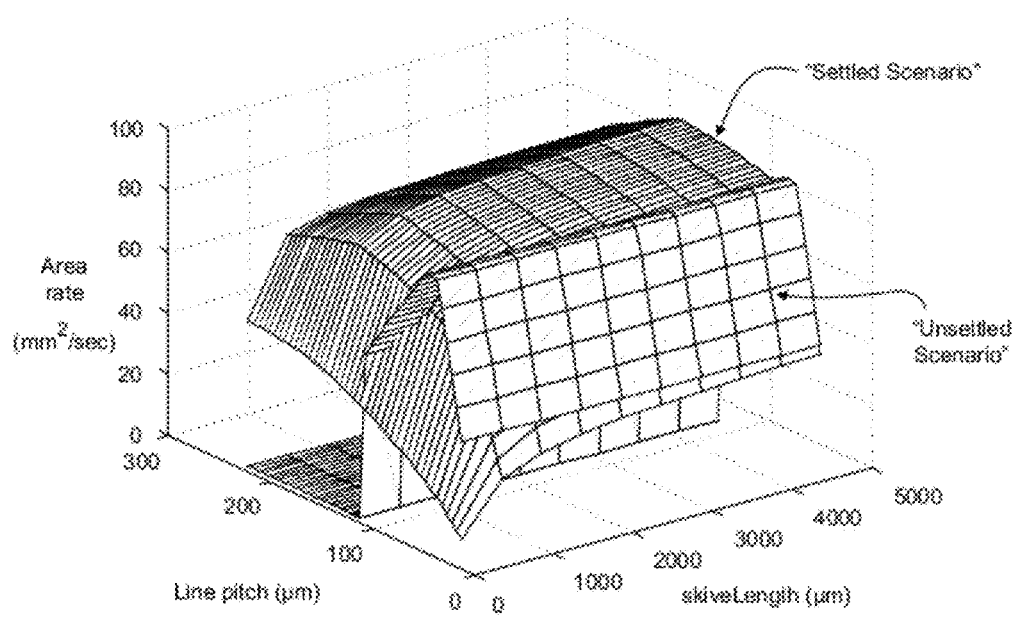
FIG. 46 is a plot illustrating material removal rate vs. skive row length and width according to one embodiment.

A model of skiving efficiency resulting from these two scenarios is illustrated in FIG. 46, which is a plot illustrating material removal rate (area per second) vs. skive row length (skiveLength) and width (Line pitch) according to one embodiment. The plot in FIG. 46 assumes a 10 μm skive depth and 25 μm spot size. This indicates that, for the AOD used in this example, the "unsettled" scenario is nearly as efficient as the "settled" scenario. This may change with different AOD designs that have more efficiency or wider deflection ranges, or for different skive depths, or nominal spot sizes. Note that the "unsettled" case operates over a more limited width range due to the additional AOD deflection during jumps between rows. In this example, the optimum skive row width is approximately 50 μm.

Figure 47:
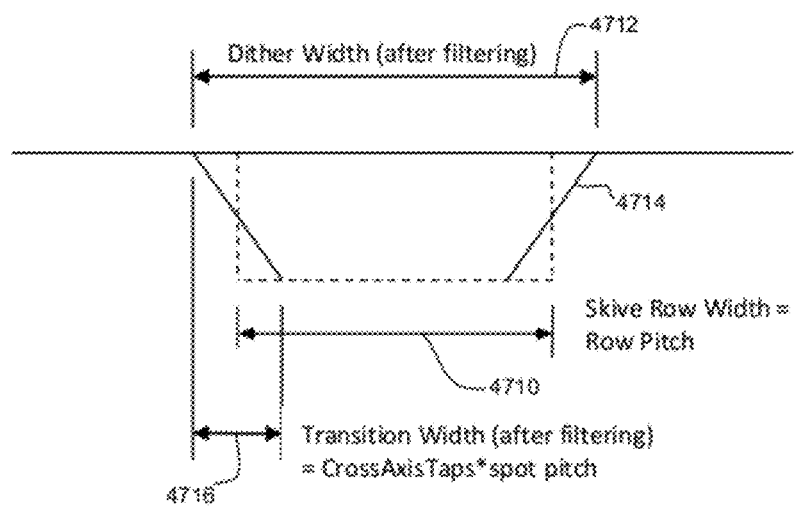
FIG. 47 schematically illustrates a side view of skive row geometry according to one embodiment.

FIG. 47 schematically illustrates a side view of skive row geometry according to one embodiment. FIG. 47 illustrates a skive row width 4710 before filtering and a dither width 4712 after filtering. Filtering produces sloped sidewalls 4714 (e.g., for intersecting with adjacent skive rows or other features) in a transition region having a transition width 4716. The degree of slope and the transition width 4716 is based on the filtering (e.g., CrossAxisTaps*spot pitch).

1. Skive Processing Summary

Figure 50:
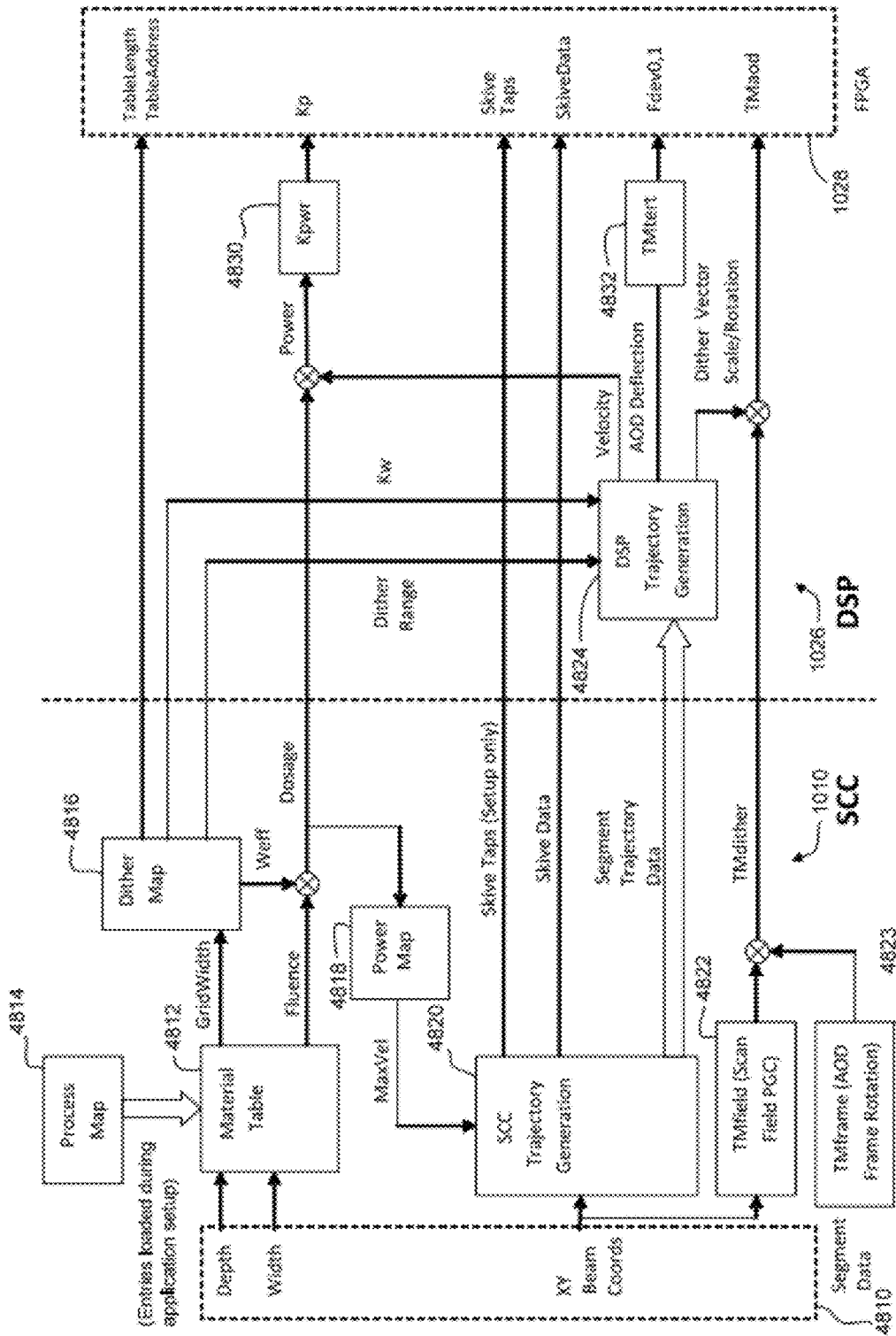
FIG. 50 is a block diagram illustrating AOD command generation for skive processing according to one embodiment.

Processing in skive mode can be summarized as follows. An artisan will recognize from the disclosure herein that certain of the following steps may be performed in a different order. FIG. 50 (discussed below) outlines this processing flow for translating raster process segment data into commands to the FPGA 1028.

i. Pre-processing Steps

Step 1: The SCC 1010 recognizes skive areas, which can be placed in separate layers in the application file.

Step 2: The SCC 1010 converts the skive area to a grid of binary spots, with cross-axis spacing based on spot size, and on-axis spacing based on velocity and dither parameters.

Step 3: The SCC 1010 converts the skive grid to a set of rows.

a. Row width may be optimized (width vs. efficiency tradeoff) as shown in FIG. 46. Note that skive width increases due to the filtering that creates the sloped edges, so the width optimization calculation may take this into account. Edge transitions may be about 40 μm wide (for 5% depth error given 2 μm position error); the extension of the filtered edge from the unfiltered nominal edge equals ½ the transition length.

b. Skive dither row spacing (in the on-axis direction) meets the requirements for maximum pitch (spot overlap >60%), process velocity within power constraints, and an integral number of dither rows within each skive segment. In addition, the dither row spacing may be compatible with the desired on-axis transition length and the specified on-axis boxcar filter (see below). Since boxcar filtering operates on an integer number of dither rows, the dither row spacing may provide an integral number of rows within the transition region. If necessary, the transition length may be enlarged slightly to allow this, as long as any corresponding intersections that have matching transition lengths.

Step 4: The SCC 1010 specifies the lengths of boxcar averages (CrossAxisTaps and OnAxisTaps) to create the desired slope on edges and ends.

a. CrossAxisTaps and OnAxisTaps are odd (center point+ pairs of surround points).

b. CrossAxisTaps and OnAxisTaps may differ, depending on cross-axis spacing (dither controlled) and on-axis spacing (controlled by Nd*Taod*vel). The transition region may be the same as used for intersections, e.g., around 40 μm (5% depth error for 2 μm position error).

c. Since OnAxisTaps is a rounded integer value, the timing of dither rows (through velocity and/or Taod) may need to be adjusted to meet the requirements of end point positions and transition slope width.

Step 5: For each skive row, the SCC 1010 creates a set of SkiveData words.

a. Each SkiveData word represents a set of amplitude points per dither row, with unprocessed points set to zero.

b. The length of the SkiveData words equals the dither table length used for skiving (up to 32 points).

c. At each end of a SkiveData word, "CrossAxisTaps" points may be set to zero to account for the width of boxcar filter, as illustrated in FIG. 47.

d. Laser processing in the cross-axis is shifted by "CrossAxisTaps" number of dither points (toward the end of the dither table). The skive dither table accounts for this shift. The skive dither table also includes enough of the zero-padding entries noted above.

Step 6: The SCC 1010 calculates process segment locations. The actual laser processing of each skive row is shifted (delayed) along the on-axis by "OnAxisTaps" number of dither rows. The process segment geometry accounts for this shift.

Step 7: The SCC 1010 uses the Process Map and the trench geometry (width, depth) to determine the required process parameters (GridWidth and Fluence).

Step 8: The SCC 1010 uses the Dither Map to determine dither table parameters (Nd, Kw) corresponding to the required GridWidth.

Step 9: The SCC 1010 uses the Dither Map to determine the dither table parameters tableAddress and tableLength corresponding to Nd.

Step 10: The SCC 1010 uses the Dither Map to calculate an EffectiveWidth. Since Kw may be interpolated, EffectiveWidth may also be interpolated over transition segments.

Step 11: The SCC 1010 calculates Dosage=Fluence*EffectiveWidth. This may be interpolated over transition segments.

Step 12: The SCC 1010 uses the Power Map to determine the maximum velocity permitted for the segment, based on the required dosage. Segments may have a lower velocity if required to meet the minimum segment time requirement. Velocity is held constant over any segment.

Step 13: The SCC 1010 scales the dosage by $$Kskive=1/(CrossAxisTaps*OnAxisTaps).$$

Step 14: The SCC 1010 notifies the DSP 1026 to enter skive mode. The DSP 1026 sets the FPGA 1028 into skive mode.

ii. Run-Time Processing

The following steps are followed for each segment during skive processing.

Step 1: The SCC 1010 creates process segments for each skive row, and transmits the following data to the DSP 1026: segment endpoint XY coordinates; segment arc center XY coordinates and radius; number of trajectory samples (~velocity); skive tableAddress; skive tableLength; Dosage; Kw; SkiveData; OnAxisTaps; CrossAxisTaps; and Skive Mode notification.

Step 2: The DSP 1026 processes the streamed data from the SCC 1010 as in vector mode, sending the data to the FPGA 1028.

Step 3: The FPGA 1028 creates dither row vectors, with non-zero data points set to the specified dosage.

Step 4: The FPGA 1028 executes cross-axis and on-axis boxcar average filters on the dither rows, as follows:

a. Run a boxcar filter on the cross-axis data (each dither row) as it arrives. Each boxcar filter for each point is the summation of that point and the ±(CrossAxisTaps−1)/2 surrounding points (with zero pads at the vector ends). No scaling is required (dosage was prescaled by Kskive).

b. Queue these filtered dither rows.

c. Process the dither rows from this queue. Apply on-axis boxcar filtering by summing each row with the surrounding (OnAxisTaps−1)/2 rows (zero-padding beginning and ending rows as required). Again, no scaling is required due to the Kskive prescaling.

Step 5: Note that angle and dosage parameters are still applied (as in normal dithering), but not shape or bank (boxcar filtering applies shape; skiving is constrained to straight lines, so no bank).

Step 6: Synchronization is adjusted to account for delays from the boxcar filters.

FIG. 48 is a block diagram illustrating AOD command generation for vector processing according to one embodiment. As discussed above, the SCC 1010 breaks up an application into separate process segments, each with corresponding segment data 4810. Using a material table 4812 (e.g., see FIG. 9), the SCC 1010 processes trench geometry (e.g., depth and width) from the segment data 4810 and data from a process map 4814 to determine process parameters such as GridWidth and Fluence. The SCC 1010 uses a dither map 4816 to process the GridWidth to determine dither table parameters Nd and Kw. In certain embodiments, Nd is held constant for each segment but Kw may be interpolated over transition segments. The SCC 1010 then uses the dither map 4816 to determine the dither table parameters tableAddress and tableLength corresponding to Nd. The SCC 1010 also uses the DitherMap to calculate an EffectiveWidth (Weff). Because Kw may be interpolated, EffectiveWidth may also be interpolated over transition segments. As shown in FIG. 48, the SCC 1010 calculates Dosage=Fluence*EffectiveWidth. Dosage may also be interpolated over transition segments. The dither map 4816 also provides a DitherRange to the DSP 1026.

The SCC 1010 provides the Dosage to a power map 4818 and assigns a segment velocity MaxVel (held constant over the segment). The segment velocity MaxVel may be based on a laser power-limited velocity and/or one or more AOD velocity limits. A laser power-limited velocity is based on the power map 4818 and the calculated Dosage. The AOD velocity limit may be based on the required GridWidth, the AOD field size, and the tertiary filter transient magnitude. In addition, or in other embodiments, the AOD velocity limit may be based on the maximum spacing between dither rows (=Taod*(Nd−1)*Vel), which is <0.35*Deff according to certain embodiments. In certain embodiments, segments may have a lower velocity if required to meet a minimum segment time requirement.

An SCC trajectory generation module 4820 receives XY beam coordinates from the segment data 4810 and the assigned segment velocity MaxVel. If banking is used for an arc segment, the SCC trajectory generation module 4820 calculates a bank parameter Kb based on the segment arc radius. The SCC trajectory generation module 4820 also generates segment trajectory data (e.g., segment endpoint XY coordinates, segment arc center XY coordinates and radius, and number of trajectory samples).

The SCC 1010 uses the segment data 4810 to generate a TMfield transform 4822 that corrects for scan field distortions and nominal galvo alignment. The SCC 1010 also generates a TMframe transform 4823 to align the AOD coordinate frame to the galvo coordinate frame. As shown in FIG. 48, the SCC 1010 multiplies the TMfield transform 4822 and the TMframe transform 4823 to determine the TMdither transformation matrix.

Within the DSP 1026, a DSP trajectory generation module 4824 uses the segment trajectory data, DitherRange, and Kw received from the SCC 1010 to calculate centerline position data (Xc, Yc), at an update period of Tcmd. Although not shown in FIG. 48, in certain embodiments the DSP 1026 also processes the data with a tertiary filter (see, e.g., the tertiary filter 2205 shown in FIGS. 22 and 51). The DSP trajectory generation module 4824 outputs a velocity, AOD deflection coordinates, and dither vector scale/rotation. The AOD deflection coordinates are provided to the TMtert transform 4832, which outputs frequency deviation commands Fdev0 and Fdev1.

The DSP 1026 calculates new dither (Kw) and process (Kp, Kb) parameters once per dither row (every Nd*Taod seconds). If the segment is a transition segment, the DSP 1026 uses interpolation 4826 to calculate the new dither Kw parameter. For transition segments, the DSP 1026 also uses interpolation 4828 to determine Dosage. As shown in FIG. 48, the DSP 1026 uses the Dosage and the velocity calculated by the DSP trajectory generation module 4824 to determine a work surface power provided to Kpwr module 4830. The Kpwr module 4830 converts the work surface power to the normalized power command Kp.

As shown in FIG. 48, the DSP 1026 calculates the TMaod transform components based on TMdither and dither vector scale/rotation, as discussed above.

The DSP 1026 sends the low-level commands to the FPGA 1028 to control AOD operation.

FIG. 49 is a block diagram illustrating AOD command generation for raster processing according to one embodiment. As discussed above, the SCC 1010 breaks up an application into separate process segments, each with corresponding segment data 4810. The SCC 1010 calculates raster patterns and builds a raster table with a number of individual patterns during "translation" of the application. The segment data 4810 includes raster rotation angles for the raster patterns. Each raster segment has zero velocity.

Using a material table 4812, the SCC 1010 processes raster geometry (e.g., depth and width) from the segment data 4810 and data from the process map 4814 to determine process parameters such as RasterID (e.g., corresponding to Grid-Width) and Fluence. The SCC 1010 uses a dither map 4816 to process the RasterID to determine dither table parameters Nd and Kw, as well as fluence scaling. As shown in FIG. 49, a user may selectively adjust Kw. The SCC 1010 also uses the dither map 4816 to determine the raster table parameters tableAddress and tableLength corresponding to Nd. As shown in FIG. 49, the SCC 1010 calculates a desired fluence by multiplying the fluence from the material table 4812 by the fluence scaling provided by the dither map 4816.

The SCC trajectory generation module 4820 receives XY beam coordinates from the segment data 4810. The SCC trajectory generation module 4820 generates segment trajectory data, which it provides to the DSP trajectory generation module 4824.

As shown in FIG. 49, the SCC uses the TMfield transform 4822, the TMframe transform 4823, the raster rotation data from the segment data 4810, and Kw from the dither map 4816 to calculate the TMdither transformation matrix. The TMdither transformation corresponds to the TMaod transform sent to the FPGA 1028.

As also shown in FIG. 49, the DSP 1026 may interpret dosage as "power" for a raster segment. The Kpwr module 4830 converts the power to the normalized power command Kp.

The DSP trajectory generation module 4824 outputs AOD deflection coordinates. The AOD deflection coordinates are provided to the TMtert transform 4832, which outputs frequency deviation commands Fdev0 and Fdev1.

FIG. 50 is a block diagram illustrating AOD command generation for skive processing according to one embodiment. As discussed above, the SCC 1010 breaks up an application into separate process segments, each with corresponding segment data 4810. In this embodiment, the SCC 1010 recognizes skive areas, which can be placed in separate layers in an application file. The SCC 1010 converts each skive area to a grid of binary spots, with cross-axis spacing based on spot size, and on-axis spacing based on velocity and dither parameters. As discussed above, the SCC 1010 converts the skive grid to a set of rows.

Using the material table 4812, the SCC 1010 processes trench geometry (e.g., depth and width) from the segment data 4810 and data from a process map 4814 to determine process parameters such as GridWidth and Fluence. The SCC 1010 uses the dither map 4816 to process the GridWidth to determine dither table parameters Nd and Kw. In certain embodiments, Nd is held constant for each segment but Kw may be interpolated over transition segments. The SCC 1010 then uses the dither map 4816 to determine the dither table parameters tableAddress and tableLength corresponding to Nd. The SCC 1010 also uses the DitherMap to calculate the EffectiveWidth (Weff). Because Kw may be interpolated, EffectiveWidth may also be interpolated over transition segments. As shown in FIG. 50, the SCC 1010 calculates Dosage=Fluence*EffectiveWidth. Dosage may also be interpolated over transition segments. The dither map 4816 also provides a DitherRange to the DSP 1026.

The SCC 1010 provides the Dosage to a power map 4818 to determine a maximum velocity MaxVel for the segment (held constant over the segment). In certain embodiments, segments may have a lower velocity if required to meet a minimum segment time requirement.

The SCC trajectory generation module 4820 receives XY beam coordinates from the segment data 4810 and the maximum velocity MaxVel. The SCC trajectory generation module 4820 specifies the lengths of boxcar averages (CrossAxisTaps and OnAxisTaps) to create the desired slope on edges and ends. Thus, during setup, the SCC trajectory generation module 4820 provides Skive Taps to the FPGA 1028. For each skive row, the CC trajectory generation module 4820 also creates a set of SkiveData words. The SCC trajectory generation module 4820 generates segment trajectory data, which may include process segment locations. The actual laser processing of each skive row is shifted (delayed) along the on-axis by "OnAxisTaps" number of dither rows. The process segment geometry accounts for this shift.

As discussed above, the SCC 1010 scales the dosage by Kskive=1/(CrossAxisTaps*OnAxisTaps).

As shown in FIG. 50, the SCC 1010 multiplies the TMfield transform 4822 and the TMframe transform 4823 to determine the TMdither transformation matrix.

Within the DSP 1026, the DSP trajectory generation module 4824 uses the segment trajectory data, DitherRange, and Kw received from the SCC 1010 to output a velocity, AOD deflection coordinates, and dither vector scale/rotation. The AOD deflection coordinates are provided to the TMtert transform 4832, which outputs frequency deviation commands Fdev0 and Fdev1.

As shown in FIG. 50, the DSP 1026 uses the Dosage and the velocity calculated by the DSP trajectory generation module 4824 to determine a work surface power provided to Kpwr module 4830. The Kpwr module 4830 converts the work surface power to the normalized power command Kp. The DSP 1026 calculates the TMaod transform components based on TMdither and dither vector scale/rotation, as discussed above.

The DSP 1026 sends the low-level commands to the FPGA 1028 to control AOD operation. The FPGA 1028 creates dither row vectors, with non-zero data points set to the specified dosage. The FPGA 1028 also executes cross-axis and on-axis boxcar average filters on the dither rows.

FIG. 51 is a block diagram of illustrating galvo and AOD calibration data flow 5100 according to one embodiment. In the galvo and AOD calibration data flow 5100, the SCC 1010 provides an SCC trajectory specification 5110 (such as the example beam profile 2210 shown in FIG. 22) comprising XY segment coordinates (e.g., in work surface coordinates) to the scan field transform 2203. The scan field transform 2203 then provides corrected XY segment coordinates (e.g., in raw galvo coordinates) to a DSP trajectory generation unit 4824, which calculates detailed beam trajectories and dither parameters that are sent (e.g., in raw galvo coordinates) to the tertiary filter 2205. As discussed above, the tertiary filter 2205 provides a raw XY galvo control command (e.g., in raw galvo coordinates) to a galvo controller 5114. The tertiary filter 2205 also provides an XY AOD command (to which may be added optional XY Galvo error correction terms in raw galvo coordinates) to the TMtert transform 4832. Output from the TMtert transform 4832 is then provided (e.g., as ch0 and ch1 AOD commands) to the FPGA 1028, which produces the final AOD RF commands.

The SCC 1010 also combines a rotation transform TMframe 5118 with local scan field distortion correction TMfield 4822 to produce a TMdither transformation matrix. The TMdither transformation matrix is then combined with a dither rotation/scale transform 5122 (e.g., Rdither and KwCorr) to produce the AOD command transformation matrix TMaod transform, which is provided to the FPGA 1028. The SCC 1010 also uses SCC dither data 5124 (e.g., in work surface coordinates) to produce a scale factor MHz-PerμM, which may be included as preloaded data in the dither (or raster) table 1110. The FPGA 1028 combines data from the dither table 1110 with the TMoad transform to produce dither and raster data, which the FPGA 1028 combines with the AOD commands from the TMtert transform 4832 to produce the AOD RF commands.

It will be understood by those having skill in the art that many changes may be made to the details of the above-described embodiments without departing from the underlying principles of the invention. The scope of the present invention should, therefore, be determined only by the following claims.

The invention claimed is:

1. A method for dithering a laser beam to form and widen a trench in a workpiece based on a varying processing velocity along a beam trajectory, the method comprising:
   imparting, using a first positioning system, a first relative movement of a laser beam path along the beam trajectory with respect to a surface of the workpiece, the beam trajectory corresponding to the trench to cut into the workpiece;
   determining, using a processor, a second relative movement of the laser beam path along a plurality of dither rows, the second relative movement superimposed on the first relative movement at a predetermined angle with respect to the beam trajectory to widen the trench;
   selectively changing the processing velocity along the beam trajectory based at least in part on a geometry of the trench to cut into the workpiece, the determination of the second relative movement including compensation for changes in the processing velocity to maintain the predetermined angle for each of the plurality of dither rows;
   imparting, using a second positioning system, the second relative movement of the laser beam path; and
   emitting a plurality of laser beam pulses to the workpiece at a plurality of spot locations along the plurality of dither rows to both form the trench in the workpiece running in a direction of the beam trajectory and to widen the trench in a direction defined by the predetermined angle;
   wherein determining the second relative movement of the laser beam path along the plurality of dither rows comprises:
      determining a vector defining a dithered spot location along an axis of the first positioning system;
      rotating the vector into an orientation to position the dithered spot location along a dither row that is substantially perpendicular to the beam trajectory; and
      further rotating the rotated vector to correct scan field distortion.

2. The method of claim 1, wherein the predetermined angle is perpendicular to the beam trajectory.

3. The method of claim 1, wherein emitting the plurality of laser beam pulses comprises emitting at a constant rate, the method further comprising:
   selectively adjusting the processing velocity so as to process an integral number of dither rows to complete the trench.

4. The method of claim 1, wherein the rotated vector comprises:
   an on-axis vector component that is parallel to the beam trajectory and defines the dithered spot location along the dither row based on a current processing velocity along the beam trajectory;
   a cross-axis vector component that is perpendicular to the beam trajectory and corresponds to a width of the dither row at the dithered spot location; and
   a dither angle comprising a summation of:
      a velocity compensation angle defined by a combination of the on-axis vector component and the cross-axis vector component, wherein the velocity compensation angle increases with increased processing velocity;
      a trajectory angle between the beam trajectory and an axis of a coordinate frame of the first positioning system; and
      the predetermined angle selected so as to maintain the dither row substantially perpendicular to the beam trajectory.

5. The method of claim 1, wherein a coordinate frame of the second positioning system is rotated with respect to a coordinate frame of the first positioning system, the method further comprising:
   aligning the rotated vector with the coordinate frame of the second positioning system.

6. The method of claim 1, wherein the second positioning system comprises an acousto-optic deflector driven by a radio frequency (RF) signal, the method further comprising:
   chirping the RF signal to defocus a laser spot at a surface of the workpiece.

7. A method for dithering a laser beam to form and widen a trench in a workpiece based on a varying processing velocity along a beam trajectory, the method comprising:
   imparting, using a first positioning system, a first relative movement of a laser beam path along the beam trajectory with respect to a surface of the workpiece, the beam trajectory corresponding to the trench to cut into the workpiece;
   determining, using a processor, a second relative movement of the laser beam path along a plurality of dither rows, the second relative movement superimposed on the first relative movement at a predetermined angle with respect to the beam trajectory to widen the trench;
   selectively changing the processing velocity along the beam trajectory based at least in part on a geometry of the trench to cut into the workpiece, the determination of the second relative movement including compensation for changes in the processing velocity to maintain the predetermined angle for each of the plurality of dither rows;
   imparting, using a second positioning system, the second relative movement of the laser beam path; and
   emitting a plurality of laser beam pulses to the workpiece at a plurality of spot locations along the plurality of dither rows to both form the trench in the workpiece running in a direction of the beam trajectory and to widen the trench in a direction defined by the predetermined angle;
   wherein the second positioning system comprises an acousto-optic deflector driven by a radio frequency (RF) signal, the method further comprising chirping the RF signal to defocus a laser spot at a surface of the workpiece.

8. The method of claim 7, wherein the predetermined angle is perpendicular to the beam trajectory.

9. The method of claim 7, wherein emitting the plurality of laser beam pulses comprises emitting at a constant rate, the method further comprising:
   selectively adjusting the processing velocity so as to process an integral number of dither rows to complete the trench.

10. The method of claim 7, wherein determining the second relative movement of the laser beam path along the plurality of dither rows comprises:
- determining a vector defining a dithered spot location along an axis of the first positioning system; and
- rotating the vector into an orientation to position the dithered spot location along a dither row that is substantially perpendicular to the beam trajectory.

11. The method of claim 10, wherein the rotated vector comprises:
- an on-axis vector component that is parallel to the beam trajectory and defines the dithered spot location along the dither row based on a current processing velocity along the beam trajectory;
- a cross-axis vector component that is perpendicular to the beam trajectory and corresponds to a width of the dither row at the dithered spot location; and
- a dither angle comprising a summation of:
  - a velocity compensation angle defined by a combination of the on-axis vector component and the cross-axis vector component, wherein the velocity compensation angle increases with increased processing velocity;
  - a trajectory angle between the beam trajectory and an axis of a coordinate frame of the first positioning system; and
  - the predetermined angle selected so as to maintain the dither row substantially perpendicular to the beam trajectory.

12. The method of claim 10, wherein a coordinate frame of the second positioning system is rotated with respect to a coordinate frame of the first positioning system, the method further comprising:
- aligning the rotated vector with the coordinate frame of the second positioning system.

13. The method of claim 10, further comprising:
- further rotating the rotated vector to correct scan field distortion.

* * * * *